United States Patent
Venkatraman et al.

(10) Patent No.: US 9,692,725 B2
(45) Date of Patent: Jun. 27, 2017

(54) SYSTEMS AND METHODS FOR USING AN HTTP-AWARE CLIENT AGENT

(71) Applicant: Citrix Systems, Inc., Fort Lauderdale, FL (US)

(72) Inventors: Charu Venkatraman, Bangalore (IN); Junxiao He, Saratoga, CA (US); Ajay Soni, San Jose, CA (US); Nicholas Stavrakos, Mountain View, CA (US); Jeff Monks, Sunnyvale, CA (US); Fred Koopmans, Menlo Park, CA (US); Chris Koopmans, Sunnyvale, CA (US); Kapil Dakhane, Sunnyvale, CA (US)

(73) Assignee: CITRIX SYSTEMS, INC., Fort Lauderdale, FL (US)

( * ) Notice: Subject to any disclaimer, the term of this patent is extended or adjusted under 35 U.S.C. 154(b) by 497 days.

(21) Appl. No.: 14/448,265

(22) Filed: Jul. 31, 2014

(65) Prior Publication Data

US 2014/0344345 A1 Nov. 20, 2014

Related U.S. Application Data

(63) Continuation-in-part of application No. 11/439,003, filed on May 22, 2006, now Pat. No. 8,856,279, and (Continued)

(51) Int. Cl.
 *H04L 29/12* (2006.01)
 *H03M 7/30* (2006.01)
 (Continued)

(52) U.S. Cl.
 CPC .......... *H04L 61/6009* (2013.01); *H03M 7/30* (2013.01); *H04L 67/02* (2013.01);
 (Continued)

(58) Field of Classification Search
 CPC .................................. H04L 67/2842–67/2857
 See application file for complete search history.

(56) References Cited

U.S. PATENT DOCUMENTS

| 5,754,774 A | * | 5/1998 | Bittinger ................. H04L 29/06 |
|---|---|---|---|
| | | | 709/203 |
| 5,867,494 A | | 2/1999 | Krishnaswamy et al. |

(Continued)

FOREIGN PATENT DOCUMENTS

| CN | 1478348 A | 2/2004 |
|---|---|---|
| EP | 1 422 907 A2 | 5/2004 |

(Continued)

OTHER PUBLICATIONS

Advisory Action for U.S. Appl. No. 11/465,894 dated Mar. 10, 2010.

(Continued)

*Primary Examiner* — Dung B Huynh
(74) *Attorney, Agent, or Firm* — Foley & Lardner LLP; Christopher J. McKenna; Shabbi S. Khan

(57) ABSTRACT

Systems and methods are described for using a client agent operating in a virtual private network environment to intercept HTTP communications. Methods include: intercepting at the network layer, by a client agent executing on a client, an HTTP request from an application executing on the client; modifying the HTTP request; and transmitting, via a transport layer connection, the modified HTTP request to a server. Additional methods may comprise adding, removing, or modifying at least one cookie in the HTTP request. Still other methods may comprise modifying at least one name-value pair contained in the HTTP request. Corresponding systems are also described.

20 Claims, 28 Drawing Sheets

Related U.S. Application Data a continuation-in-part of application No. 11/462,267, filed on Aug. 3, 2006, now Pat. No. 8,943,304.

(60) Provisional application No. 60/685,260, filed on May 26, 2005.

(51) Int. Cl.
  *H04L 29/08* (2006.01)
  *H04W 8/24* (2009.01)

(52) U.S. Cl.
  CPC ...... *H04L 67/2804* (2013.01); *H04L 67/2823* (2013.01); *H04L 67/2852* (2013.01); *H04L 67/289* (2013.01); *H04L 69/321* (2013.01); *H04W 8/245* (2013.01)

(56) References Cited

U.S. PATENT DOCUMENTS

| | | |
|---|---|---|
| 5,905,492 A | 5/1999 | Straub et al. |
| 5,909,559 A | 6/1999 | So |
| 5,937,190 A * | 8/1999 | Gregory .............. G06F 17/5022 717/131 |
| 5,999,525 A | 12/1999 | Krishnaswamy et al. |
| 6,011,537 A | 1/2000 | Slotznick |
| 6,022,315 A | 2/2000 | Iliff |
| 6,085,224 A | 7/2000 | Wagner |
| 6,130,726 A | 10/2000 | Darbee et al. |
| 6,141,699 A | 10/2000 | Luzzi et al. |
| 6,161,139 A | 12/2000 | Win et al. |
| 6,161,760 A | 12/2000 | Marrs et al. |
| 6,167,441 A | 12/2000 | Himmel |
| 6,182,139 B1 | 1/2001 | Brendel |
| 6,182,142 B1 | 1/2001 | Win et al. |
| 6,185,625 B1 | 2/2001 | Tso et al. |
| 6,206,829 B1 | 3/2001 | Iliff |
| 6,289,382 B1 | 9/2001 | Bowman-Amuah |
| 6,292,792 B1 | 9/2001 | Baffes et al. |
| 6,308,273 B1 | 10/2001 | Goertzel et al. |
| 6,314,094 B1 | 11/2001 | Boys |
| 6,321,235 B1 | 11/2001 | Bird |
| 6,332,163 B1 | 12/2001 | Bowman-Amuah |
| 6,335,927 B1 | 1/2002 | Elliott et al. |
| 6,339,832 B1 | 1/2002 | Bowman-Amuah |
| 6,424,979 B1 | 7/2002 | Livingston et al. |
| 6,434,568 B1 | 8/2002 | Bowman-Amuah |
| 6,434,628 B1 | 8/2002 | Bowman-Amuah |
| 6,438,594 B1 | 8/2002 | Bowman-Amuah |
| 6,442,748 B1 | 8/2002 | Bowman-Amuah |
| 6,449,627 B1 | 9/2002 | Baer et al. |
| 6,449,658 B1 | 9/2002 | Lafe et al. |
| 6,473,794 B1 | 10/2002 | Guheen et al. |
| 6,477,580 B1 | 11/2002 | Bowman-Amuah |
| 6,477,665 B1 | 11/2002 | Bowman-Amuah |
| 6,482,156 B2 | 11/2002 | Iliff |
| 6,490,624 B1 | 12/2002 | Sampson et al. |
| 6,496,850 B1 | 12/2002 | Bowman-Amuah |
| 6,502,102 B1 | 12/2002 | Haswell et al. |
| 6,502,213 B1 | 12/2002 | Bowman-Amuah |
| 6,516,322 B1 | 2/2003 | Meredith |
| 6,519,571 B1 | 2/2003 | Guheen et al. |
| 6,523,027 B1 | 2/2003 | Underwood |
| 6,529,909 B1 | 3/2003 | Bowman-Amuah |
| 6,529,948 B1 | 3/2003 | Bowman-Amuah |
| 6,536,037 B1 | 3/2003 | Guheen et al. |
| 6,539,396 B1 | 3/2003 | Bowman-Amuah |
| 6,549,949 B1 | 4/2003 | Bowman-Amuah |
| 6,550,012 B1 | 4/2003 | Villa et al. |
| 6,550,057 B1 | 4/2003 | Bowman-Amuah |
| 6,563,517 B1 | 5/2003 | Bhagwat et al. |
| 6,571,282 B1 | 5/2003 | Bowman-Amuah |
| 6,578,068 B1 | 6/2003 | Bowman-Amuah |
| 6,578,073 B1 | 6/2003 | Starnes et al. |
| 6,584,567 B1 | 6/2003 | Bellwood et al. |
| 6,584,569 B2 | 6/2003 | Reshef et al. |
| 6,587,877 B1 * | 7/2003 | Douglis ............ G06F 17/30902 707/E17.12 |
| 6,587,880 B1 | 7/2003 | Saigo et al. |
| 6,591,266 B1 | 7/2003 | Li et al. |
| 6,601,192 B1 | 7/2003 | Bowman-Amuah |
| 6,601,233 B1 | 7/2003 | Underwood |
| 6,601,234 B1 | 7/2003 | Bowman-Amuah |
| 6,606,660 B1 | 8/2003 | Bowman-Amuah |
| 6,609,128 B1 | 8/2003 | Underwood |
| 6,611,840 B1 | 8/2003 | Baer et al. |
| 6,615,166 B1 | 9/2003 | Guheen et al. |
| 6,615,199 B1 | 9/2003 | Bowman-Amuah |
| 6,615,253 B1 | 9/2003 | Bowman-Amuah |
| 6,625,643 B1 | 9/2003 | Colby et al. |
| 6,633,878 B1 | 10/2003 | Underwood |
| 6,636,242 B2 | 10/2003 | Bowman-Amuah |
| 6,640,238 B1 | 10/2003 | Bowman-Amuah |
| 6,640,240 B1 | 10/2003 | Hoffman et al. |
| 6,640,244 B1 | 10/2003 | Bowman-Amuah |
| 6,640,249 B1 | 10/2003 | Bowman-Amuah |
| 6,658,464 B2 | 12/2003 | Reisman |
| 6,680,922 B1 | 1/2004 | Jorgensen |
| 6,691,301 B2 | 2/2004 | Bowen |
| 6,701,514 B1 | 3/2004 | Haswell et al. |
| 6,704,738 B1 | 3/2004 | de Vries et al. |
| 6,704,873 B1 | 3/2004 | Underwood |
| 6,715,145 B1 | 3/2004 | Bowman-Amuah |
| 6,718,535 B1 | 4/2004 | Underwood |
| 6,721,713 B1 | 4/2004 | Guheen et al. |
| 6,731,625 B1 | 5/2004 | Eastep et al. |
| 6,742,015 B1 | 5/2004 | Bowman-Amuah |
| 6,754,181 B1 | 6/2004 | Elliott et al. |
| 6,754,699 B2 | 6/2004 | Swildens et al. |
| 6,771,290 B1 | 8/2004 | Hoyle |
| 6,772,203 B1 | 8/2004 | Feiertag et al. |
| 6,792,458 B1 | 9/2004 | Muret et al. |
| 6,804,701 B2 | 10/2004 | Muret et al. |
| 6,807,277 B1 | 10/2004 | Doonan et al. |
| 6,816,872 B1 | 11/2004 | Squibb |
| 6,823,374 B2 | 11/2004 | Kausik et al. |
| 6,826,594 B1 | 11/2004 | Pettersen |
| 6,826,696 B1 | 11/2004 | Chawla et al. |
| 6,839,701 B1 | 1/2005 | Baer et al. |
| 6,842,906 B1 | 1/2005 | Bowman-Amuah |
| 6,847,983 B2 | 1/2005 | Somalwar et al. |
| 6,849,045 B2 | 2/2005 | Iliff |
| 6,859,879 B2 | 2/2005 | Henn et al. |
| 6,868,292 B2 | 3/2005 | Ficco et al. |
| 6,895,084 B1 | 5/2005 | Saylor et al. |
| 6,907,546 B1 | 6/2005 | Haswell et al. |
| 6,909,708 B1 | 6/2005 | Krishnaswamy et al. |
| 6,920,150 B1 | 7/2005 | Pauls et al. |
| 6,925,467 B2 | 8/2005 | Gu et al. |
| 6,956,858 B2 | 10/2005 | Hariguchi et al. |
| 6,957,186 B1 | 10/2005 | Guheen et al. |
| 6,963,981 B1 | 11/2005 | Bailey et al. |
| 6,976,090 B2 | 12/2005 | Ben-Shaul et al. |
| 6,980,962 B1 | 12/2005 | Arganbright et al. |
| 6,981,180 B1 | 12/2005 | Bailey et al. |
| 6,983,331 B1 | 1/2006 | Mitchell et al. |
| 6,986,102 B1 | 1/2006 | Baer et al. |
| 6,987,987 B1 | 1/2006 | Vacanti et al. |
| 6,993,004 B2 | 1/2006 | Boys |
| 6,993,591 B1 * | 1/2006 | Klemm .............. H04L 67/2847 707/999.002 |
| 7,007,034 B1 | 2/2006 | Hartman et al. |
| 7,007,064 B2 | 2/2006 | Faris |
| 7,034,691 B1 | 4/2006 | Rapaport et al. |
| 7,035,907 B1 | 4/2006 | Decasper et al. |
| 7,043,488 B1 | 5/2006 | Baer et al. |
| 7,047,281 B1 | 5/2006 | Kausik |
| 7,054,912 B2 | 5/2006 | Kanai et al. |
| 7,058,180 B2 | 6/2006 | Ferchichi et al. |
| 7,058,718 B2 | 6/2006 | Fontes et al. |
| 7,076,486 B2 | 7/2006 | Livshits |
| 7,076,494 B1 | 7/2006 | Baer et al. |
| 7,080,041 B2 | 7/2006 | Nagel |
| 7,085,834 B2 | 8/2006 | Delany et al. |
| 7,089,239 B1 | 8/2006 | Baer et al. |

(56) References Cited

U.S. PATENT DOCUMENTS

| | | |
|---|---|---|
| 7,092,370 B2 | 8/2006 | Jiang et al. |
| 7,093,018 B1 | 8/2006 | Sievers et al. |
| 7,096,495 B1 | 8/2006 | Warrier et al. |
| 7,100,195 B1 | 8/2006 | Underwood |
| 7,103,772 B2 | 9/2006 | Jorgensen et al. |
| 7,107,285 B2 | 9/2006 | von Kaenel et al. |
| 7,107,309 B1 | 9/2006 | Geddes et al. |
| 7,117,504 B2 | 10/2006 | Smith et al. |
| 7,127,713 B2 | 10/2006 | Davis et al. |
| 7,145,898 B1 | 12/2006 | Elliott |
| 7,149,698 B2 | 12/2006 | Guheen et al. |
| 7,152,047 B1 | 12/2006 | Nagel |
| 7,165,041 B1 | 1/2007 | Guheen et al. |
| 7,174,563 B1 | 2/2007 | Brownlie et al. |
| 7,188,216 B1 | 3/2007 | Rajkumar et al. |
| 7,197,762 B2 | 3/2007 | Tarquini |
| 7,203,722 B2 | 4/2007 | Elnozahy |
| 7,209,466 B2 | 4/2007 | Cabana |
| 7,216,713 B2 | 5/2007 | Read, Jr. |
| 7,222,137 B2 | 5/2007 | Terazono et al. |
| 7,320,009 B1 | 1/2008 | Srivastava et al. |
| 7,353,225 B2 | 4/2008 | Dada |
| 7,359,956 B2 | 4/2008 | Kanai et al. |
| 7,360,025 B1 | 4/2008 | O'Connell et al. |
| 7,366,824 B2 | 4/2008 | Chiang |
| 7,389,540 B2 | 6/2008 | Radatti et al. |
| 7,392,260 B2 | 6/2008 | Ren et al. |
| 7,437,457 B1 | 10/2008 | Eisendrath et al. |
| 7,441,119 B2 | 10/2008 | Brabson et al. |
| 7,464,332 B2 | 12/2008 | Carter, II |
| 7,512,702 B1 | 3/2009 | Srivastava et al. |
| 7,529,779 B2 | 5/2009 | Herle et al. |
| 7,565,450 B2 | 7/2009 | Garcia-Luna-Aceves et al. |
| 7,577,749 B1 | 8/2009 | Long |
| 7,616,597 B2 | 11/2009 | Liu et al. |
| 7,634,800 B2 | 12/2009 | Ide et al. |
| 7,698,318 B2 | 4/2010 | Fries et al. |
| 7,698,416 B2 | 4/2010 | Potti et al. |
| 7,711,706 B2 | 5/2010 | Manapetty et al. |
| 7,730,031 B2 | 6/2010 | Forster |
| 7,743,063 B2 | 6/2010 | James et al. |
| 7,797,406 B2 | 9/2010 | Patel et al. |
| 7,881,995 B2 | 2/2011 | Grimberg |
| 7,890,464 B2 | 2/2011 | Reinsch |
| 7,890,634 B2 | 2/2011 | Jiang et al. |
| 7,941,410 B2 | 5/2011 | Sagar et al. |
| 7,970,806 B2 | 6/2011 | Park et al. |
| 8,024,778 B2 | 9/2011 | Cash et al. |
| 8,136,149 B2 | 3/2012 | Freund |
| 8,156,071 B2 | 4/2012 | Gu et al. |
| 8,234,699 B2 | 7/2012 | Pollutro et al. |
| 8,776,166 B1 | 7/2014 | Erickson et al. |
| 8,943,304 B2* | 1/2015 | He .................. H04L 67/02 713/150 |
| 2001/0014915 A1* | 8/2001 | Blumenau ........ G06F 17/30876 709/224 |
| 2001/0019630 A1 | 9/2001 | Johnson |
| 2002/0010855 A1 | 1/2002 | Reshef et al. |
| 2002/0023145 A1* | 2/2002 | Orr .................. G06F 17/30902 709/219 |
| 2002/0042821 A1 | 4/2002 | Muret et al. |
| 2002/0049608 A1 | 4/2002 | Hartsell et al. |
| 2002/0049841 A1 | 4/2002 | Johnson et al. |
| 2002/0059274 A1 | 5/2002 | Hartsell et al. |
| 2002/0062384 A1* | 5/2002 | Tso .................. G06F 17/30902 709/229 |
| 2002/0065864 A1 | 5/2002 | Hartsell et al. |
| 2002/0065911 A1 | 5/2002 | von Klopp et al. |
| 2002/0083175 A1 | 6/2002 | Afek et al. |
| 2002/0112162 A1* | 8/2002 | Cocotis ............... H04L 63/08 713/176 |
| 2002/0116642 A1 | 8/2002 | Joshi et al. |
| 2002/0124100 A1* | 9/2002 | Adams ............ G06F 17/30902 709/232 |
| 2002/0129271 A1 | 9/2002 | Stanaway, Jr. et al. |
| 2002/0133723 A1 | 9/2002 | Tait |
| 2002/0138572 A1 | 9/2002 | Delany et al. |
| 2002/0143798 A1 | 10/2002 | Lisiecki et al. |
| 2002/0143888 A1 | 10/2002 | Lisiecki et al. |
| 2002/0147774 A1 | 10/2002 | Lisiecki et al. |
| 2002/0147927 A1 | 10/2002 | Tait |
| 2002/0161904 A1 | 10/2002 | Tredoux et al. |
| 2002/0165971 A1 | 11/2002 | Baron |
| 2002/0174227 A1 | 11/2002 | Hartsell et al. |
| 2002/0178211 A1 | 11/2002 | Singhal et al. |
| 2003/0014623 A1 | 1/2003 | Freed et al. |
| 2003/0014628 A1 | 1/2003 | Freed et al. |
| 2003/0014650 A1* | 1/2003 | Freed .................. H04L 29/06 713/189 |
| 2003/0037108 A1 | 2/2003 | Peiffer et al. |
| 2003/0041091 A1 | 2/2003 | Cheline et al. |
| 2003/0051142 A1 | 3/2003 | Hidalgo et al. |
| 2003/0056096 A1 | 3/2003 | Albert et al. |
| 2003/0065763 A1 | 4/2003 | Swildens et al. |
| 2003/0069803 A1 | 4/2003 | Pollitt |
| 2003/0105957 A1 | 6/2003 | Brabson et al. |
| 2003/0154239 A1 | 8/2003 | Davis et al. |
| 2003/0174648 A1* | 9/2003 | Wang ................. H04L 65/1013 370/235 |
| 2003/0182423 A1 | 9/2003 | Shafir et al. |
| 2003/0212771 A1 | 11/2003 | Kwon et al. |
| 2003/0217149 A1 | 11/2003 | Crichton et al. |
| 2003/0233581 A1 | 12/2003 | Reshef et al. |
| 2004/0006643 A1 | 1/2004 | Dolson et al. |
| 2004/0006739 A1 | 1/2004 | Mulligan |
| 2004/0010621 A1 | 1/2004 | Afergan et al. |
| 2004/0031058 A1 | 2/2004 | Reisman |
| 2004/0039827 A1 | 2/2004 | Thomas et al. |
| 2004/0068579 A1* | 4/2004 | Marmigere ............ H04L 29/06 709/242 |
| 2004/0073701 A1 | 4/2004 | Huang et al. |
| 2004/0122951 A1 | 6/2004 | Beck et al. |
| 2004/0168083 A1 | 8/2004 | Gasparini et al. |
| 2004/0177247 A1 | 9/2004 | Peles |
| 2004/0249970 A1 | 12/2004 | Castro et al. |
| 2004/0255048 A1 | 12/2004 | Lev Ran et al. |
| 2005/0004954 A1 | 1/2005 | Soule, III |
| 2005/0015429 A1 | 1/2005 | Ashley et al. |
| 2005/0015594 A1 | 1/2005 | Ashley et al. |
| 2005/0033858 A1 | 2/2005 | Swildens et al. |
| 2005/0039190 A1 | 2/2005 | Rees et al. |
| 2005/0044089 A1 | 2/2005 | Wu et al. |
| 2005/0049929 A1* | 3/2005 | Hsu .................... G06F 21/10 705/64 |
| 2005/0050053 A1 | 3/2005 | Thompson |
| 2005/0055577 A1 | 3/2005 | Wesemann et al. |
| 2005/0097598 A1 | 5/2005 | Pedlow et al. |
| 2005/0108710 A1 | 5/2005 | Patiejunas |
| 2005/0122980 A1 | 6/2005 | Anand et al. |
| 2005/0132030 A1 | 6/2005 | Hopen et al. |
| 2005/0132060 A1 | 6/2005 | Mo et al. |
| 2005/0165889 A1 | 7/2005 | Muret et al. |
| 2005/0198380 A1 | 9/2005 | Panasyuk et al. |
| 2005/0210263 A1 | 9/2005 | Levas et al. |
| 2005/0240940 A1* | 10/2005 | Quinet .................. H04L 29/06 719/315 |
| 2005/0251856 A1 | 11/2005 | Araujo et al. |
| 2005/0273849 A1 | 12/2005 | Araujo et al. |
| 2005/0273850 A1 | 12/2005 | Freund |
| 2006/0020807 A1 | 1/2006 | Aura et al. |
| 2006/0041635 A1 | 2/2006 | Alexander et al. |
| 2006/0047974 A1 | 3/2006 | Alpern et al. |
| 2006/0068755 A1 | 3/2006 | Shraim et al. |
| 2006/0069926 A1 | 3/2006 | Ginter et al. |
| 2006/0075464 A1 | 4/2006 | Golan et al. |
| 2006/0080432 A1 | 4/2006 | Spataro et al. |
| 2006/0085850 A1 | 4/2006 | Mayfield et al. |
| 2006/0106888 A1 | 5/2006 | Iida et al. |
| 2006/0112174 A1 | 5/2006 | L'Heureux et al. |
| 2006/0130046 A1 | 6/2006 | O'Neill |
| 2006/0143702 A1 | 6/2006 | Hisada et al. |
| 2006/0212706 A1 | 9/2006 | Jiang et al. |
| 2006/0271705 A1 | 11/2006 | Garcia-Luna-Aceves |

(56) References Cited

U.S. PATENT DOCUMENTS

| | | |
|---|---|---|
| 2007/0005777 A1 | 1/2007 | Fremantle et al. |
| 2007/0106681 A1 | 5/2007 | Haot et al. |
| 2007/0156852 A1 | 7/2007 | Sundarrajan et al. |
| 2007/0179955 A1 | 8/2007 | Croft et al. |
| 2007/0180088 A1 | 8/2007 | Zhao |
| 2007/0192853 A1 | 8/2007 | Shraim et al. |
| 2007/0245409 A1 | 10/2007 | Harris et al. |
| 2007/0253553 A1 | 11/2007 | Rahman et al. |
| 2007/0294762 A1 | 12/2007 | Shraim et al. |
| 2007/0299915 A1 | 12/2007 | Shraim et al. |
| 2008/0016233 A1 | 1/2008 | Schneider |
| 2008/0034416 A1 | 2/2008 | Kumar et al. |
| 2008/0034425 A1 | 2/2008 | Overcash et al. |
| 2008/0046616 A1 | 2/2008 | Verzunov et al. |
| 2008/0049786 A1 | 2/2008 | Ram et al. |
| 2008/0208752 A1 | 8/2008 | Gottlieb et al. |
| 2008/0225720 A1 | 9/2008 | Khemani et al. |
| 2008/0225748 A1 | 9/2008 | Khemani et al. |
| 2008/0225753 A1 | 9/2008 | Khemani et al. |
| 2008/0229381 A1 | 9/2008 | Sikka et al. |
| 2010/0049850 A1 | 2/2010 | Nanduri et al. |
| 2011/0138179 A1 | 6/2011 | Jiang et al. |
| 2011/0202755 A1 | 8/2011 | Orsini et al. |
| 2012/0027024 A1 | 2/2012 | Liang |
| 2012/0036178 A1 | 2/2012 | Gavini et al. |
| 2012/0331159 A1 | 12/2012 | Srtom et al. |
| 2012/0331379 A1 | 12/2012 | Carro et al. |
| 2013/0283343 A1 | 10/2013 | Lim |

FOREIGN PATENT DOCUMENTS

| | | |
|---|---|---|
| EP | 2 043 328 A2 | 4/2009 |
| WO | WO-99/64967 A1 | 12/1999 |
| WO | WO-00/51031 | 8/2000 |
| WO | WO-02/39261 A2 | 5/2002 |
| WO | WO-02/39264 A2 | 5/2002 |
| WO | WO-02/39275 A2 | 5/2002 |
| WO | WO-02/39666 A2 | 5/2002 |
| WO | WO-02/39693 A2 | 5/2002 |
| WO | WO-02/39695 A2 | 5/2002 |
| WO | WO-02/41575 A2 | 5/2002 |
| WO | WO-02/43364 A2 | 5/2002 |
| WO | WO-02/45370 A2 | 6/2002 |
| WO | WO-2005/029313 A1 | 3/2005 |
| WO | WO-2005/029363 A1 | 3/2005 |
| WO | WO-2006/012612 | 2/2006 |
| WO | WO-2006/061843 A2 | 6/2006 |
| WO | WO-2006/074072 A3 | 7/2006 |
| WO | WO-2007/024647 A2 | 3/2007 |
| WO | WO-2007/065146 A2 | 6/2007 |
| WO | WO-2008/112691 A2 | 9/2008 |
| WO | WO-2008/112692 A2 | 9/2008 |
| WO | WO-2008/112698 A2 | 9/2008 |

OTHER PUBLICATIONS

Advisory Action for U.S. Appl. No. 11/465,894 dated Mar. 15, 2011.
Advisory Action for U.S. Appl. No. 11/465,915 dated Mar. 10, 2010.
Australian Examination Report on 2007281083 dated Nov. 30, 2010.
Barrett, R. et al., "Intermediaries: New Places for Producing and Manipulating Web Content," Computer Networks and ISDN Systems, North Holland Publishing, Amsterdam, NL, vol. 30, No. 1-7, Apr. 1998 (14 pages).
Chinese Office Action for CN Application No. 200780036904.8 dated Apr. 12, 2012.
Chinese Office Action on 200780024871.5 dated Nov. 23, 2011.
Chinese Office Action on 200780036904.8 dated Oct. 10, 2011.
European Office Action issued on Dec. 21, 2012 in European Patent Application No. 07812481.5.
Indian First Exam Report for Indian Application No. 5104/KOLNP/2008 dated Apr. 27, 2015.
International Preliminary Report on Patentability for PCT/US2007/072490, dated Jan. 6, 2009, 8 pages.
International Preliminary Report on Patentability issued Jul. 11, 2013 in PCT Application No. PCT/US2011/067369.
International Preliminary Report on Patentability, PCT/US2007/075037, mailed on Feb. 3, 2009.
International Search Report for International Application No. PCT/US2007/075178, mailed on Jan. 28, 2008.
International Search Report for PCT Application No. PCT/US2007/072490. Date of mailing: Mar. 12, 2008. 2 pages.
International Search Report issued Jun. 26, 2012 in PCT Application No. PCT/US2011/067369.
Notice of Allowance for U.S. Appl. No. 11/462,267 dated Sep. 12, 2014.
Notice of Allowance for U.S. Appl. No. 11/465,894 dated Dec. 5, 2012.
Notice of Allowance for U.S. Appl. No. 11/465,915 dated Nov. 9, 2012.
Office Action for U.S. Appl. No. 11/465,894 dated May 18, 2010.
Office Action for U.S. Appl. No. 11/465,894 dated Dec. 29, 2009.
Office Action for U.S. Appl. No. 11/465,894 dated Mar. 9, 2012.
Office Action for U.S. Appl. No. 11/465,915 dated Jun. 29, 2010.
Office Action for U.S. Appl. No. 11/465,915 dated Dec. 31, 2009.
Park J S et al: "Secure cookies on the Web", IEEE Internet Computing, IEEE Service Center, New York, NY, US, Jul. 1, 2000, pp. 36-44, XP002190888.
U.S. Office Action, dated Aug. 3, 2009, in U.S. Appl. No. 11/465,915, 12 pages.
US Final Office Action for U.S. Appl. No. 11/462,308 dated Feb. 24, 2010.
US Final Office Action for U.S. Appl. No. 11/462,300 dated Jan. 29, 2010.
US Non-final Office Action for U.S. Appl. No. 11/462,267 dated May 27, 2010.
US Non-final Office Action for U.S. Appl. No. 11/462,308 dated Aug. 4, 2009.
US Non-final Office Action for U.S. Appl. No. 11/462,308 dated Nov. 12, 2010.
US Non-final Office Action in U.S. Appl. No. 11/462,300 dated Jul. 8, 2009.
US Notice of Allowance for U.S. Appl. No. 12/790,400 dated May 8, 2014.
US Notice of Allowance for U.S. Appl. No. 13/337,735 dated Jun. 11, 2014.
US Notice of Allowance for U.S. Appl. No. 13/760,898 dated Jun. 4, 2014.
US Notice of Allowance for U.S. Appl. No. 13/850,848 dated Apr. 24, 2014.
US Notice of Allowance for U.S. Appl. No. 11/462,308 dated Nov. 23, 2012.
US Office Action U.S. Appl. No. 14/594,963 DTD Sep. 9, 2015.
US Office Action dated Jul. 29, 2009 in U.S. Appl. No. 11/465,894 (13 pages,).
US Office Action for U.S. Appl. No. 11/465,915 dated Dec. 3, 2010.
US Office Action for U.S. Appl. No. 11/462,267 dated Oct. 28, 2013.
US Office Action for U.S. Appl. No. 11/462,267 dated May 6, 2014.
US Office Action for U.S. Appl. No. 11/465,894 dated Oct. 27, 2010.
US Office Action for U.S. Appl. No. 11/465,894 dated Sep. 20, 2011.
US Office Action for U.S. Appl. No. 12/790,400 dated Jan. 23, 2013.
US Office Action for U.S. Appl. No. 12/790,400 dated Nov. 16, 2011.
US Office Action for U.S. Appl. No. 12/790,400 dated Dec. 16, 2013.
US Office Action for U.S. Appl. No. 12/790,400 dated May 31, 2011.
US Office Action for U.S. Appl. No. 12/790,400 dated Jul. 12, 2013.
US Office Action for U.S. Appl. No. 12/790,400 dated Aug. 2, 2012.
US Office Action for U.S. Appl. No. 13/337,735 dated Nov. 1, 2013.
US Office Action for U.S. Appl. No. 13/337,735 dated Feb. 11, 2013.

(56) References Cited

OTHER PUBLICATIONS

US Office Action for U.S. Appl. No. 13/850,848 dated Feb. 13, 2014.
US Office Action for U.S. Appl. No. 13/850,848 dated Aug. 1, 2013.
US Office Action for U.S. Appl. No. 13/370,989 dated Nov. 19, 2013.
US Office Action for U.S. Appl. No. 11/462,267 dated Nov. 10, 2010.
US Office Action for U.S. Appl. No. 11/462,267 dated Nov. 10, 2011.
US Office Action for U.S. Appl. No. 11/462,267 dated Mar. 7, 2012.
US Office Action for U.S. Appl. No. 11/462,267 dated May 11, 2011.
US Office Action for U.S. Appl. No. 11/462,300 dated Feb. 14, 2011.
US Office Action for U.S. Appl. No. 11/462,308 dated Nov. 12, 2011.
US Office Action for U.S. Appl. No. 11/462,308 dated May 10, 2011.
US Office Action on U.S. Appl. No. 14/448,298 DTD Sep. 24, 2015.
Written Opinion of the International Searching Authority for International Application No. PCT/US2007/075178, mailed on Jan. 28, 2008.
European Examination Report on EP Application No. 07813757.7 dated Mar. 2, 2016.
US Notice of Allowance on U.S. Appl. No. 14/448,298 dated Mar. 31, 2016.
US Office Action on U.S. Appl. No. 14/594,963 DTD Mar. 15, 2016.
U.S. Appl. No. 11/439,003, filed May 22, 2006.
U.S. Appl. No. 14/448,642, filed Jul. 31, 2014.
U.S. Appl. No. 11/462,267, filed Aug. 3, 2006.
U.S. Appl. No. 14/594,963, filed Jan. 12, 2015.
U.S. Appl. No. 11/428,058, filed Jun. 30, 2006.
U.S. Appl. No. 12/790,400, filed May 28, 2010.
U.S. Appl. No. 11/462,308, filed Aug. 3, 2006.
U.S. Appl. No. 11/465,915, filed Aug. 21, 2006.
U.S. Appl. No. 13/760,898, filed Feb. 6, 2013.
U.S. Appl. No. 11/439,009, filed May 22, 2006.
U.S. Appl. No. 14/448,298, filed Jul. 31, 2014.
U.S. Appl. No. 14/077,119, filed Nov. 11, 2013.
US Office Action on U.S. Appl. No. 14/448,642 dated Jul. 15, 2016.
US Office Action on U.S. Appl. No. 14/594,963 dated Sep. 19, 2016.

\* cited by examiner

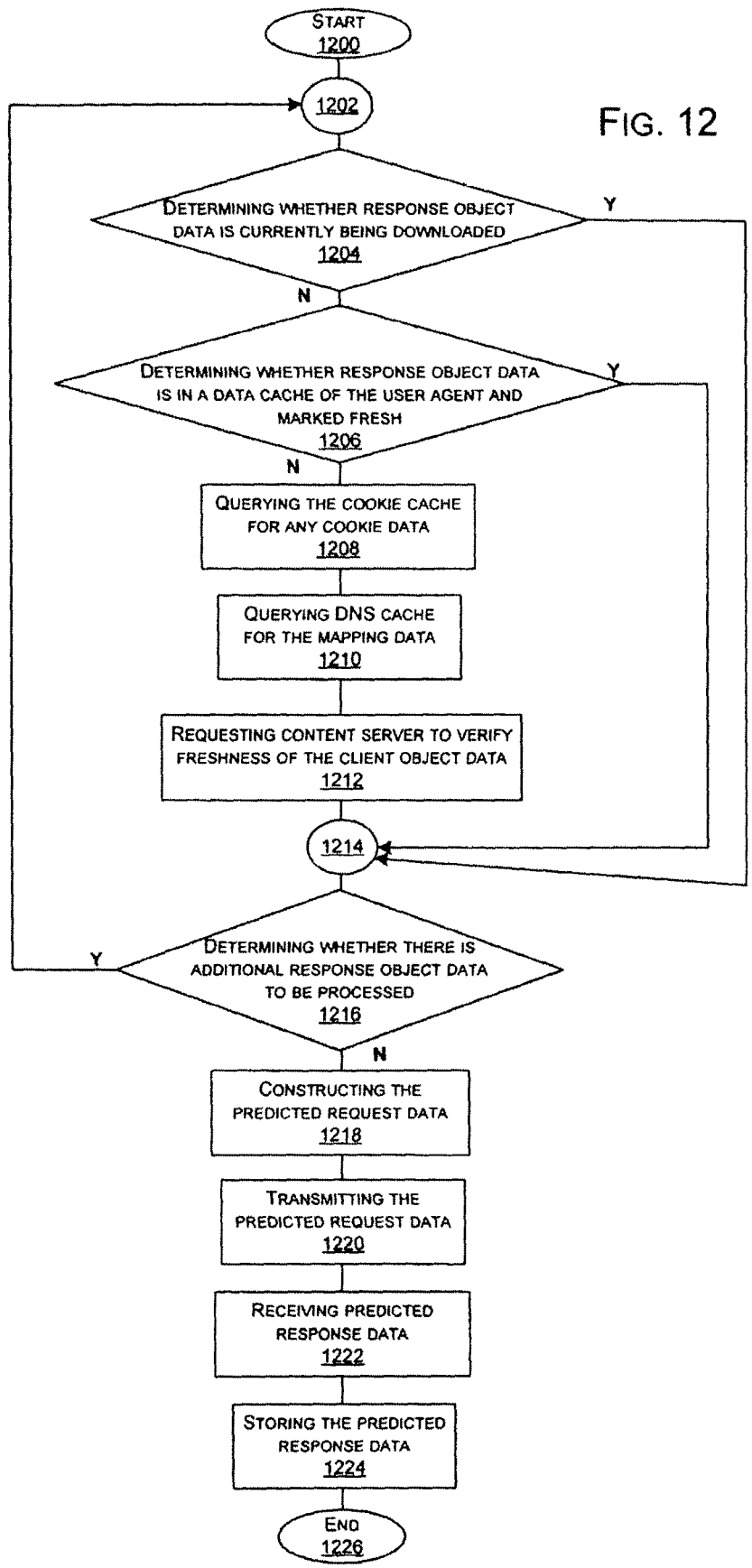

SYSTEMS AND METHODS FOR USING AN HTTP-AWARE CLIENT AGENT

RELATED APPLICATIONS

The present application is a continuation-in-part of and claims priority to and the benefit of U.S. Non-provisional application Ser. No. 11/439,003, entitled "Method and System For Object Prediction" and filed on May 22, 2006, which claims priority to and the benefit of U.S. Provisional Application No. 60/685,260, entitled "Advanced Data Optimization" and filed May 26, 2005; and the present application is also a continuation-in-part of and claims priority to and the benefit of U.S. Non-provisional application Ser. No. 11/462,267, entitled "Systems And Methods For Using An HTTP-Aware Client Agent" and filed on Aug. 3, 2006, all of which are incorporated herein by reference in their entirety for all purposes.

FIELD

The present application relates to networking technologies, and specifically the use of a client agent to intercept HTTP requests and responses in order to provide optimized communications.

BACKGROUND

The Internet allows for vast amounts of information to be communicated over any number of interconnected networks, computers, and network devices.

Many applications, such as web browsers, communicate with servers using HTTP. This may result in a significant amount of traffic over a given network being HTTP traffic. Thus, many benefits may be obtained by optimizing and controlling the flow of HTTP traffic in a virtual private network. For example, caching may be used to improve service for repeated HTTP requests. Or, for example, benefits may be obtained by controlling the names of resources requested, and any data sent along with a request. However, the number of different applications using HTTP may make impractical the task of adapting all HTTP applications specifically for operating in a virtual private network environment.

Many virtual private networks and resources within them also require user authentication. For example, a user of a virtual private network may be asked to provide a name and password in order to log on to the network, and also to gain access to certain resources. HTTP cookies may be used to pass authentication information from a client to a virtual private network appliance. Often web browsers are used to manage these authentication cookies.

Several problems may arise in the use of web browsers to manage HTTP cookies to authenticate users of a virtual private network. For example, a user may use a web browser to open a plurality of simultaneous connections to a virtual private network. It may be desirable in this case that the authentication cookie from the first connection be used again to establish the second connection so the user does not have to reenter the authentication information. This feature may be difficult to implement given the variety of cookie management policies across different browsers, such as expiration time, and accessibility of the cookie cache. Also, for example, a user may attempt to open a non-HTTP connection via the virtual private network, in which case the web browser may not be used, meaning the authentication cookie may not be accessible.

SUMMARY

Typically, information or content is located at websites on one or more servers, and a user can retrieve the content using a user agent, such as a web browser, running on a client device. For example, the user can input a webpage address into the web browser or access a web link, which sends requests to a server to access and provide the content on the respective website. This type of communication is commonly referred to as "web browsing."

Web browsing is enjoyed by millions of users on the Internet. However, accessing content on a network that is constrained by bandwidth and latency can make web browsing less enjoyable. Bandwidth is the measurement of the speed of a network link. Lower bandwidth network links take more time to transfer content than higher bandwidth links. Latency is a measurement of the responsiveness of a network link. Higher latency networks take more time than lower latency networks to send a single byte of data over a network link.

Many networks can suffer from low bandwidth and/or high latency problems that degrade the enjoyment of web browsing for users. Wireless wide area networks (WANs), such as GPRS or CDMA 1xRTT wireless networks, are just a few networks, along with traditional plain old telephone (POTS) dialup networks, that can exhibit bandwidth and latency problems. These networks may take 50 to 100 seconds to download content from a web page due to bandwidth and latency constraints, whereas a high-speed local area network (LAN) may be less prone to such constraints and can download the same content in 5 to 10 seconds. Waiting a long time to view content for a web page is annoying to users and inefficiently utilizes the network.

Utilizing a network efficiently is also a particular concern for network providers who must share limited resources among many users. For example, wireless WAN providers share very expensive and limited spectrum among all of its data and voice subscribers. Thus, efficient use of the spectrum frequencies is imperative.

Furthermore, in a wireless WAN environment, data transmission is more susceptible to interference and noise in contrast to a wired environment. Interference and noise delay the data transmission process and, more importantly, cause variability and unpredictability in the delay. A web site that may download objects in 50 seconds the first time may download the same objects in 100 seconds the next time. Thus, in order to address these concerns, network providers must efficiently use existing network infrastructure to provide the most efficiency to a user when downloading content.

Furthermore, the manner in which information is transferred on a network plays a network's efficiency. Referring to the World Wide Web (WWW), the Hypertext Transfer Protocol (HTTP) sets forth the rules for transferring content such as files or objects on the web. This protocol uses requests and responses for transferring content. For example, a user agent (e.g., a web browser) sends a request to the content server for a particular file or object of a web page and the server of the web page queries the object in a database and sends back the object as part of a response to the user agent. This process continues until every object in the web page has been downloaded to the user agent.

As web pages have become more complex, a common website may contain hundreds of objects on its web pages. Such objects may include text, graphics, images, sound, etc. The web pages may also have objects located across multiple servers. That is, one server may provide dynamic content (e.g., content that remembers the last books ordered by a user) for a web page, whereas other servers may provide static but rotating content such as an advertisement, and still others provide the static content of the site. As such, before a user can view a web page, hundreds of objects may require downloading from multiple servers. Each server, however, may take a different amount of time to service a request for an object contributing to latency. Thus, the latency for each server may vary with different levels of magnitude, e.g., one server may respond in milliseconds whereas another server may respond in seconds.

Latency constraints, however, should not be confused with bandwidth constraints. FIG. 1 illustrates the retrieval sequence for objects on a bandwidth constrained network using HTTP over TCP/IP. In this illustration, each request for an object requires a connection to be established between a client and a server with an exchange of "SYN" and "ACK" messages necessary for TCP/IP. Due to the relatively small latency of the network and the responsiveness of the server, the ACK message is sent back to the client quickly. However, because the network is bandwidth constrained, a response back to the client takes a relatively long time. This is exacerbated if the object for the request is large in nature and must be broken into many packets as shown in FIG. 1. As a result, the overall download time for each request/response is dominated by the time it takes to download all the packets of the individual objects on a network link. Such download time can be calculated by adding the size of each of the individual objects and dividing the aggregate size by the link bandwidth.

FIG. 2 illustrates the retrieval sequence for objects on a latency constrained network using HTTP over TCP/IP. In this illustration the network is not limited by bandwidth, but instead by the latency or the time it takes to send a packet from the client to the server through the network. In particular, when a user agent requests small objects on a network affected by high latency, the overall download time is dominated by time it takes a request to travel to the server, the responsiveness of the server to process the request, and the time it takes for a response to travel back to user agent. The download time of a web page with many objects can be calculated by adding the round trip time (RTT) for the request to travel to the server and the response to travel back to the client in addition to the response of the server and multiplying that by the number of objects on the web page.

Unfortunately, user agents are in fact a source of latency when downloading an object. This latency is a result of the user agent processing the downloaded objects and attempting to display these objects in the manner the web page designers intended. Web page designers use a multitude of different standards to instruct the user agents how a web page is supposed to look once rendered. The number of standards is increasing over time and include markup languages (e.g., Hyper Text Markup Language (HTML), Extensible HTML (XHTML), Wireless Markup Language (WML)), objects that define the overall style of the page (e.g., Cascading Style Sheets (CSS)), objects that are executed by the user agent (e.g., JavaScript), and image objects (e.g., JPEG, GIF, PNG). After downloading each object the user agent needs time to process and determine the impact of each object on the displayed web page. The processing time of each object may impact the download of subsequent objects. For CPU constrained devices (e.g., phones) the latency from browser processing time can contribute significantly to the overall download time of a web page. Also, for poorly implemented user agents certain objects may significantly impact the time to render a web page. Even over a high bandwidth and low latency network, the implementation of the user agent can result in these object processing times severely impacting the download time of the web page.

Embodiments of the present solution relates to systems and methods for using an HTTP-aware client agent. In one aspect, the present invention is a method for using a client agent operating in a virtual private network environment to intercept HTTP communications. In one embodiment, the method comprises: intercepting at the network layer, by a client agent executing on a client, an HTTP request from an application executing on the client; modifying the HTTP request; and transmitting, via a transport layer connection, the modified HTTP request to a server. In some embodiments, the method may comprise adding, removing, or modifying at least one cookie in the HTTP request. In other embodiments, the method may comprise modifying at least one name-value pair contained in the HTTP request.

In a second aspect, the present solution relates to a computer implemented system for using a client agent operating in a virtual private network environment to intercept HTTP communications. In one embodiment, the system comprises: a client computing device; and a client agent which executes on the client; intercepts at the network layer an HTTP request from an application executing on the client; modifies the HTTP request; and transmits, via a transport layer connection, the modified HTTP request to a server.

In third aspect, the present solution is a method for using a client agent to enable HTTP cookie authentication in non-HTTP communications from a client, the method comprising: intercepting, by a client agent executing on a client, a connection request from the client; establishing, by the client agent, a transport layer virtual private network connection with a network appliance; transmitting, by the client agent via the established connection, an HTTP request comprising an authentication cookie; and transmitting, by the client agent via the connection, the connection request.

In a fourth aspect the present solution is a computer implemented system for using a client agent to enable HTTP cookie authentication in non-HTTP communications from a client, the system comprising: a client computing device; and a client agent executing on the client, which intercepts a connection request from the client; establishes a transport layer virtual private network connection with a network appliance; transmits, by the client agent via the established connection, an HTTP request comprising an authentication cookie; and transmits, by the client agent via the connection, the connection request.

In a fifth aspect, the present solution is a method for using a client agent to enable secure authentication in a virtual private network environment using an HTTP cookie, the method comprising: intercepting, by a client agent executing on a client, an HTTP communication comprising a cookie from an appliance on a virtual private network to the client; removing, by the client agent, the cookie from the HTTP communication; storing, by the client agent, the received cookie; transmitting, by the client agent, the modified HTTP communication to an application executing on the client; intercepting, by the client agent, an HTTP request from the client; inserting, by the client agent in the HTTP request, the received cookie; and transmitting the modified HTTP request to the appliance.

In a sixth aspect, the present solution is a computer implemented system for using a client agent to enable secure authentication in a virtual private network environment using an HTTP cookie, the system comprising: a client computing device; and a client agent executing on the client which intercepts an HTTP communication comprising a cookie from an appliance on a virtual private network to the client; removes the cookie from the HTTP communication; stores the received cookie; transmits the modified HTTP communication to an application executing on the client; intercepts, by the client agent, an HTTP request from the client; inserting, by the client agent in the HTTP request, the received cookie; and transmitting the modified HTTP request to the appliance.

In some aspects, the present solution is directed to a method of intercepting, by a client agent executing on a client device, one or more transport layer packets below an application layer of a network stack of the client device. The one or more transport layer packets may include application layer content data of a web page from a server for a request from a user agent executing on the client device. The method may further include identifying, by the client agent operating below the application layer of the network stack of the client device, request object data from uniform resource locators (URLs) embedded in application layer content data contained in a payload of the intercepted one or more transport layer packets and placing, by the client device, the request object data on a request object list. The method also includes querying, by the client device, a data cache of the client device to determine whether the request object data of the request object list in stored in the data cache and marking, by the client device responsive to determining that request object data is not stored in the cache, in the request object list the request object data as to be downloaded to the client device. The client device may transmit the request object list to a second device.

In some embodiments, the method includes intercepting, by the client agent, the one or more transport layer packets, at a network layer of the network stack. In some embodiments, the method includes intercepting, by the client agent, the one or more transport layer packets, at a transport layer of the network stack. In some embodiments, the method includes inserting, in the application layer content data, information identifying a version of the request object data identified by the URL stored in the data cache. In some embodiments, the method includes modifying a URL identified in the application layer content data. In some embodiments, the method includes determining that a second requested object data of the request object list is stored in the data cache and is fresh and marking the second requested object data in the request object list as being fresh.

In some embodiments, the method includes determining that a second requested object data of the request object list is stored in the data cache and is stale; and marking the second requested object data in the request object list as being stale. In some embodiments, the method includes determining that the requested object data marked as being stale or to be downloaded matches stored predicted request data in a predicted response cache. In some embodiments, the method includes marking the requested object data in the request object list as not to be downloaded. In some embodiments, the second device is intermediary to the client device and a content server. The second device may be configured to obtain one or more requested object data in the request object list from one or more content servers.

In some aspects, the present solution is directed to a system include a client agent configured to execute on a processer of a client device. The client agent may be configured to intercept one or more transport layer packets below an application layer of a network stack of the client device. The one or more transport layer packets may include application layer content data of a web page from a server for a request from a user agent executing on the client device. The client agent may be configured to operate below the application layer of the network stack of the client device and to identify request object data from uniform resource locators (URLs) embedded in application layer content data contained in a payload of the intercepted one or more transport layer packets. The client device may be configured to place the request object data on a request object list and query a data cache of the client device to determine whether the request object data of the request object list in stored in the data cache and responsive to determining that request object data is not stored in the cache, the client device may be configured to mark in the request object list the request object data as to be downloaded to the client device. The client device may be configured to transmit the request object list to a second device.

In some embodiments, the client agent is further configured to intercept the one or more transport layer packets, at a network layer of the network stack. In some embodiments, the client agent is further configured to intercept the one or more transport layer packets, at a transport layer of the network stack. In some embodiments, the client agent is further configured to insert in the application layer content data information identifying a version of the request object data identified by the URL stored in the data cache. In some embodiments, the client agent is further configured to modify a URL identified in the application layer content data. In some embodiments, the client device is further configured to determine that a second requested object data of the request object list is stored in the data cache and is fresh and mark the second requested object data in the request object list as being fresh.

In some embodiments, the client device is further configured to determine that a second requested object data of the request object list is stored in the data cache and is stale and mark the second requested object data in the request object list as being stale. In some embodiments, the client device is further configured to determine that the requested object data marked as being stale or to be downloaded matches stored predicted request data in a predicted response cache. In some embodiments, the client device is further configured to mark the requested object data in the request object list as not to be downloaded. In some embodiments, the second device is intermediary to the client device and a content server, the second device is configured to obtain one or more requested object data in the request object list from one or more content servers.

The details of various embodiments of the present solution are set forth in the accompanying drawings and the description below.

BRIEF DESCRIPTION OF THE DRAWINGS

The foregoing and other objects, aspects, features, and advantages of the invention will become more apparent and better understood by referring to the following description taken in conjunction with the accompanying drawings, in which:

FIG. 12 is a flowchart providing an exemplary method for processing a response object list;

Figure 1:
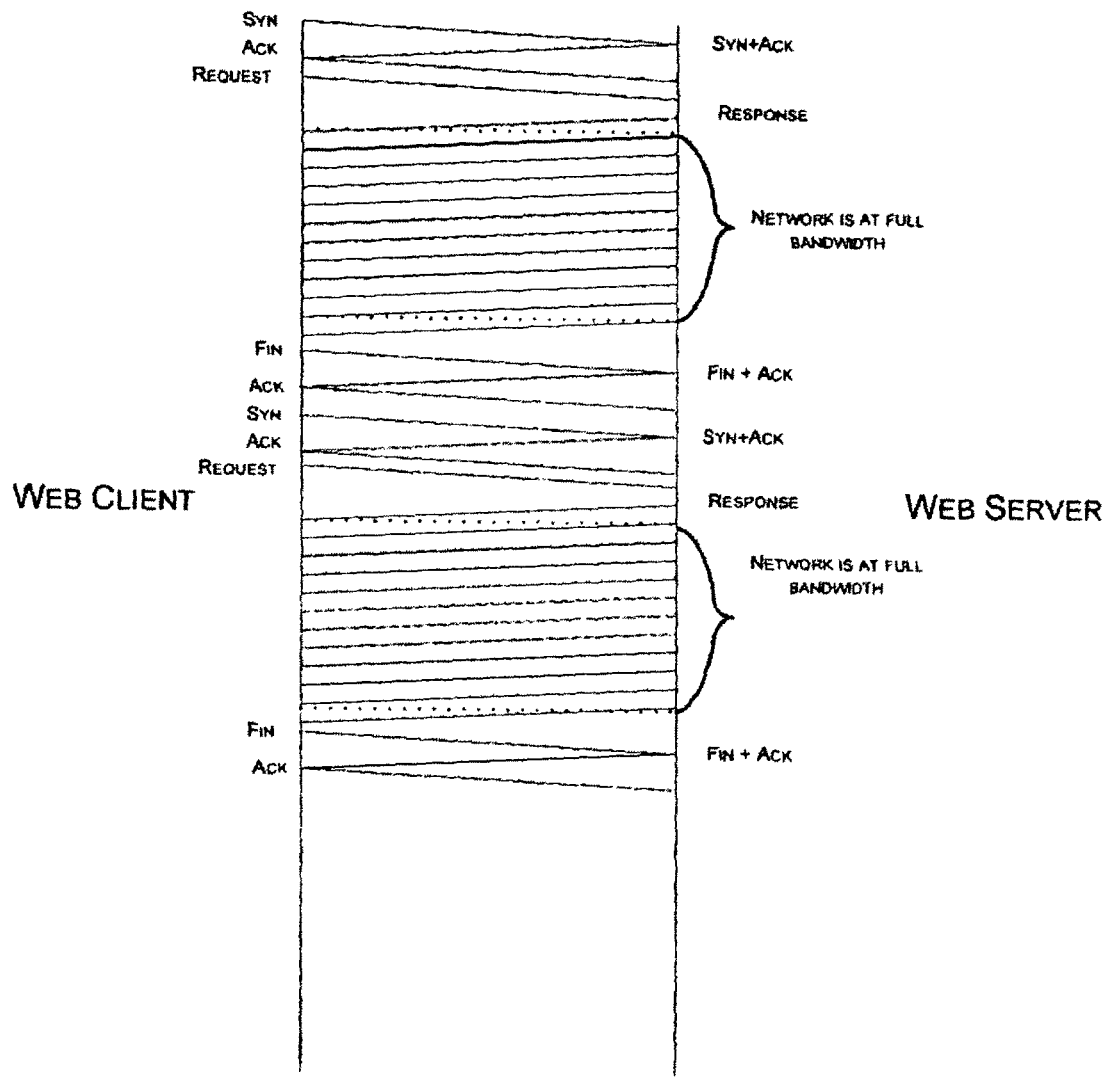
FIG. 1 illustrates the retrieval sequence for objects on a bandwidth constrained network using HTTP over TCP/IP.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION

Reference will now be made in detail to the exemplary embodiments implemented according to the invention, the examples of which are illustrated in the accompanying drawings. Wherever possible, the same reference numbers will be used throughout the drawings to refer to the same or like parts.

Figure 3:
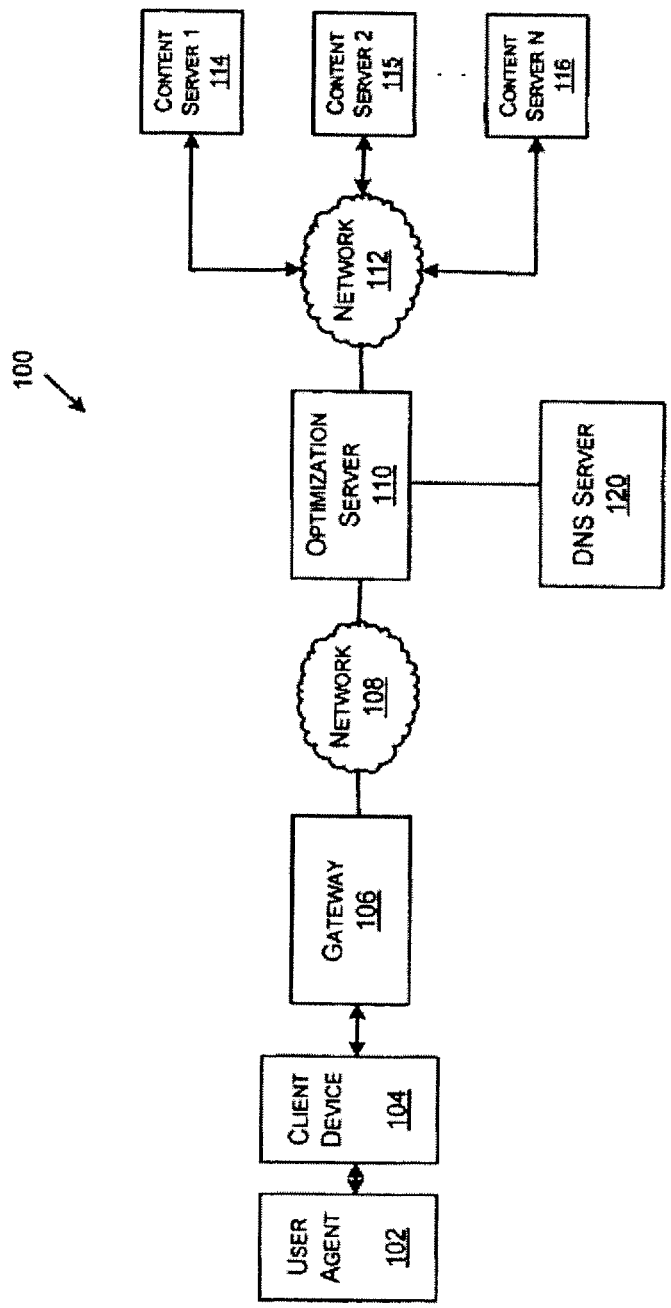
FIG. 3 is a block diagram of an exemplary system.

FIG. 3 is a block diagram of an exemplary system. Exemplary system 100 can be any type of system that transmits data over a network. For example, the exemplary system can include a browser accessing information from content servers through the Internet. The exemplary system can include, among other things, a user agent 102, a client device 104, a gateway 106, one or more networks 108, 112, an optimization server 110, one or more content servers 114-116, and a DNS server 120.

User agent 102 is a client application used with a network protocol. For example, user agent 102 could be a web browser, a search engine crawler, a screen reader, or a Braille browser, and the user agent 102 could be used to access the Internet. User agent 102 can be a software program that transmits request data (e.g., an HTTP/WAP request data) to a web server and receives response data in response to the request data. For example, user agent 102 can send request data to the content servers 114-116 for a particular file or object data of a web page identified by a URL, and the content server of the web page can query the object data in a database and can send back the object data as part of the response data (e.g., HTTP/WAP response data) to the user agent. This process continues until every object in the web page has been downloaded to the user agent.

Client device 104 is a computer program or terminal that can access remote services. Client device 104 can receive request data from the user agent 102, can transmit the request data to the content servers, and can receive response data in response to the request data. For example, the client device can be Bytemobile Optimization Client Software. Client device's functionality is further described below. In some embodiments, user agent 102 and client device 104 can be housed in the same device, such as a computer, a PDA, a cell phone, a laptop, or any device accessing the Internet. Furthermore, client device 104 can be embedded within user agent 102.

Gateway 106 is a device that converts formatted data provided in one type of network to a particular format required for another type of network. Gateway 106, for example, may be a server, a router, a firewall server, a host, or a proxy server. The gateway 106 has the ability to transform the signals received from client device 104 into a signal that network 108 can understand and vice versa.

Networks 108 and •112 can include any combination of wide area networks (WANs), local area networks (LANs), or wireless networks suitable for networking communication such as Internet communication.

Optimization server (OS) 110 is a server that provides communication between gateway 106 and content servers 114-116. For example, OS 110 could be a Bytemobile Optimization Services Node. OS 110 can optimize 'performance by enabling significantly faster and more reliable service to customers. OS's 110 can include optimization techniques, which are further described below.

Content servers 114-116 are servers that receive the request data from the user agent 102, processes the request data accordingly, and returns the response data back to the user agent 102. For example, content servers 114-116 can be a web server, an enterprise server, or any other type of server. Content servers 114-116 can be a computer or a computer program that is responsible for accepting HTTP requests from the user agent and serving the user agents with HTTP responses.

Domain Name System (DNS) server 120 is a server that associates many types of information to domain names. DNS server 120 maps the fully qualified domain name (FQDN) of a URL to the IP address associated with the FQDN. For example, DNS server 120 makes it possible to attach hard-to-remember IP addresses (such as 209.10.233.130) to easy-to-remember domain names (such as "bytemobile.com.").

DNS server 120 can also list mail exchange servers accepting e-mail for each domain.

Figure 4:
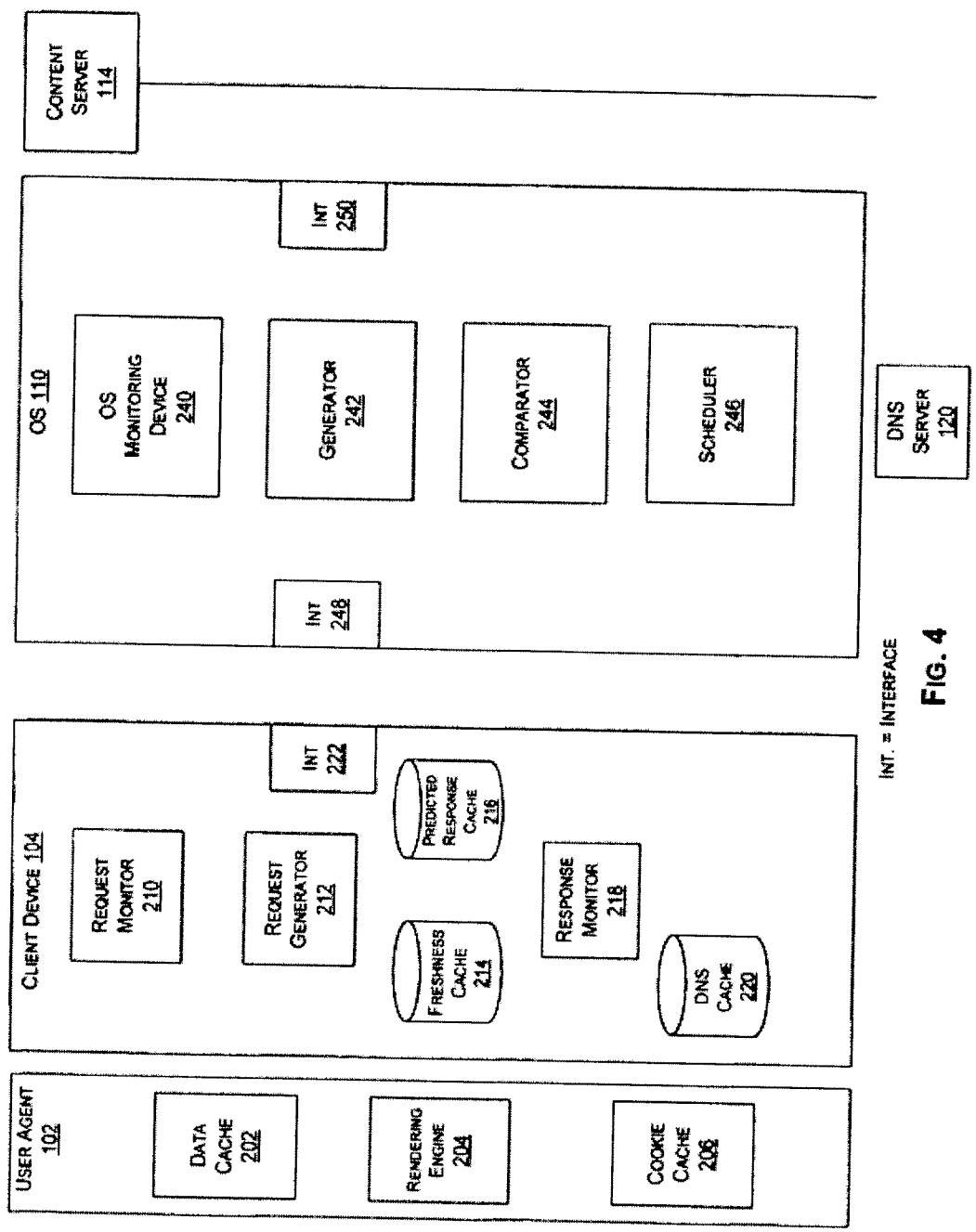
FIG. 4 is a block diagram illustrating an embodiment of the exemplary system of FIG. 1.

FIG. 4 is a block diagram illustrating an embodiment of the exemplary system of FIG. 3. User agent 102 may include, among other things, a data cache 202, rendering engine 204, and a cookie cache 206.

Data cache 202 is a storage device that stores web documents to reduce bandwidth usage and web page access times. Data cache 202 stores copies of object data requested and received by the user. Subsequent web page requests may be satisfied by accessing the data cache 202 if certain conditions are met. Such conditions may include whether the object data is located in the data cache 202 and whether the object data is deemed fresh or stale. For example, the freshness of the object data can be defined by the definition of 'fresh' and 'stale' in RFC 1945 and RFC 2616.

Rendering engine 204 can be a software application that enables a user agent to display and interact with text, images, and other information located on a webpage. When a user types in a web address or URL into the user agent 102, the rendering engine 204 uses Hypertext Transfer Protocol (HTTP) to initiate the request with the content server, e.g., content server 114. Although rendering engines can be used to access the Internet, they can also be used to access data provided by web servers in private networks or content in file systems.

Cookie cache 206 is a device that stores data relating to cookies. In some embodiments, cookie cache 206 is located on the hard drive on the client device that the user agent runs. Cookie cache can include cookies, which can include, among other things, user IDs, passwords, preference data, etc.

Client device 104 may include, among other things, a request monitor 210, a request generator 212, a freshness cache 214, a predicted response cache 216, a response monitor 218, a DNS cache 220, and an interface 222.

Request monitor 210 can be a software program or a hardware device that receives or intercepts the request data, such as an HTTP request, from the rendering engine 204. Request monitor 210 can identify the embedded request object data (e.g., embedded URLs) located with the request data and create a request object list that includes the request object data, the freshness data of the request object data, FQDN of the request object data, and/or any cookie data associated with the request object data. Request monitor 210 has the ability to communicate with user agent 102 to determine whether the request object data and any cookie data associated with the request object data are stored in the user agent 102 and if so, whether the request object data is fresh or stale. Request monitor 210 has the ability to forward to OS 110 the request data and, if available, the request object list.

Request generator 212 can be a software program or a hardware device that constructs predicted request data. Request generator 212 constructs predicted request data by accumulating object data, mapping data linking the FQDN of the object data to an IP address of the FQDN, and cookie data associated with the object data. This allows request generator 212 to mimic, as closely as possible, subsequent request data. Furthermore, request generator 212 may use a user agent string and other request data headers to help mimic the subsequent request data. In some embodiments, request generator 212 flags the predicted request data to indicate that it is a predicted request and not an original request. Request generator 212 has the ability to forward the predicted request data through OS 110 to content servers 114-116.

Freshness cache 214 is a device that stores the freshness data of object data that the user agent has determined to be stale. For example, freshness cache 214 can be a list, an array, a database, a cache, etc. When the client device 104 receives request data from the user agent and the request data includes request object data that is stale, the freshness cache 214 can be accessed to determine whether that stale object data is actually fresh. If the stale object data is indeed fresh, client device 104 can inform the user agent that the object data stored in the data cache 202 is fresh. Freshness cache 214 receives freshness data from response monitor 218 when optimized data includes the freshness data.

Predicted response cache 216 is a storage 'device that stores for a configurable amount of time predicted response data and stored predicted request data that identifies the predicted response data. Predicted response cache 216 can provide predicted response data to the request monitor if the request data for a particular web page from the user agent 102 matches stored predicted request data identifying the predicted response data stored at the predicted response cache 216. This stored predicted request data can be matched to request data received by the request monitor 210 and acts as a cross reference to the predicted store data. For example, the predicted response cache can receive request object data, cookie data of the request object data, data cache parameters, and the user agent making the request to determine whether the request data matches the stored request data identifying the predicated response data. After a configurable amount of time has elapsed, the predicted response cache 216 can discard portions of the unused predicted response data and the stored predicted request data. Predicted response cache 216 receives response data corresponding to a stale request object data from response monitor 218 when optimized data includes this response data.

Response monitor 218 can be a software program or a hardware device that receives optimized data from the OS 110. The optimized data can include, among other things, response data received from a content server, response object list providing response object data, any mapping data, any freshness data for a request object data that was marked as stale and verified by the content server to be fresh ("fresh" stale object data), and/or response data corresponding to a stale request object data. After receiving the optimized data, the response monitor 218 separates the optimized data and processes the separated data accordingly. Response monitor 218 is communicatively coupled to DNS cache 220, freshness cache 214, predicted response cache 216, and user agent 102.

DNS cache 220 is a data storage device that stores mapping data linking the FQDN of the object data to an IP address of the FQDN. DNS cache 220 receives mapping data from response monitor 218 when the optimized data includes the mapping data. Additionally, DNS cache 220 allows client device 104 and user agent 102 the ability to map the FQDN of the URL to the IP address without having to access the DNS server 120. By providing mapping data to the response monitor 218, the mapping data assists the request generator 212 in constructing the request.

Interface 222 is a software program or a hardware device that communicatively couples the client device 104 to the communication means (e.g., configured to receive the request data from the request monitor, translate the request data, and transmit the translated request data to the OS 110. Further, interface 222 is configured to receive information from the communication means connecting the client device 104 and the OS 110. In some embodiments, the interface 222 can include encryption means and/or decryption means to encrypt communication leaving from and decrypt communication coming into client device 104.

Optimization server (OS) 110 may include, among other things, an OS monitoring device 240, a generator 242, a comparator 244, a scheduler 246, and a plurality of interfaces 248 and 250.

OS monitoring device 240 is a software program or a hardware device that monitors the request data received through the interface 248 from the client device 104. In some embodiments, the request data may include additional appended data, such as the request object list identifying request object data, the freshness data of the request object data, and any cookie data associated with the request object data. In some embodiments, the request object list includes the object data, the freshness data and the cookie data. When the OS monitoring device 240 receives the request data, the OS monitoring device 240 can extract any appended data from the request data and transmit the original request data from the user agent through interface 250 to the content server 114. OS monitoring device 240 can provide the extracted appended data to comparator 244.

Generator 242 is a software program or a hardware device that receives the response data from content server 114. Generator 242 can analyze the response data and determine if the response data contains references to embedded response object data that user agent 102 would have to download. For example, a GIF image would not contain references to other content data for a rendering engine to download, while a markup language (e.g., WML, HTML, XHTML, etc.) can have references to other response object data that rendering engine 204 would have to download. Generator 242 could then have the ability to generate a response object list that identifies the response object data and the FQON of the response object data.

Comparator 244 is a software program or a hardware device that receives request object list from OS monitoring device 240 and response object list from generator 242 and compares them. An exemplary comparing method is further described below in FIG. 11. Based on the comparison, the comparator 244 can update the response object list. After the comparison, the comparator 244 can transmit optimized data, which can include, among other things, response data received from the content server, response object list providing response object data, any mapping data, any freshness data for a request object data that was marked as stale and verified by the content server to be fresh ("fresh" stale object data), and/or response data corresponding to a stale request object data.

Scheduler 246 is a software program or a hardware device that receives a response data and/or predicted response data from content server and schedules the response data back to the client device 104. For example, the scheduler 246 may give preferences to response data over predicted response data from the request generator 212. Another example may include the scheduler 246 giving preference to object data appearing earlier in the response data over object data appearing later in the response data.

Interfaces 248 and 250 are similar to interface 222 of the client device 104. Each interface has the ability to communicate with the elements of the optimization server, translate the communication so that the communication means can utilize the data, and transmit the translated communication across the corresponding communication means. Like interface 222, interfaces 248 and 250 may have encryption and decryption means.

Figure 5:
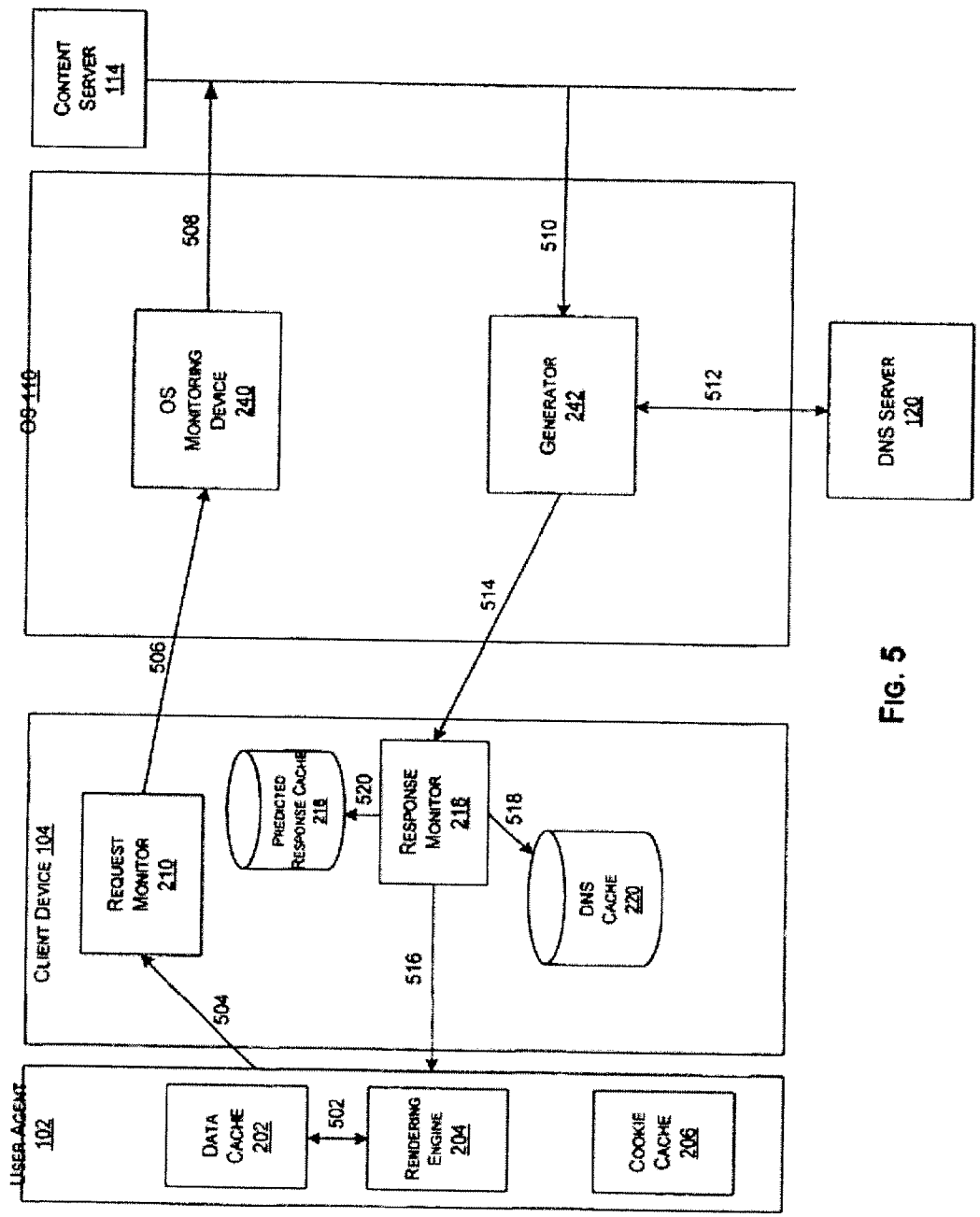
FIG. 5 is a functional diagram illustrating an exemplary communication flow in the exemplary system of FIG. 4.

FIG. 5 is a functional diagram illustrating an exemplary communication flow in the system of FIG. 4. It is assumed for the purposes of explaining this exemplary communication flow that when a web page is first requested by the rendering engine 204, the HTML content data of the web page does not reside in a data cache 202 of the user agent 102 although other components of the web page may reside in the data cache 202. In addition, while a single content server 114 has been displayed for simplicity purposes, any number of content servers could be provided. The user inputs a URL into a user agent 102. Rendering engine 204 queries (502) the data cache 202 for any content data relating to the URL and, under the assumed conditions, data cache 202 does not return any content data to rendering engine 204. In some embodiments, rendering engine 204 can also query cookie cache 206 for any cookie data associated with the URL.

After the query, the rendering engine 204 transmits (504) the request data (e.g., HTTP request of the URL) to the content server 114. The request monitor 210 at the client device 104 can receive or intercept the request data. Alternatively, in some embodiments, the user agent 102 can send the request data over a wireless link. The request monitor 210 forwards (506) the request data to the OS 110. The request data can be directed explicitly to a gateway or proxy and then to the OS 110, or it can be directed to the content server 114 and the request can be intercepted transparently by an inline proxy or gateway. The OS 110 analyzes the request data and determines whether the request is transmitted from either a user agent (e.g., user agent 102) or a client device (e.g., client device 104) that contains the client hardware/software understanding the prediction protocol. As in this case, the OS 110 determines that the client device 104 has the capabilities and forwards (508) the request data to the appropriate content server 114. Consequently, the content server 114 provides (510) response data (e.g., HTTP response of the requested URL) associated with the request data to the generator 242 of the OS 110.

After the generator 242 has received the response data, generator 242 analyzes the response data to determine if the response data includes references to embedded response object data (e.g., embedded URLs within the HTTP response) that the rendering engine 204 would have to download. For example, a GIF image might be compressible by the proxy, but it does not contain references to other content that a web browser would have to download, while a markup language can have references to other response object data that the web browser would have to download. The generator 242 can parse through the response data and create a response object list that identifies embedded response object data within the response data. For example, the response object list can include the URL response data and the embedded URL data. In some embodiments, the identification of the embedded response object data can be dependent upon the capabilities of the user agent 102 and/or client device 104.

When the response object data is a URL, generator 242 can analyze the URL to determine if the URL includes a fully qualified domain name (FQDN) different from an FQDN associated with the URL of the request data. The FQDN associated with the URL of the request data is copied by the OS 110 prior to transmitting the request data to content server 114. In this exemplary embodiment, the FQDN of the URL is different and, consequently, the generator 242 queries (512) the DNS server 120. The generator 242 transmits the different FQDN to the DNS server 120 and the DNS server 120 returns mapping data associated with the different FQDN to the generator 242. The mapping data (e.g., IP address) maps the different FQDN to the IP address associated with the different FQDN.

After the generator 242 has received the mapping data from the DNS server 120, generator 242 forwards (514) optimized data to the client device 104. In this exemplary embodiment, the optimized data can include, among other things, the response data, the response object list identifying the response object data, and the mapping data associated with the response object data. The response monitor 218 of the client device 104 receives the optimized data and separates the optimized data into the response data, the response object list, and the mapping data.

After the optimized data has been separated, the response monitor 218 can transmit (516) the response data to the rendering engine 204 of the user agent 102 so that a user can view the web page that was originally requested. Further, the response monitor 218 transmits (518) the mapping data to the DNS cache 220 wherein the DNS cache stores the mapping data for a configurable amount of time. When the user agent 102 requests the mapping data corresponding to an FQDN of the object data, the client device 104 can refer to the DNS cache without having to transmit the request through a gateway or proxy to the DNS server 120. In some embodiments, if the mapping data cannot be extracted and stored in the DNS cache 220, the DNS cache 220 can be communicatively coupled to the DNS server 120 so that the DNS cache can retrieve the particular mapping data from the DNS server 120.

Figure 7:
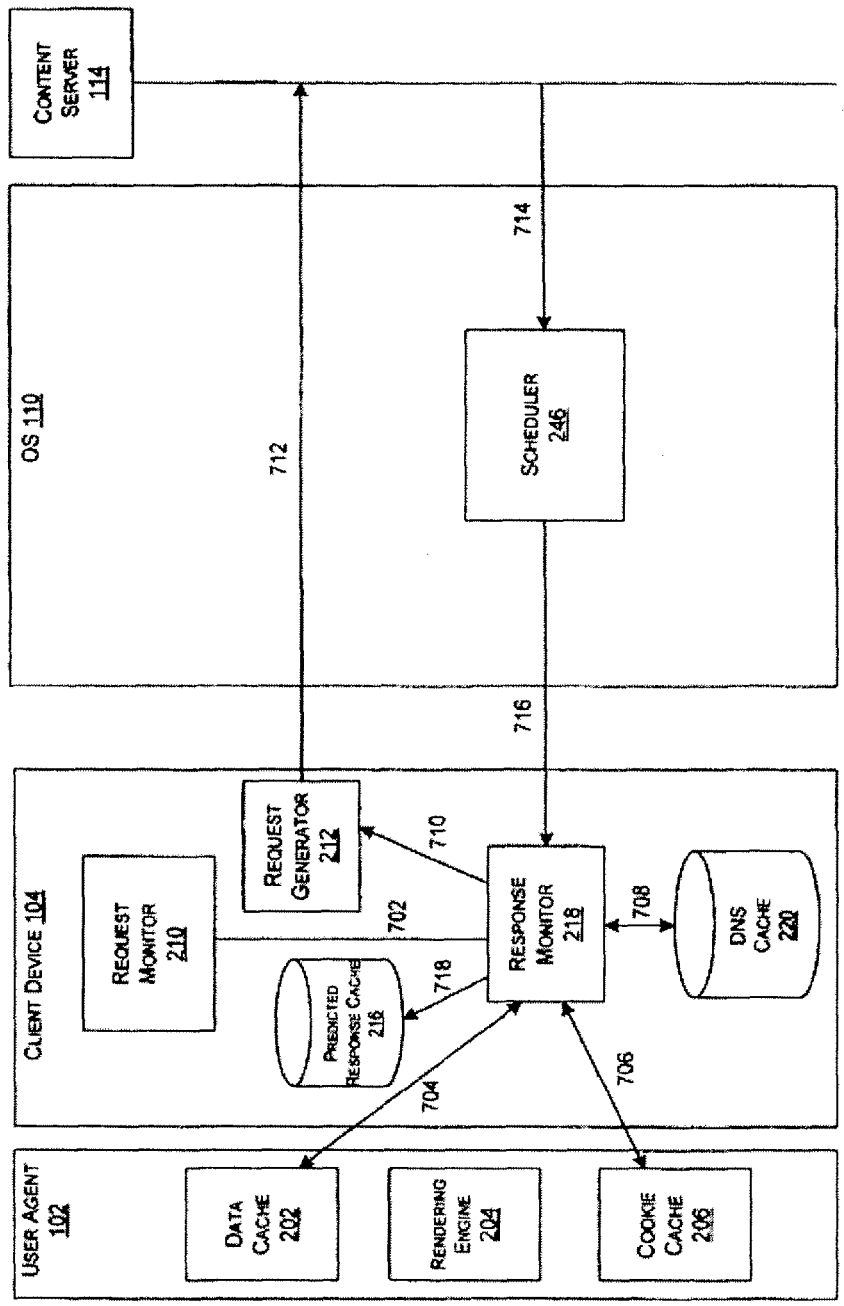
FIG. 7 is a functional diagram illustrating an exemplary method for processing object data in the response object list.

Additionally, the response monitor 218 can process the response object list by storing (520) a predicted response data and predicted request data identifying the predicted response data in the predicted response cache 216. Regarding the predicted response data, once a request monitor receives a subsequent request from a user agent, the request monitor can query the predicted response cache 216 for any predicted response data that corresponds to the subsequent request and forward the predicted response data to the user agent without having to query the content server with the subsequent request data. The processing of the response object list can be the exemplary processing method illustrated in FIG. 7 as now explained. The response monitor 218 can determine whether the response object data (e.g., embedded URLs of the requested URL, etc.) is currently being downloaded per a user agent request or due to another client object prediction by contacting (702) the request monitor. The request monitor 210 can determine which response object data is outstanding because all request data is transmitted through it. In some embodiments, request monitor 210 check the predicted response cache 216 to determine whether any predicted response data has been downloaded. If so, the response monitor 218 can skip this response object data and process the next response object data within the response object list.

If not, the response monitor 218 can communicate (704) with the data cache 202 of the user agent 102 to determine if the data cache 202 has a fresh entry of stored object data that corresponds to the response object data. If the object data is stored in the data cache 202 and the stored object data is fresh, the response monitor 218 can skip this response object data and process the next object data. The user agent 102 can then retrieve the stored object data from the data cache 202. If the stored object data corresponding to the response object data is stored in the data cache but is stale, response monitor 218 can retrieve freshness data from the freshness cache (not shown) about how stale the response object data is to be used later. If the stored object data corresponding to the response object data is not located at the data cache, the response monitor 218 can continue processing the response object data. Consequently, at this time, response monitor 218 has determined whether the response object data has been downloaded or if "fresh" stored object data corresponding to the response object data has been located in the data cache 202 of the user agent 102. If the response monitor has determined that the response object data has been downloaded or "fresh" object data has been stored at the data cache 202, the processing of the object data on the response object list can end.

Otherwise, if the response object data has not been downloaded, the object data stored in the data cache 202 is stale, or the object data corresponding to the response object data is not stored in the data cache, response monitor 218 can query (706) cookie cache 206 for any existing cookie data associated with the response object data. Further, the response monitor 218 can request (708) the DNS cache 220 for any existing mapping data associated with the particular response object data.

Response monitor 218 forwards (710) the response object data (e.g., embedded URLs within the response object list that have yet to be downloaded from content server) along with any existing cookie and mapping data associated with the response object data to request generator 212. Request generator 212 uses the response object data along with any existing cookie and mapping data associated with the response object data to mimic an HTTP request from the user agent. Further, the request generator 212 can generate a user agent string and other HTTP request headers to mimic, as closely as possible, what the user agent 102 expects to issue when it transmits request data to the content server 114. Furthermore, the HTTP request is flagged as predicted request data for OS 110.

Request generator 212 can forward (712) the predicted request data through OS 110 to content server 114. Content server 114 transmits (714) predicted response data (e.g., response data of the embedded URLs that were located in the response object list) to OS 110.

After the OS 110 receives the predicted response data from the content servers 114, scheduler 246 can determine the scheduling method to give preferences to some data over others. For example, the scheduler 246 may give preferences to response data associated with the request data from user agent 102 over predicted response data from request generator 212. Another example may include scheduler 246 giving preferences to response object data appearing earlier in the response data over response object data appearing later in the response data. The scheduler can forward (716) the predicted response data to response monitor 218. Response monitor 218 can transmit (718) the predicted response data (e.g., response data of the embedded URLs alone or in combination with cookie data and mapping data) to the predicted response cache 216, which stores the predicted response data for a configurable amount of time.

Consequently, for example, when the user agent 102 transmits subsequent request data, request monitor 210 can intercept the request data. Request monitor 210 can request the predicted response cache 216 for any predicted response data that corresponds to the request data. Request monitor's request can be based on a matching algorithm that can include the request object data (e.g., URLs), the cookie data associated with the request object data, the cache parameters, the user agent that is doing the requesting, etc. The predicted response cache can forward any matched data to request monitor 210. If the request data matches any predicted response data, request monitor 210 can forward the predicted response data to user agent 102 through request monitor 210. Otherwise, if the request data does not match any predicted response data, the request monitor 210 can forward the request data through OS 110 to content server 114 in a similar manner described above.

Figure 6:
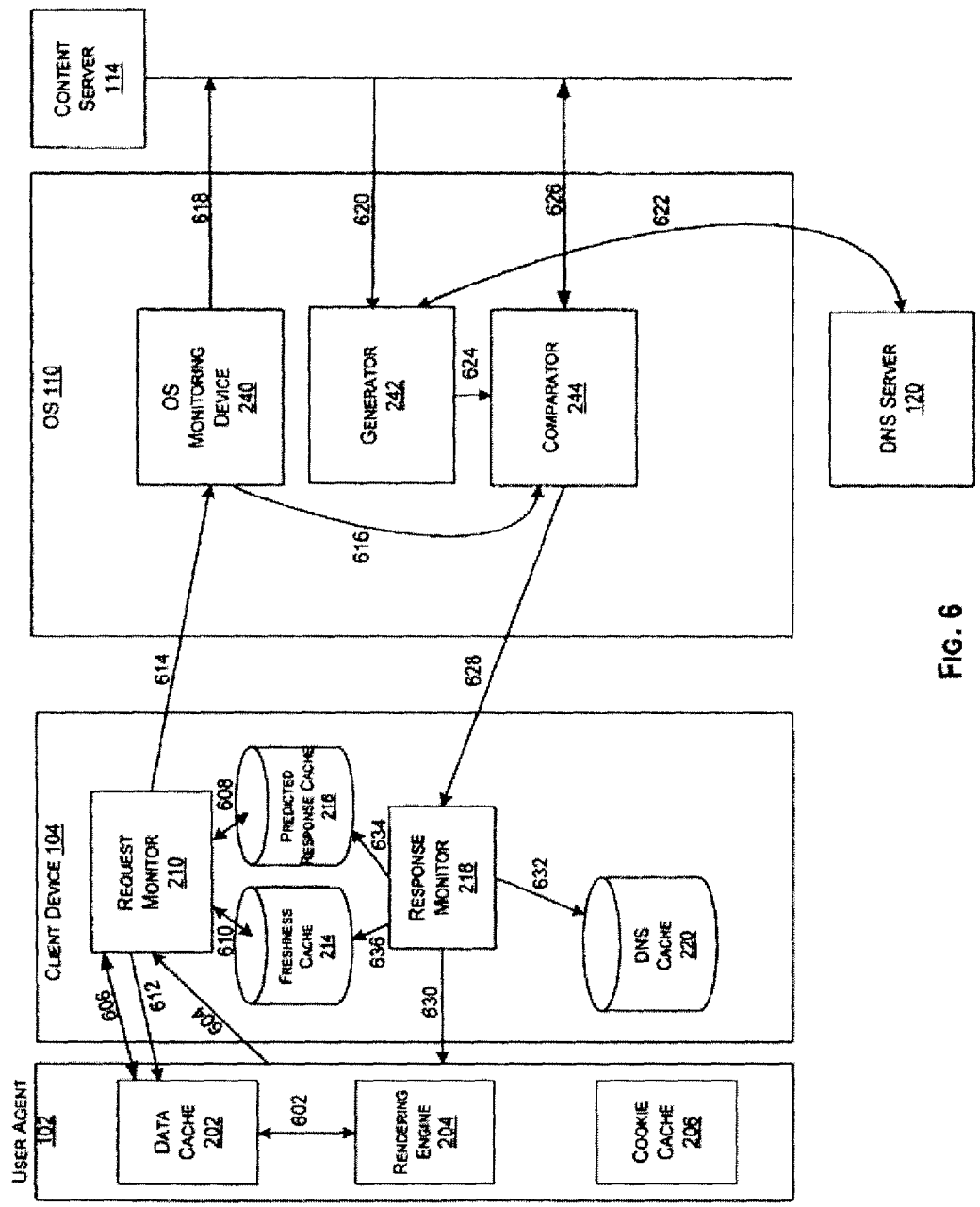
FIG. 6 is a functional diagram illustrating an exemplary communication flow in the exemplary system of FIG. 4.

FIG. 6 is a functional diagram illustrating an exemplary communication flow in the system of FIG. 4. It is assumed for the purposes of explaining this exemplary communication flow that when a web page is first requested by the rendering engine 204, some of the HTML content data of the web page resides in the data cache 202 of the user agent 102 and the stored HTML content data is stale. In addition, while a single content server 114 has been displayed for simplicity purposes, any number of content servers could be provided. A user inputs a URL into a user agent 102. The user agent passes this request to the rendering engine 204. Rendering engine 204 queries (602) the data cache 202 for any content data relating to the URL and the data cache 202 determines that at least some of the content data is stale. In some embodiments, rendering engine 204 can also query cookie cache 206 and append any retrieved data to the request. The user agent 102 transmits (604) the request data to the client device 104.

After the client device 104 has received the request data (e.g., HTTP request of the URL), the request monitor 210 queries (606) the data cache 202 of the user agent 102. In some embodiments, request monitor 210 does not query the data cache 202 because user agent 102 has provided the embedded request object data along with the request data. Based on the query, the request monitor generates a request object list that identifies embedded request object data within the request data. In some embodiments, request monitor 210 can further query data cache 202 and cookie cache 206 for any freshness data and cookie data associated with the request object data. The freshness and cookie data can be provided in the request object list. The identification of the request object data can be dependent on the client device 104 and the user agent 102. For example, while some user agents display all request object data of a web page, other user agents try to intelligently render the web page onto a small screen. This intelligent rendering may only download a subset of embedded request object data within the webpage. Consequently, the parsing performed may consider these intelligent rendering techniques for each client device and each user agent.

Request monitor 210 queries (608) the predicted response cache 216 to determine if the request object data that is to be downloaded matches any stored predicted request data that identifies the predicted response data. For example, the request monitor 210 can send to the predicted response cache 216, among other things, URL data, cookie data, cache parameter data, and user agent data. If any stored predicted request data matches this sent data, the predicted response cache 216 can transmit back to the request monitor 210 the predicted response data that has been identified by the matched stored predicted request data.

Additionally, the request monitor 2°10 can query (610) the freshness cache 214 for any freshness data concerning stale request object data to determine if any stale object data listed on the request object list is in fact "fresh" stale object data. For example, request monitor 210 has a URL listed as being stale and forwards at least the URL data to the freshness cache 214 and the freshness data provides to the request monitor 210 any updated freshness data for that particular URL. If the predicted response cache 216 or the freshness cache provides any predicted response data or updated freshness data, the request object list can be updated with this data and the response monitor 210 can forward (612) the predicted response data and/or updated freshness data to the data cache 202 of the user agent 102. The data cache 202 can be updated with the updated freshness data and/or the predicted response data.

If the request object list includes any request object data marked to be downloaded, the request monitor 210 can forward (614) the request data to the OS 110. The request data may include the request object list from the request monitor 210.

OS monitoring device 240 of the OS 110 receives the request data from the client device, analyzes the request data, and determines whether the request data has been transmitted from either a user agent (e.g., user agent 102) or a client device (e.g., client device 104) that contains the client hardware/software having the necessary capabilities. Furthermore, if the request object list has been appended to the request data, OS monitoring device 240 can extract the request object list from the response data and forward (616) the request object list to comparator 244. OS monitoring device 240 can forward (618) the request data (without the appended data) to the appropriate content server 114. Consequently, the content server 114 provides (620) response data associated with the request data to the generator 242 of the OS 110.

After generator 242 has received the response data, generator 242 analyzes the response data to determine if the response data includes references to embedded response object data that the rendering engine 204 would have to download. For example, a GIF image might be compressible by the proxy, but it does not contain references to other object data that a web browser would have to download, while a markup language can have references to other object data that the web browser would have to download. The generator 242 can parse through the response data and can create a response object list identifying the request object data and the FQDN of the request object data. In some embodiments, the identification of the embedded object data can be dependent upon the capabilities of the user agent 102 and/or client device 104.

When the response object data is a URL, generator 242 can analyze the URL to determine if the URL includes an FQDN different from the FQDN associated with the URL provided in the request object list. The FQDN associated with the URL of the request object list is copied by the OS 110 and provided to generator 242 prior to transmitting the request data to content server 114. In this exemplary embodiment, the FQDN is different and, consequently, the generator 242 queries (622) the DNS server 120. Generator 242 transmits the different FQDN to DNS server 120 and DNS server 120 returns the corresponding mapping data to generator 242. The mapping data maps the different FQDN to the IP address associated with the different FQDN.

After the generator 242 has received any existing mapping data, generator 242 can forward (624) the response data, the mapping data, and the response object list to the comparator 244. Comparator 244 compares each request object data on request object list with each response object data on the response object list. If the response object data matches the request object data and the matched request object data is fresh, the comparator 244 can delete the response object data from the response object list because the response object data is not to be downloaded.

Alternatively, in some embodiments, the response object data from the response object list can be marked as not being downloaded instead of being deleted from the response object list. If the response object data does not have a corresponding match in the request object list, comparator 244 can update the response object list to include information that this particular response object data is to downloaded. If the response object data matches the request object data and the matched request object data is stale, the comparator 244 can determine if the request object data is truly stale by requesting the content server to verify the freshness of the request object data. The response data from content server 114 has the ability to inform comparator 244 if the content is stale, by either responding with new object data or by informing the comparator 244 that the current version is fresh. Comparator 244 transmits the request for verification along with the current "timestamp" of the object data to content server 114 so that the content server 114 can compare the timestamp information. If the content server verifies that the request object data is stale, comparator 244 can update the response object list to include information that this particular response object data is to be downloaded. If the content server verifies that the alleged stale request object data is indeed fresh ("fresh" stale object data), comparator 244 can update the response object list to include that this particular response data object is not to be downloaded. Comparator 244 updates the response object list based on each request object data.

After the comparator has updated the response object list.comparator 244 can query (626) the content server by providing the response object data and receiving response data of the response object data that is to be downloaded to user agent 102. The comparator 244 forwards (628) optimized data to the client device 104. In this exemplary embodiment, the optimized data can include, among other things, the response data from content server 114, the response object list, the mapping data, the response data associated with the response object data to be downloaded to user agent, and the freshness data of the "fresh" stale content data. In some embodiments, comparator can transmit each group separately.

The response monitor 218 of the client device 104 receives the optimized data, separates the optimized data, and processes the separated data accordingly. The optimized data is separated into the response data, the response object list, the mapping data, the response data associated with the response object data to be downloaded to user agent, and the freshness data of the "fresh" stale content data.

After the optimized data has been separated, the response monitor transmits (630) the response data to the user agent 102, which can store the response data and/or upload the response data into rendering engine 204. Further, the response monitor 218 transmits (632) the mapping data to DNS cache 220, which stores the mapping data for a configurable amount of time. When user agent 102 requests an FQDN, client device 104 or the user agent itself can refer to the DNS cache without having to transmit the request through a gateway or proxy to the DNS server 120. In some embodiments, if the mapping data cannot be extracted and stored in the DNS cache 220, the DNS cache 220 can be communicatively coupled to the DNS server 120 so that the DNS cache can retrieve the particular mapping data from the DNS server 120. Furthermore, the response monitor 218 forwards (634) the response data corresponding to the request object data to predicted response cache 216 so that this response data can be stored for a configurable amount of time. When the user agent determines that additional embedded data corresponding to the URL response is needed from content server to complete the web page at user agent, user agent can transmit a subsequent request requesting response data corresponding to the request object data. Because the client device has this response data corresponding to the request object data (predicted response data), the client device can provide the predicted response data to the user agent without having to access the content server for this subsequent request. Also, the response monitor 218 processes the freshness data of the "fresh" stale object data by forwarding (636) the freshness data to freshness cache 214. Alternatively, in some embodiments, the freshness data can be forwarded to data cache 202 of the user agent 102 to instruct the data cache 202 that the stale object data of the content data is indeed fresh.

Additionally, the response monitor 218 can process the response object list. Regarding the predicted response data, once a client device receives a subsequent request from a user agent, the client device can query the predicted response cache 216 for any predicted response data that corresponds to the subsequent request and forwards the predicted response data to the user agent without having to query the content server with the subsequent request data. The processing of the response object list can be the processing method illustrated in FIG. 7. The response monitor 218 can determine whether the response object data (e.g., URL, etc.) is currently being downloaded per a user agent request or due to another client object prediction by contacting (702) the request monitor. The request monitor 210 can determine which response object data is outstanding because all request data is transmitted through it. In some embodiments, request monitor 210 checks the predicted response cache 216 to determine whether any predicted response data has been downloaded. If so, the response monitor 218 can skip this response object data and process the next response object data within the response object list.

If not, the response monitor 218 can communicate (704) with the data cache 202 of the user agent 102 to determine if the data cache 202 has a fresh entry of stored object data that corresponds to the response object data. If the object data is stored in the data cache 202 and the stored object data is fresh, the response monitor 218 can skip this response object data and process the next object data. The user agent 102 can then retrieve the stored object data from the data cache 202. If the stored object data corresponding to the response object data is stored in the data cache but is stale, response monitor 218 can retrieve freshness data from the freshness cache about how stale the response object data is to be used later. If the stored object data corresponding to the response object data is not located at the data cache, the response monitor 218 can continue processing the response object data. Consequently, at this time, response monitor 218 has determined whether the response object data has been downloaded or if "fresh" stored object data corresponding to the response object data has been located in the data cache 202 of the user agent 102. If the response monitor has determined that the response object data has been downloaded or "fresh" object data has been stored at the data cache 202, the processing of the object data on the response object list can end.

Otherwise, if the response object data has not been downloaded, the object data stored in the data cache 202 is stale, or the object data corresponding to the response object data is not stored in the data cache, response monitor 218 can query (706) cookie cache 206 for any existing cookie data associated with the response object data. Further, the response monitor 218 can request (708) the DNS cache 220 for any existing mapping data associated with the particular response object data.

Response monitor 218 forwards (710) the response object data along with any existing cookie and mapping data associated with the response object data as well as freshness data to request generator 212. Request generator 212 uses the response object data along with any existing cookie and mapping data associated with the response object data to mimic an HTTP request from the user agent. Further, the request generator 212 can generate a user agent string and other HTTP request headers to mimic as closely as possible what the user agent 102 expects to issue when it transmits request data to the content server 114. Furthermore, the HTTP request is flagged as predicted request data for OS 110.

Request generator 212 can forward (712) the predicted request data through OS 110 to content server 114. Content server 114 transmits (714) predicted response data (e.g., response data of the embedded URLs that were located in the response object list) to OS 110.

After the OS 110 received the predicted response data from the content servers 114, scheduler 246 can determine the scheduling method to give preferences to some data over others. For example, the scheduler 246 may give preferences to response data associated with the request data from user agent 102 over predicted response data from request generator 212. Another example may include scheduler 246 giving preferences to response object data appearing earlier in the response data over response object data appearing later in the response data. The scheduler can forward (716) the predicted response data to response monitor 218. Response monitor 218 can transmit (718) the predicted response data (e.g., response data of the embedded URLs alone or in combination with cookie data and mapping data) to the predicted response cache 216, which stores the predicted response data for a configurable amount of time.

Consequently, for example, when the user agent 102 transmits subsequent request data, request monitor 210 can intercept the request data. Request monitor 210 can request the predicted response cache 216 for any predicted response data that corresponds to the request data. Request monitor's request can be based on a matching algorithm that can include the request object data (e.g. URLs), the cookie data associated with the request object data, the cache parameters, the user agent that is doing the requesting, etc. The predicted response cache can forward any matched data to request monitor 210. If the request data matches any predicted response data, request monitor 210 can forward the predicted response data to user agent 102 through request monitor 210. Otherwise, if the request data does not match any predicted response data, the request monitor 210 can forward the request data through OS 110 to content server 114 in a similar manner described above.

Figure 8:
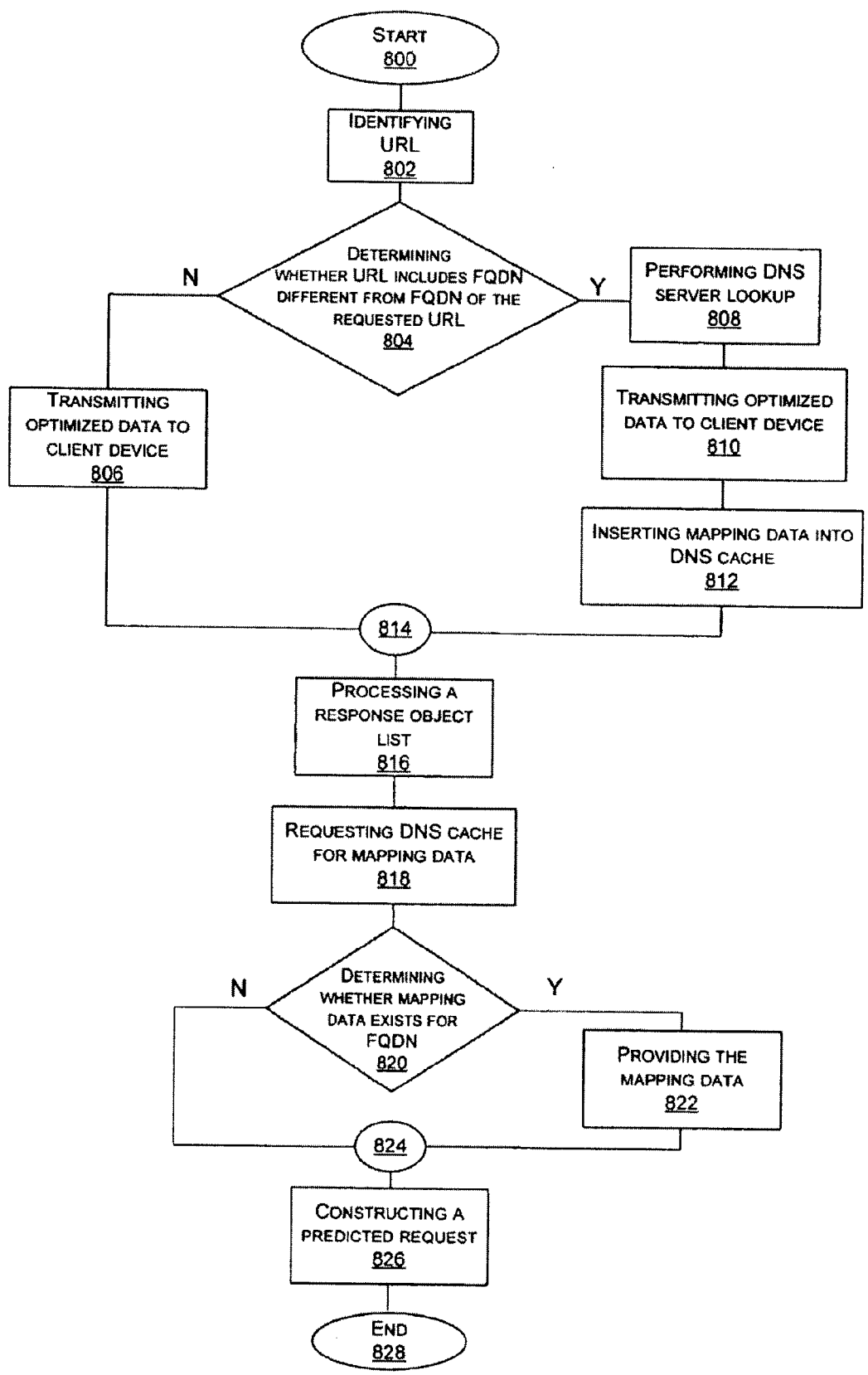
FIG. 8 is a flowchart representing an exemplary method for DNS optimization.

FIG. 8 is a flowchart representing an exemplary method for DNS optimization. It will be readily appreciated by one of ordinary skill in the art that the illustrated procedure can be altered to delete steps or further include additional steps. After initial start step 800. An OS can identify (802) URLs associated with response data from a content server and store these URLs in a response object list.

Once the OS has identified the URLs, the OS can determine (804) whether each URL includes an FQDN different from an FQDN associated with the URL of a request data.

If the OS determines that the FQDN is the same, the OS transmits (806) optimized data to the client device and the method can proceed to connector 814. On the other hand, if the OS determines that at least one response URL has an FQDN different from the FQDN of the requested URL, OS performs (808) a DNS lookup from a DNS server. OS provides the FQDN data to the DNS server and the DNS server provides an IP address associated with the provided FQDN to the OS based on the FQDN data thereby creating mapping data that maps the FQDN to the IP address. In some embodiments, performing step 808 is controlled by the capabilities of a client device or the user agent. For example, the capabilities of the client device can be explicitly relayed to the OS via communication from the client device or implicitly relayed to the OS via a user agent string.

After the OS has performed the DNS lookup, the OS transmits (810) optimized data, which includes the mapping data, to the client device. In some embodiments, the mapping data can be transmitted separately from the optimized data. Once the client device receives the optimized data, the client device can extract the mapping data and insert (812) the mapping data into a DNS cache and the method can proceed to connector 814. The DNS cache can be located in the user agent or the client device.

The method proceeds from connector 814 to the client device processing (816) the response object list, which includes one or more URLs. When processing a URL on the response object list, the client device can request (818) the DNS cache for any mapping data associated with an FQDN of the particular URL. As a result, the DNS cache determines (820) whether the mapping data (e.g., IP address) exists for the FQDN of the particular URL. If the mapping data does not exist, the method proceeds to connector 824. If the mapping data exists, the DNS cache provides (822) mapping data to either the user agent or the client device and the method proceeds to connector 824.

The method proceeds from connector 824 to the client device constructing (826) a predicted request data where the construction includes, among other things, URLs and any existing mapping data, which correspond to the URLs, provided by the DNS cache. In some embodiments, the construction can also include cookie data associated with the URLs from a cookie cache of the user agent. After the constructing step 826, the method can end (828).

Figure 9A:
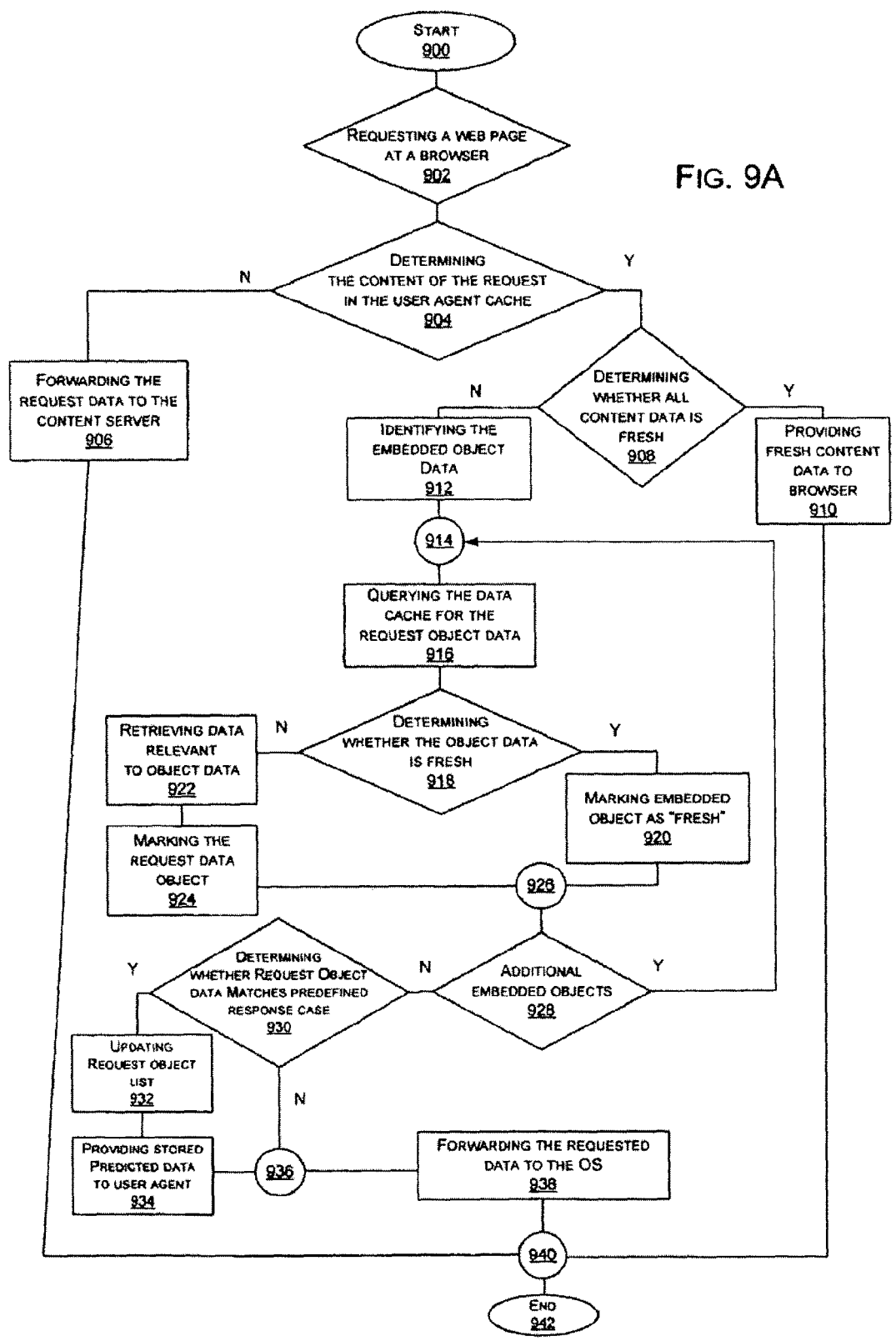
FIGS. 9A and 9B are flowcharts representing exemplary methods for providing object prediction at a user agent and a client device.
Figure 9B:
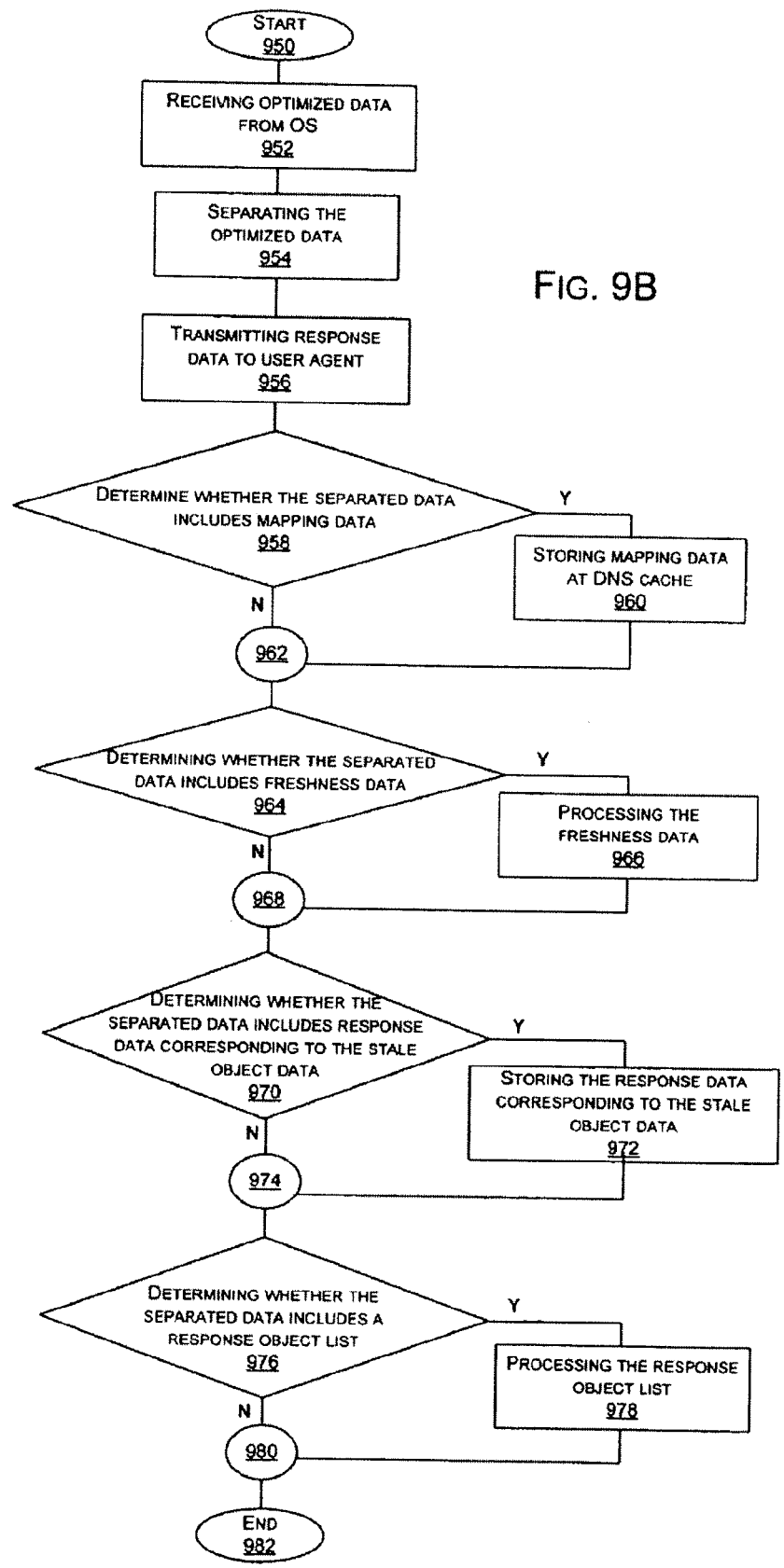

FIGS. 9A and 9B are flowcharts representing exemplary methods for providing object prediction at a user agent and a client device. Referring to FIG. 9A, it will be readily appreciated by one of ordinary skill in the art that the illustrated procedure can be altered to delete steps or further include additional steps. While the exemplary method provided in FIG. 9A is tailored more towards a client device, it is readily appreciable that the exemplary method can be performed in part or exclusively by a user agent. After initial start step 900, a user requests (902) a web page from a user agent.

After the web page has been requested, the user agent determines (904) whether the content data of the request is stored in a data cache located at the user agent. For example, the content data can be markup language content data of a requested web page wherein the markup language can be HyperText Markup Language (HTML), Extensible HTML (XHTML), Wireless Markup Language (WML), etc. If the content data is not stored, the user agent can forward (906) the request data (e.g., HTTP request of the URL), which includes the requested content data, to the content server and then proceed to connector 940. In some embodiments, the client device intercepts the request data and then forwards the request data to the content servers. On the other hand, if the content data is stored, the user agent determines (908) whether all content data is fresh or stale. If the content data is fresh, the user agent provides (910) the fresh content data to the rendering engine and the method proceeds to connector 940. If some of the content data is stale, the client device can identify (912) embedded request object data (e.g., embedded URLs within the HTTP request of URL) associated with the content data and place all identified object data on a request object list. For example, the object data can include one or more URLs.

After the identification, the client device can query (916) the data cache by providing the request object data and receiving any freshness data of the object data stored at the data cache of the user agent. The user agent can determine (918) whether the stored object data is fresh. If the stored object data is fresh, the corresponding request object data on the request object list is marked (920) as being fresh and the method proceeds to connector 926. On the other hand, if the stored object data is stale or not present at the data cache, the client device retrieves (922) any relevant data related to this object data. For example, the relevant data may include any cookie data or any freshness data associated with the object data only if the content data is in the data cache and is stale. After the retrieval of any relevant data, the corresponding request object data on the request object list is marked (924) accordingly. The request object data is marked stale if the corresponding stored object data is found to be stale or is marked to be downloaded if the stored object does not exist. After the marking, the method can proceed to connector 926.

The client device can then determine (928) whether there is any additional embedded request object data. If so, the method proceeds to connector 914. Otherwise, the method proceeds to determine (930) whether the request object data that is marked as being stale or to be downloaded on the request object list matches stored predicted request data in a predicted response cache. For example, the match can occur when the request object data, the cookie data of the request object data, the data cache parameters, and the user agent are similar or the same between the request object data and the stored predicted request data. If not, the method proceeds to connector 936. Otherwise, if a match occurs, the client device updates (932) the request object list by marking this request object data to not be downloaded. Further, the client device provides (934) to the user agent the predicted response data that has been identified by the matched stored predicted request data. In some embodiments, the stored predicted response data can include freshness and mapping data. The user agent can store this stored predicted response data in the data cache or provide it to the web browser. The method then proceeds to connector 936.

Client device can then forward (938) the request data, which can include the request object list, to the OS. The method can proceed to connector 940 and then end (942).

Referring to FIG. 9B, it will be readily appreciated by one of ordinary skill in the art that the illustrated procedure can be altered to delete steps or further include additional steps. While the exemplary method provided in FIG. 9B is tailored towards a Client device, it is readily appreciable that the exemplary method can be performed in part or exclusively by a user agent. After initial start step 950, the client device receives (952) optimized data from an OS. The optimized data can include, among other things, response data associated with a request data, response object list identifying request object data, any mapping data, any freshness data of a "fresh" stale object data, and response data corresponding to a stale request object data.

After the client device has received the optimized data, the client device can separate (954) the optimized data based on the type of data included within. For example, the optimized data can be separated based on whether the data is response data provided by the content server, a response object list, any mapping data, any freshness data of the "fresh" stale object data, and response data corresponding to the stale request object data.

The client device can transmit (956) to the user agent the response data that has been provided by the content server. Further, the client device can determine (958) whether the separated optimized data includes any mapping data. If not, the method proceeds to connector 962. Otherwise, if the separated optimized data includes mapping data, the client device stores (960) the mapping data at a DNS cache within a client device for future referencing. If the user agent requests a DNS query, a client device could look up the mapping data in the DNS cache without having to query a remote DNS server. In some embodiments, determining step 958, storing step 960, and connector 962 can be moved to any point on the flowchart as long as they are after separating step 954.

Furthermore, the client device can determine (964) whether the separated optimized data includes any freshness data. If not, the method proceeds to connector 968. Otherwise, if the separated optimized data includes freshness data, the client device processes (966) the freshness data of a "fresh" stale object data by storing this freshness data in a freshness cache for future referencing. For example, if a user agent requests object data that it has determined to be stale, the client device can perform a freshness lookup at the freshness cache and, if any freshness data corresponds to the stale request object data, the client device can inform the user agent that the stale object data is indeed fresh. In some embodiments, instead of the client device having a freshness cache, the client device can notify the user agent that the request object data is indeed fresh and the user agent can update its data cache to show that the stored object data is fresh. In some embodiments, determining step 964, processing step 966, and connector 968 can be moved to any point on the flowchart as long as they are after separating step 954.

Additionally, the client device can determine (970) whether the separated optimized data includes any response data that was downloaded because the object data was determined to be stale ("stale" response data). If not, the method proceeds to connector 974. Otherwise, if the separated optimized data includes any "stale" response data, the client device stores (972) the "stale" response data in a predicted response cache for future referencing. This "stale" response data For example, if a user agent requests object data that it has determined to be stale, the client device can perform a request data lookup at the predicted response cache by providing requested object data and, if any stored predicted request data matches the provided request object data, the predicted response cache provides predicted response data (stored "stale" response data), which cross references to the stored predicted request data, to the user agent. The user agent can display this "stale" response data at the web browser or store this "stale" response data in its data cache. In some embodiments, determining step 970, storing step 972, and connector 974 can be moved to any point on the flowchart as long as they are after separating step 954.

Also, the client device can determine (976) whether the separated optimized data includes a response object list. If not, the method can proceed to connector 980 and the method can end (982). Otherwise, if the separated optimized data includes a response object list, the client device can process (978) the response object list, such as the exemplary processing method shown below in FIG. 12. In some embodiments, determining step 976, processing step 978, and connector 980 can be moved to any point on the flowchart as long as they are after separating step 954. The method can then proceed to end (982).

For example, FIG. 12 provides an exemplary method for processing the response object list. It will be readily appreciated by one of ordinary skill in the art that the illustrated procedure can be altered to delete steps or further include additional steps. While the exemplary method provided in FIG. 12 is tailored towards a client device, it is readily appreciable that the exemplary method can be performed in part or exclusively by a user agent. After initial start step 1200, the client device determines (1204) whether the current response object data from response object list is currently being downloaded by a user agent request or another client prediction. For example, the response object list may include object data, such as URLs, and data relating to the object data such as freshness data and whether the object data needs to be downloaded. If the current response object data has been downloaded, the method proceeds to connector 1214. Otherwise, the client determines (1206) whether the response object data is located in a user agent and is marked in the user agent as being fresh. If so, the method proceeds to connector 1214.

Otherwise, if the response object data is neither located in the user agent nor is marked in the user agent as being fresh, client device queries (1208) a cookie cache for any cookie data associated with the response object data. Further, the client device queries (1210) the DNS cache for any mapping data associated with the response object data. Consequently, the client device can store (1212) any cookie or mapping data associated with the response object data.

After the client device has stored the cookie or mapping data, the client device determines (1216) whether there is any additional response object data to be processed. If so, the method proceeds to connector 1202. Otherwise, if there is no additional response object data to be processed for the response object list, the client device can construct (1218) the predicted request data that includes response object data and any cookie and mapping data related to the response object data. To try to predict a future request by a user agent, the client device tries to mimic the request as much as possible by using cookie data and mapping data. Further, the construction of the request may include mimicking a user agent string and other request header data, and/or flagging the request data as being a predicted request and not an actual request. Once the predicted request data has been constructed, the client device transmits (1220) the predicted request data to a content server.

After the client device has transmitted the predicted response data, the content server forwards the response data that is associated with the predicted request data (predicted response data), and the client device receives (1222) the predicted response data. Once the predicted response data has been received, the client device stores (1224) the predicted response data in a predicted response cache at the client device for a configurable amount of time. If the user agent requests data that is the same or is similar to the object data within the predicted response cache, the client device can return the predicted response data to the user agent, in some cases, without having to access the content servers thereby reducing bandwidth and latency. After the predicted response data has been stored, the method can end (1226).

Figure 10:
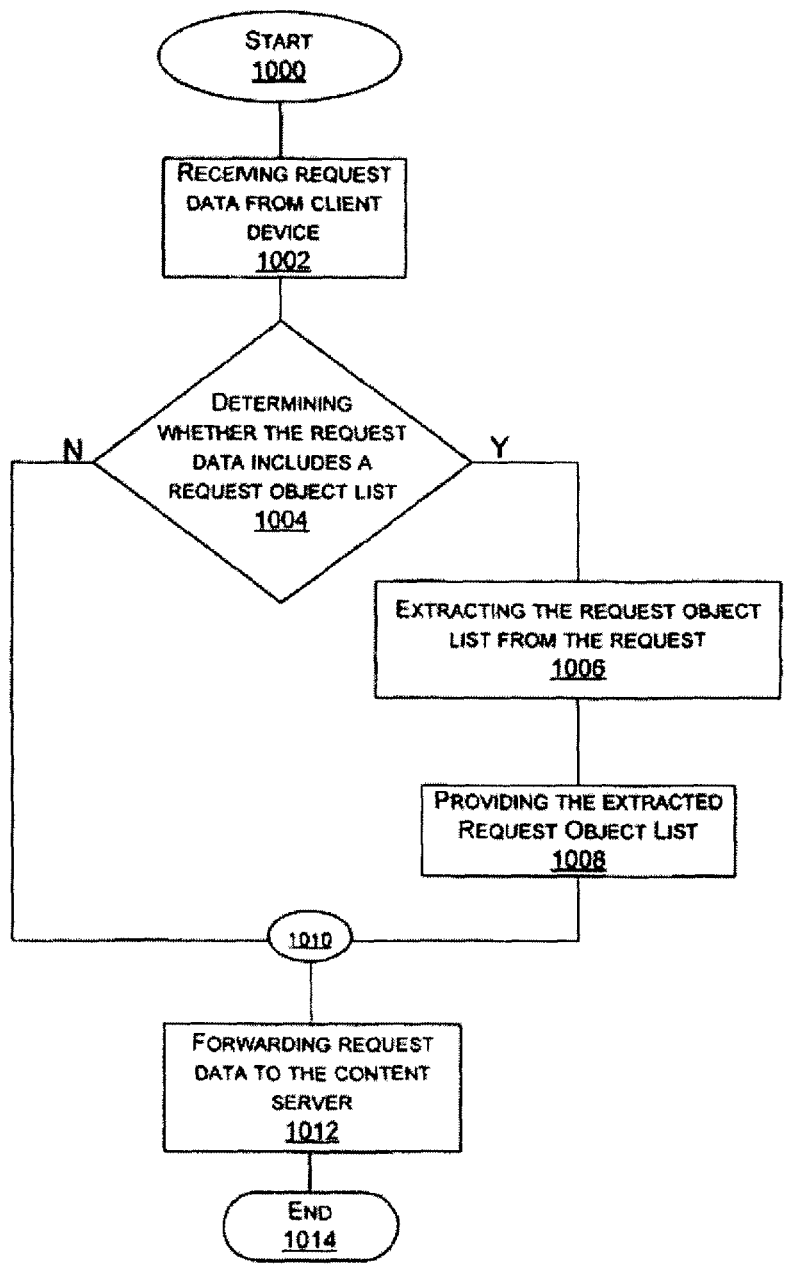
FIGS. 10 & 11 are flowcharts representing exemplary methods for providing object prediction at an optimization server.
Figure 11:
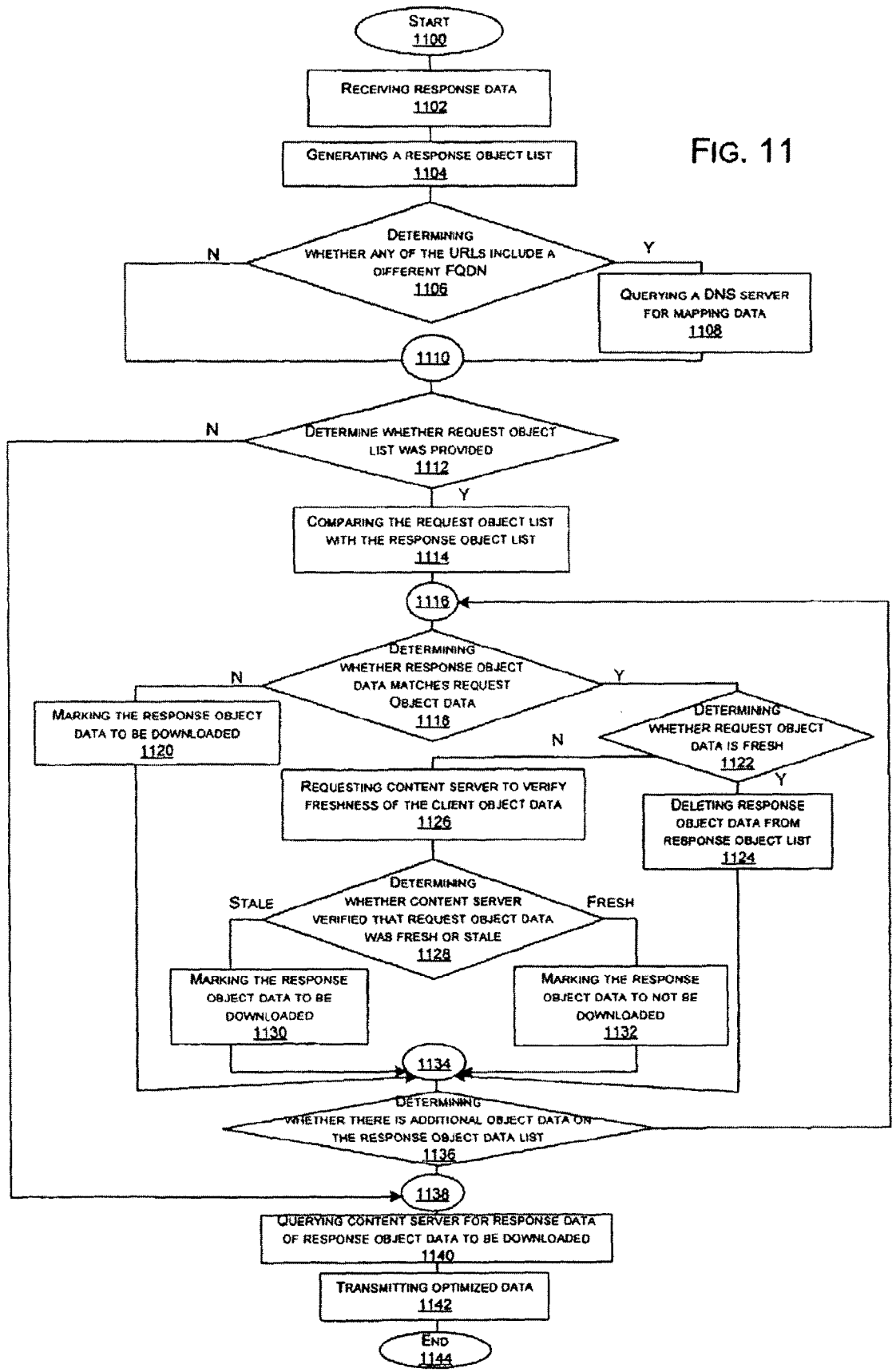

FIGS. 10 and 11 are flowcharts representing exemplary methods for providing object prediction at an OS. Referring to FIG. 10, it will be readily appreciated by one of ordinary skill in the art that the illustrated procedure can be altered to delete steps or further include additional steps. After initial start step 1000, the OS receives (1002) request data from the client device. In some embodiments, the request data may come from the user agent.

After the OS receives the request data, the OS can determine (1004) whether the request data includes a request object list. For example, the request object list may include request object data, such as URLs, and data relating to the request object data such as freshness data, FQDN of the request object data, and whether the request object data is to be downloaded. If the request data does not include the request object list, the method can proceed to connector 1010. Otherwise, if the request data does include the request object list, the OS can extract (1006) the request object list from the request data and provide (1008) the request object list to other hardware devices or software programs within the OS. For example, the provided request object list can correspond to the request object list determined to be provided in step 1112 in FIG. 11. The method can then proceed to connector 1010.

The OS can then forward (1012) the request data, without the request object list, to one or more contents servers. After the forwarding step 1012, the method can end (1014).

Referring to FIG. 11, it will be readily appreciated by one of ordinary skill in the art that the illustrated procedure can be altered to delete steps or further include additional steps. After initial start step 1100, an OS can receive (1102) response data from one or more content servers. For example, the response data can be the response data associated to the request data sent to the content server in step 1012 of FIG. 10.

After receiving the response data from the one or more content servers, the OS can generate (1104) a response object list based on the response data. The OS generates the response object list by analyzing the response data and parsing through the response data to identify the embedded response object data within the response data. For example, the response object data can include one or more URLS and the response data can be markup language content data of a requested web page wherein the markup language can be HyperText Markup Language (HTML), Extensible HTML (XHTML), Wireless Markup Language (WML), etc. For example, the response object list may include response object data, such as URLs, and data relating to the response object data such as freshness data, FQDN of the object data, and whether the response object data is to be downloaded.

After the generation, the OS can determine (1106) whether the response object data includes an FQDN different from an FQDN of the request object data provided. If the FQDN of the response object data is the same or similar to the FQDN of the request object data, the method can proceed to connector 1110. On the other hand, if the FQDN of the response object data is different from the FQDN of the request object data, the OS can query (1108) a DNS server by providing the FQDN and the DNS server can provide mapping data (e.g., an IP address) thereby providing the OS with mapping data that maps the FQDN to the IP address. The method can then proceed to connector 1110.

OS can determine (1112) whether the extracted request object list was provided. For example, the request object list may include request object data, such as URLs, and data relating to the request object data such as freshness data, FQDN of the request object data, and whether the object data is to be downloaded. If the extracted request object list was not provided, the method can proceed to connector 1138. Otherwise, if the extracted request object list was provided, the OS can compare (1114) the request object data within the request object list with the response object data within the response object list.

After the comparison, the OS determines (1118) whether a particular response object data matches any request object data. If there is not a match, the OS can mark (1120) the response object list that the particular response object data is to be downloaded and the method can proceed to connector 1134. On the other hand, if there is a match, the OS can determine (1122) whether the request object data that matches the response object data is fresh or stale. If the request object data is fresh, the OS can delete (1124) the matching response object data from the response object list and the method can proceed to connector 1134. Alternatively, in some embodiments, the OS can mark the response object list that the particular server object is not to be downloaded. If the request object data is stale, the OS can request (1126) the content server to verify the freshness of the request object data.

The OS can then determine (1128) whether the content server verified that the request object data was either fresh or stale. If the content server verified that the request object data was stale, the OS can mark (1130) the response object list that the particular response object data is to be downloaded and the method can proceed to connector 1134. Otherwise, if the content server verified that the request object data was fresh, the OS can mark (1132) the response object list that the particular response object data is not to be downloaded and the method can proceed to connector 1134.

Once the method has proceeded to connector 1134, the OS can determine (1136) whether there is any additional response object data that should be compared with any request object data. If so, the method proceeds to connector 1116.

Otherwise, the method proceeds to connector 1138 and the OS can query (1140) the content server for any response data associated with the request object data that is to be downloaded to user agent. The OS provides the request object data that is to be downloaded to the user agent, if any exists, and the content server provides the corresponding response data. For example, this response data can be stored at the client device as predicted response data. After the querying, the OS can transmit (1142) optimized data to a client device or a user agent. The optimized data can include, among other things, the response data received from the content server and/or the response object list. In some embodiments, the optimized data can include any mapping data, any freshness data for the "fresh" stale object data, and/or response data corresponding to the request object data that is to be downloaded to the user agent. After transmitting the optimized data, the method can end (1144).

The methods disclosed herein may be implemented as a computer program product, i.e., a computer program tangibly embodied in an information carrier, e.g., in a machine readable storage device or in a propagated signal, for execution by, or to control the operation of, data processing apparatus, e.g., a programmable processor, a computer, or multiple computers. A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

Figure 13A:
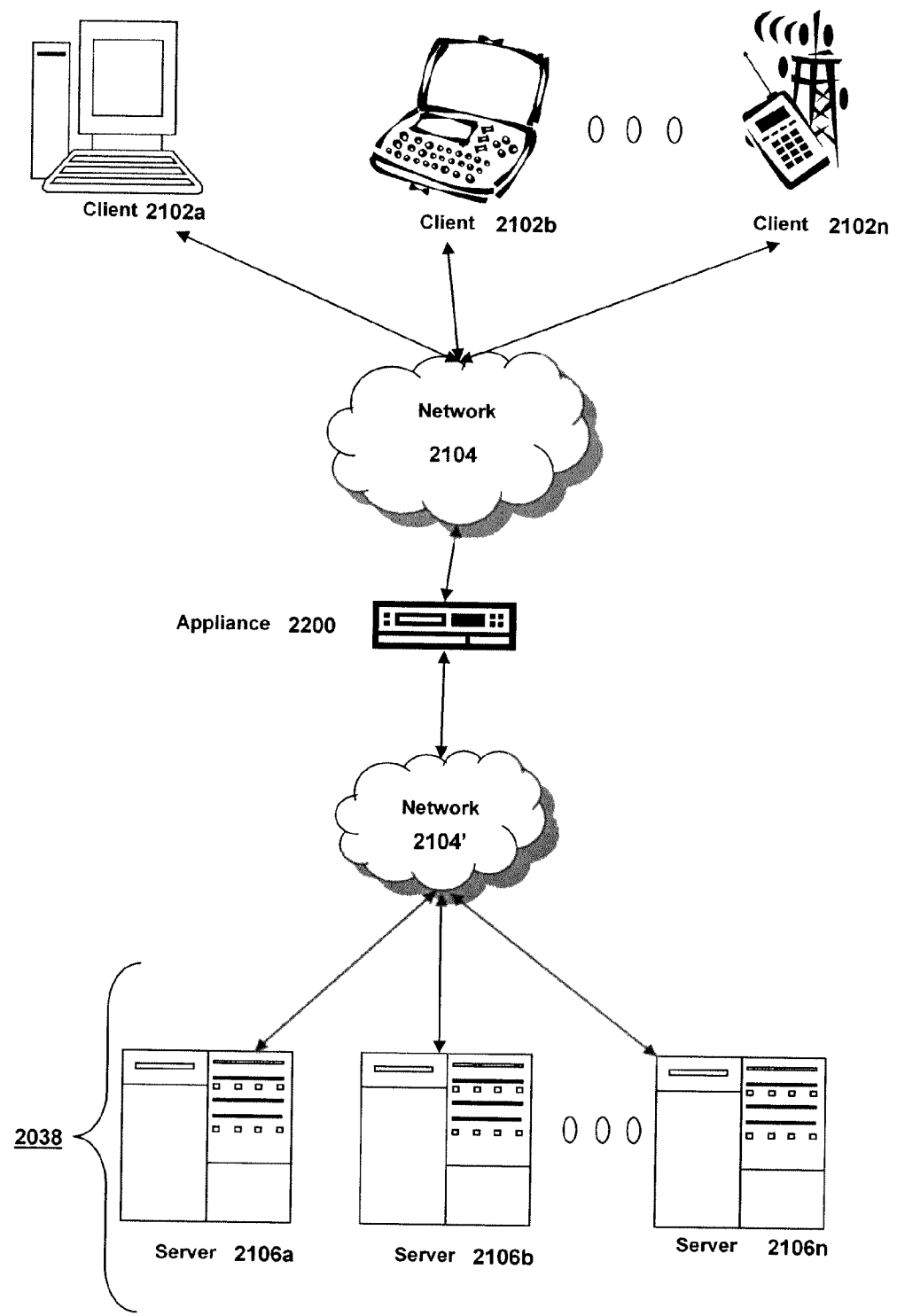
FIG. 13A is a block diagram of an embodiment of a network environment for a client to access a server via an appliance.

Prior to discussing the specifics of embodiments of the systems and methods of an appliance and/or client, it may be helpful to discuss the network and computing environments in which such embodiments may be deployed. Referring now to FIG. 13A, an embodiment of a network environment is depicted. In brief overview, the network environment comprises one or more clients 2102a-2102n (also generally referred to as local machine(s) 2102, or client(s) 2102) in communication with one or more servers 2106a-2106n (also generally referred to as server(s) 2106, or remote machine(s) 2106) via one or more networks 2104, 2104' (generally referred to as network 2104). In some embodiments, a client 2102 communicates with a server 2106 via an appliance 2200.

Although FIG. 13A shows a network 2104 and a network 2104' between the clients 2102 and the servers 2106, the clients 2102 and the servers 2106 may be on the same network 2104. The networks 2104 and 2104' can be the same type of network or different types of networks. The network 2104 and/or the network 2104' can be a local-area network (LAN), such as a company Intranet, a metropolitan area network (MAN), or a wide area network (WAN), such as the Internet or the World Wide Web. In one embodiment, network 2104' may be a private network and network 2104 may be a public network. In some embodiments, network 2104 may be a private network and network 2104' a public network. In another embodiment, networks 2104 and 2104' may both be private networks. In some embodiments, clients 2102 may be located at a branch office of a corporate enterprise communicating via a WAN connection over the network 2104 to the servers 2106 located at a corporate data center.

The network 2104 and/or 2104' be any type and/or form of network and may include any of the following: a point to point network, a broadcast network, a wide area network, a local area network, a telecommunications network, a data communication network, a computer network, an ATM (Asynchronous Transfer Mode) network, a SONET (Synchronous Optical Network) network, a SDH (Synchronous Digital Hierarchy) network, a wireless network and a wireline network. In some embodiments, the network 2104 may comprise a wireless link, such as an infrared channel or satellite band. The topology of the network 2104 and/or 2104' may be a bus, star, or ring network topology. The network 2104 and/or 2104' and network topology may be of any such network or network topology as known to those ordinarily skilled in the art capable of supporting the operations described herein.

As shown in FIG. 13A, the appliance 2200, which also may be referred to as an interface unit 2200 or gateway 2200, is shown between the networks 2104 and 2104'. In some embodiments, the appliance 2200 may be located on network 2104. For example, a branch office of a corporate enterprise may deploy an appliance 2200 at the branch office. In other embodiments, the appliance 2200 may be located on network 2104'. For example, an appliance 2200 may be located at a corporate data center. In yet another embodiment, a plurality of appliances 2200 may be deployed on network 2104. In some embodiments, a plurality of appliances 2200 may be deployed on network 2104'. In one embodiment, a first appliance 2200 communicates with a second appliance 2200'. In other embodiments, the appliance 2200 could be a part of any client 2102 or server 2106 on the same or different network 2104, 2104' as the client 2102. One or more appliances 2200 may be located at any point in the network or network communications path between a client 2102 and a server 2106.

In one embodiment, the system may include multiple, logically-grouped servers 2106. In these embodiments, the logical group of servers may be referred to as a server farm 2038. In some of these embodiments, the serves 2106 may be geographically dispersed. In some cases, a farm 2038 may be administered as a single entity. In other embodiments, the server farm 2038 comprises a plurality of server farms 2038. In one embodiment, the server farm executes one or more applications on behalf of one or more clients 2102.

The servers 2106 within each farm 2038 can be heterogeneous. One or more of the servers 2106 can operate according to one type of operating system platform (e.g., WINDOWS NT, manufactured by Microsoft Corp. of Redmond, Wash.), while one or more of the other servers 2106 can operate on according to another type of operating system platform (e.g., Unix or Linux). The servers 2106 of each farm 2038 do not need to be physically proximate to another server 2106 in the same farm 2038. Thus, the group of servers 2106 logically grouped as a farm 2038 may be interconnected using a wide-area network (WAN) connection or medium-area network (MAN) connection. For example, a farm 2038 may include servers 2106 physically located in different continents or different regions of a continent, country, state, city, campus, or room. Data transmission speeds between servers 2106 in the farm 2038 can be increased if the servers 2106 are connected using a local-area network (LAN) connection or some form of direct connection.

Servers 2106 may be referred to as a file server, application server, web server, proxy server, or gateway server. In some embodiments, a server 2106 may have the capacity to function as either an application server or as a master application server. In one embodiment, a server 2106 may include an Active Directory. The clients 2102 may also be referred to as client nodes or endpoints. In some embodiments, a client 2102 has the capacity to function as both a client node seeking access to applications on a server and as an application server providing access to hosted applications for other clients 2102a-2102n.

In some embodiments, a client 2102 communicates with a server 2106. In one embodiment, the client 2102 communicates directly with one of the servers 2106 in a farm 2038. In another embodiment, the client 2102 executes a program neighborhood application to communicate with a server 2106 in a farm 2038. In still another embodiment, the server 2106 provides the functionality of a master node. In some embodiments, the client 2102 communicates with the server 2106 in the farm 2038 through a network 2104. Over the network 2104, the client 2102 can, for example, request execution of various applications hosted by the servers 2106a-2106n in the farm 2038 and receive output of the results of the application execution for display. In some embodiments, only the master node provides the functionality required to identify and provide address information associated with a server 2106' hosting a requested application.

In one embodiment, the server 2106 provides functionality of a web server. In another embodiment, the server 2106a receives requests from the client 2102, forwards the requests to a second server 2106b and responds to the request by the client 2102 with a response to the request from the server 2106b. In still another embodiment, the server 2106 acquires an enumeration of applications available to the client 2102 and address information associated with a server 2106 hosting an application identified by the enumeration of applications. In yet another embodiment, the server 2106 presents the response to the request to the client 2102 using a web interface. In one embodiment, the client 2102 communicates directly with the server 2106 to access the identified application. In another embodiment, the client 2102 receives application output data, such as display data, generated by an execution of the identified application on the server 2106.

Figure 13B:
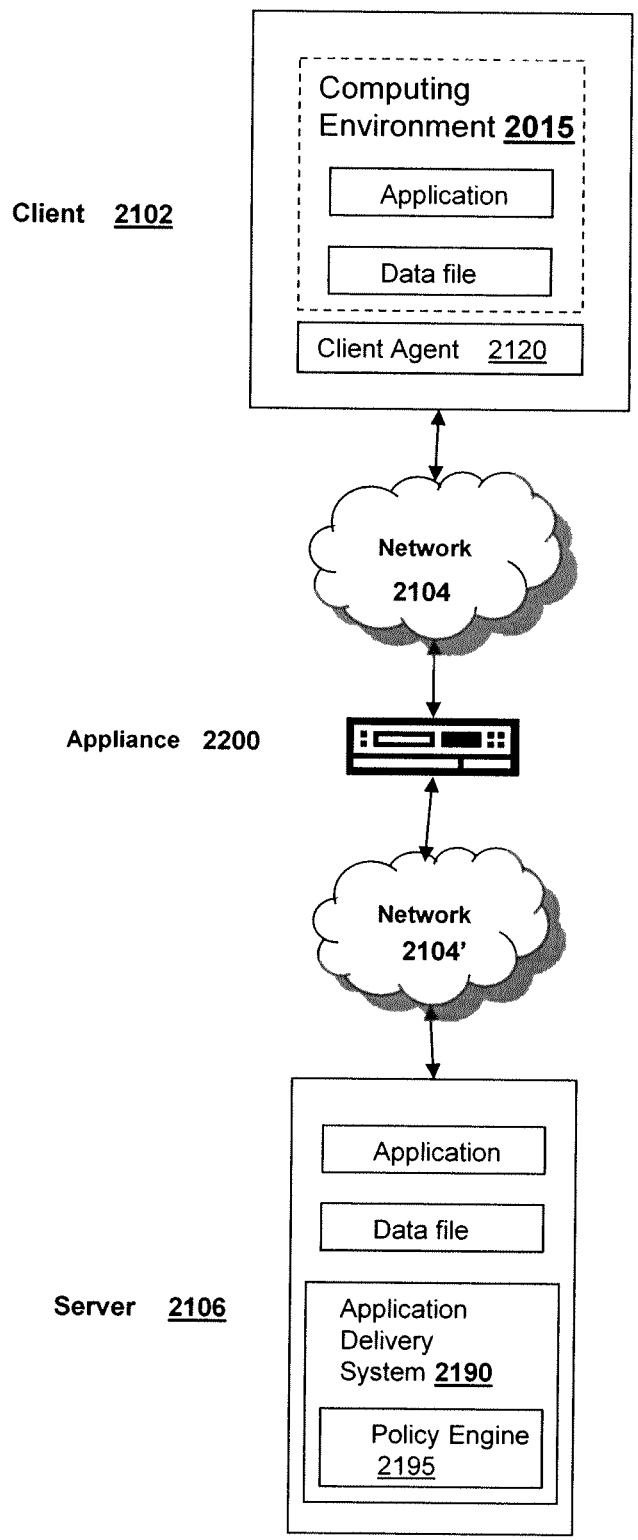
FIG. 13B is a block diagram of an embodiment of an environment for delivering a computing environment from a server to a client via an appliance.

Referring now to FIG. 13B, a network environment for delivering and/or operating a computing environment on a client 2102 is depicted. In some embodiments, a server 2106 includes an application delivery system 2190 for delivering a computing environment or an application and/or data file to one or more clients 2102. In brief overview, a client 2102 is in communication with a server 2106 via network 2104, 2104' and appliance 2200. For example, the client 2102 may reside in a remote office of a company, e.g., a branch office, and the server 2106 may reside at a corporate data center. The client 2102 comprises a client agent 2120, and a computing environment 2015. The computing environment 2015 may execute or operate an application that accesses, processes or uses a data file. The computing environment 2015, application and/or data file may be delivered via the appliance 2200 and/or the server 2106.

In some embodiments, the appliance 2200 accelerates delivery of a computing environment 2015, or any portion thereof, to a client 2102. In one embodiment, the appliance 2200 accelerates the delivery of the computing environment 2015 by the application delivery system 2190. For example, the embodiments described herein may be used to accelerate delivery of a streaming application and data file processable by the application from a central corporate data center to a remote user location, such as a branch office of the company. In another embodiment, the appliance 2200 accelerates transport layer traffic between a client 2102 and a server 2106. The appliance 2200 may provide acceleration techniques for accelerating any transport layer payload from a server 2106 to a client 2102, such as: 1) transport layer connection pooling, 2) transport layer connection multiplexing, 3) transport control protocol buffering, 4) compression and 5) caching. In some embodiments, the appliance 2200 provides load balancing of servers 2106 in responding to requests from clients 2102. In other embodiments, the appliance 2200 acts as a proxy or access server to provide access to the one or more servers 2106. In another embodiment, the appliance 2200 provides a secure virtual private network connection from a first network 2104 of the client 2102 to the second network 2104' of the server 2106, such as an SSL VPN connection. It yet other embodiments, the appliance 2200 provides application firewall security, control and management of the connection and communications between a client 2102 and a server 2106.

The appliance 2200 may be or include any implementations of the optimization server 110 or gateway 106 described in connection with at least FIGS. 4-12. The appliance 2200 may perform the functionality of any implementations of the optimization server 110 described in connection with at least FIGS. 4-12. The appliance 2200 may include any of the following of the optimization server 110: OS monitoring device 240, generator 242, comparator 244 and scheduler 246.

In some embodiments, the application delivery management system 2190 provides application delivery techniques to deliver a computing environment to a desktop of a user, remote or otherwise, based on a plurality of execution methods and based on any authentication and authorization policies applied via a policy engine 2195. With these techniques, a remote user may obtain a computing environment and access to server stored applications and data files from any network connected device 2100. In one embodiment, the application delivery system 2190 may reside or execute on a server 2106. In another embodiment, the application delivery system 2190 may reside or execute on a plurality of servers 2106a-2106n. In some embodiments, the application delivery system 2190 may execute in a server farm 2038. In one embodiment, the server 2106 executing the application delivery system 2190 may also store or provide the application and data file. In another embodiment, a first set of one or more servers 2106 may execute the application delivery system 2190, and a different server 2106n may store or provide the application and data file. In some embodiments, each of the application delivery system 2190, the application, and data file may reside or be located on different servers. In yet another embodiment, any portion of the application delivery system 2190 may reside, execute or be stored on or distributed to the appliance 2200, or a plurality of appliances.

The client 2102 may include a computing environment 2015 for executing an application that uses or processes a data file. The client 2102 via networks 2104, 2104' and appliance 2200 may request an application and data file from the server 2106. In one embodiment, the appliance 2200 may forward a request from the client 2102 to the server 2106. For example, the client 2102 may not have the application and data file stored or accessible locally. In response to the request, the application delivery system 2190 and/or server 2106 may deliver the application and data file to the client 2102. For example, in one embodiment, the server 2106 may transmit the application as an application stream to operate in computing environment 2015 on client 2102.

In some embodiments, the application delivery system 2190 comprises any portion of the Citrix Access Suite™ by Citrix Systems, Inc., such as the MetaFrame or Citrix Presentation Server™ and/or any of the Microsoft Windows Terminal Services manufactured by the Microsoft Corporation. In one embodiment, the application delivery system 2190 may deliver one or more applications to clients 2102 or users via a remote-display protocol or otherwise via remote-based or server-based computing. In another embodiment, the application delivery system 2190 may deliver one or more applications to clients or users via steaming of the application.

In one embodiment, the application delivery system 2190 includes a policy engine 2195 for controlling and managing the access to, selection of application execution methods and the delivery of applications. In some embodiments, the policy engine 2195 determines the one or more applications a user or client 2102 may access. In another embodiment, the policy engine 2195 determines how the application should be delivered to the user or client 2102, e.g., the method of execution. In some embodiments, the application delivery system 2190 provides a plurality of delivery techniques from which to select a method of application execution, such as a server-based computing, streaming or delivering the application locally to the client 2120 for local execution.

In one embodiment, a client 2102 requests execution of an application program and the application delivery system 2190 comprising a server 2106 selects a method of executing the application program. In some embodiments, the server 2106 receives credentials from the client 2102. In another embodiment, the server 2106 receives a request for an enumeration of available applications from the client 2102. In one embodiment, in response to the request or receipt of credentials, the application delivery system 2190 enumerates a plurality of application programs available to the client 2102. The application delivery system 2190 receives a request to execute an enumerated application. The application delivery system 2190 selects one of a predetermined number of methods for executing the enumerated application, for example, responsive to a policy of a policy engine. The application delivery system 2190 may select a method of execution of the application enabling the client 2102 to receive application-output data generated by execution of the application program on a server 2106. The application delivery system 2190 may select a method of execution of the application enabling the local machine 2102 to execute the application program locally after retrieving a plurality of application files comprising the application. In yet another embodiment, the application delivery system 2190 may select a method of execution of the application to stream the application via the network 2104 to the client 2102.

A client 2102 may execute, operate or otherwise provide an application, which can be any type and/or form of software, program, or executable instructions such as any type and/or form of web browser, web-based client, client-server application, a thin-client computing client, an ActiveX control, or a Java applet, or any other type and/or form of executable instructions capable of executing on client 2102. In some embodiments, the application may be a server-based or a remote-based application executed on behalf of the client 2102 on a server 2106. In one embodiments the server 2106 may display output to the client 2102 using any thin-client or remote-display protocol, such as the Independent Computing Architecture (ICA) protocol manufactured by Citrix Systems, Inc. of Ft. Lauderdale, Fla. or the Remote Desktop Protocol (RDP) manufactured by the Microsoft Corporation of Redmond, Wash. The application can use any type of protocol and it can be, for example, an HTTP client, an FTP client, an Oscar client, or a Telnet client. In other embodiments, the application comprises any type of software related to VoIP communications, such as a soft IP telephone. In further embodiments, the application comprises any application related to real-time data communications, such as applications for streaming video and/or audio. The client 2102 my be or include any implementations of the client device 104 described at least in connections with FIGS. 4-12. As previously described, the client 2102 may include a user agent 102, data cache 202, rendering engine 204 and/or cookie cache 206. The client may include a request monitor 201, request generator 212, freshness cache 214, predicted response cache 216, response monitor 218 and DNS cache 220.

The server 2106 may be or include any implementations of the servers 114, 120 or gateway 106 described in connection with at least FIGS. 4-12. In some embodiments, the server 2106 or a server farm 2038 may be running one or more applications, such as an application providing a thin-client computing or remote display presentation application. In one embodiment, the server 2106 or server farm 2038 executes as an application, any portion of the Citrix Access Suite™ by Citrix Systems, Inc., such as the MetaFrame or Citrix Presentation Server™, and/or any of the Microsoft® Windows Terminal Services manufactured by the Microsoft Corporation. In one embodiment, the application is an ICA client, developed by Citrix Systems, Inc. of Fort Lauderdale, Fla. In other embodiments, the application includes a Remote Desktop (RDP) client, developed by Microsoft Corporation of Redmond, Wash. Also, the server 2106 may run an application, which for example, may be an application server providing email services such as Microsoft Exchange manufactured by the Microsoft Corporation of Redmond, Wash., a web or Internet server, or a desktop sharing server, or a collaboration server. In some embodiments, any of the applications may comprise any type of hosted service or products, such as GoToMeeting™ provided by Citrix Online Division, Inc. of Santa Barbara, Calif., WebEx™ provided by WebEx, Inc. of Santa Clara, Calif., or Microsoft Office Live Meeting provided by Microsoft Corporation of Redmond, Wash.

Figure 13C:
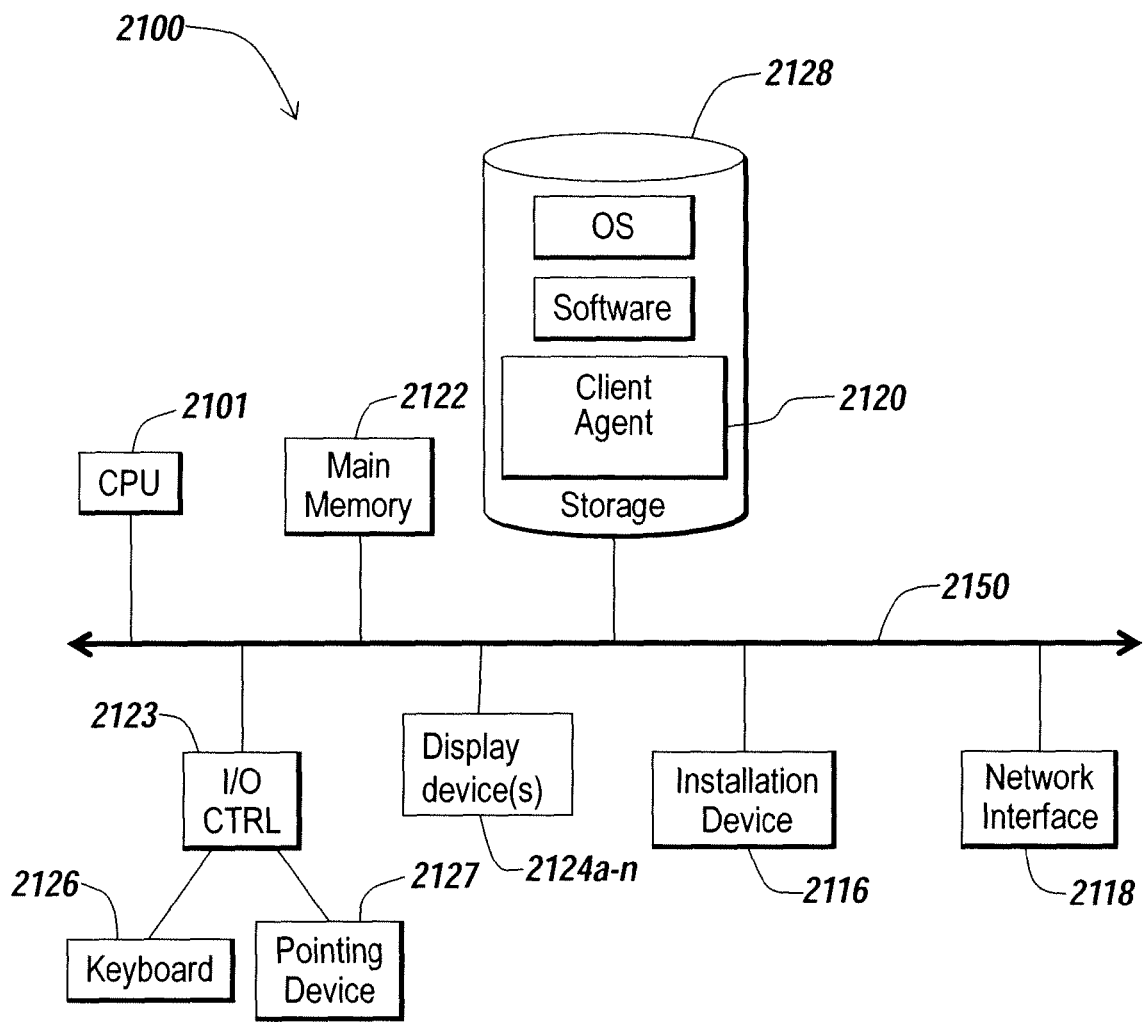
FIGS. 13C and 13D are block diagrams of embodiments of a computing device.
Figure 13D:
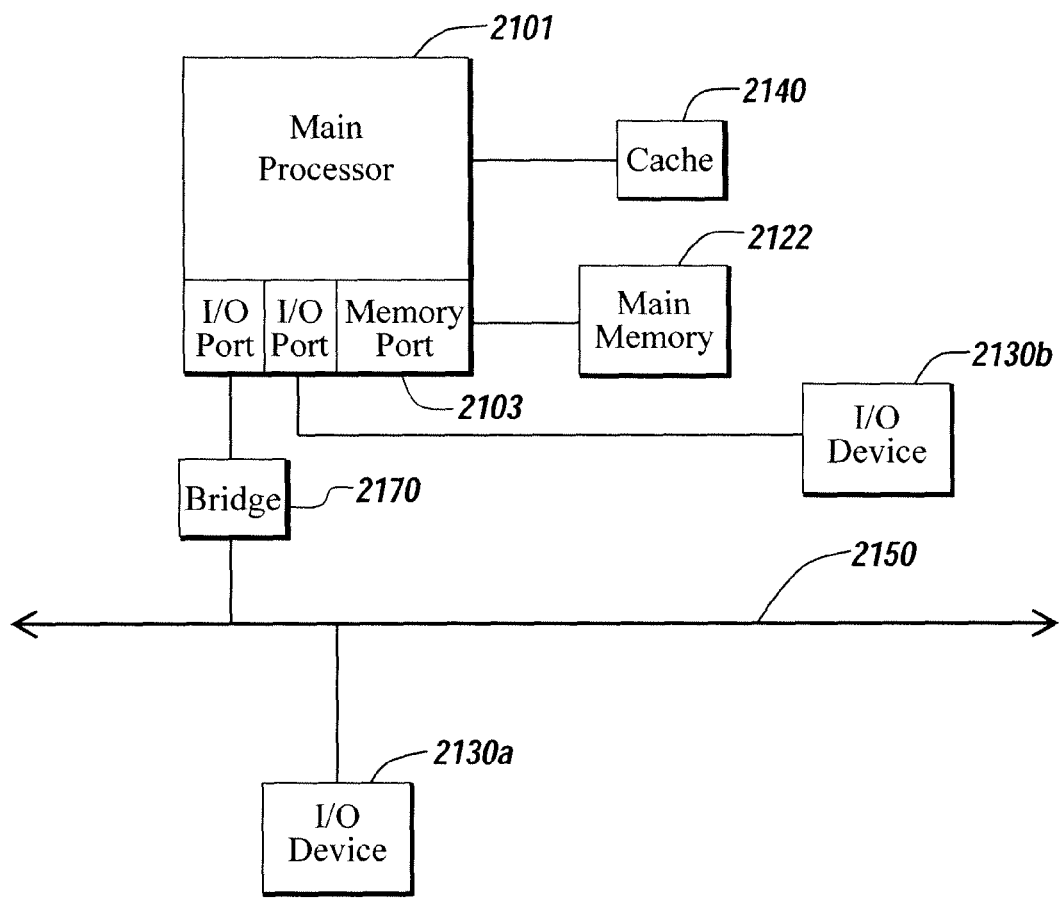

The client 2102, server 2106, and appliance 2200 may be deployed as and/or executed on any type and form of computing device, such as a computer, network device or appliance capable of communicating on any type and form of network and performing the operations described herein. FIGS. 13C and 13D depict block diagrams of a computing device 2100 useful for practicing an embodiment of the client 2102, server 2106 or appliance 2200. As shown in FIGS. 13C and 13D, each computing device 2100 includes a central processing unit 2101, and a main memory unit 2122. As shown in FIG. 13C, a computing device 2100 may include a visual display device 2124, a keyboard 2126 and/or a pointing device 2127, such as a mouse. Each computing device 2100 may also include additional optional elements, such as one or more input/output devices 2130a-2130b (generally referred to using reference numeral 2130), and a cache memory 2140 in communication with the central processing unit 2101.

The central processing unit 2101 is any logic circuitry that responds to and processes instructions fetched from the main memory unit 2122. In many embodiments, the central processing unit is provided by a microprocessor unit, such as: those manufactured by Intel Corporation of Mountain View, Calif.; those manufactured by Motorola Corporation of Schaumburg, Ill.; those manufactured by Transmeta Corporation of Santa Clara, Calif.; the RS/6000 processor, those manufactured by International Business Machines of White Plains, N.Y.; or those manufactured by Advanced Micro Devices of Sunnyvale, Calif. The computing device 2100 may be based on any of these processors, or any other processor capable of operating as described herein.

Main memory unit 2122 may be one or more memory chips capable of storing data and allowing any storage location to be directly accessed by the microprocessor 2101, such as Static random access memory (SRAM), Burst SRAM or SynchBurst SRAM (BSRAM), Dynamic random access memory (DRAM), Fast Page Mode DRAM (FPM DRAM), Enhanced DRAM (EDRAM), Extended Data Output RAM (EDO RAM), Extended Data Output DRAM (EDO DRAM), Burst Extended Data Output DRAM (BEDO DRAM), Enhanced DRAM (EDRAM), synchronous DRAM (SDRAM), JEDEC SRAM, PC100 SDRAM, Double Data Rate SDRAM (DDR SDRAM), Enhanced SDRAM (ESDRAM), SyncLink DRAM (SLDRAM), Direct Rambus DRAM (DRDRAM), or Ferroelectric RAM (FRAM). The main memory 2122 may be based on any of the above described memory chips, or any other available memory chips capable of operating as described herein. In the embodiment shown in FIG. 13C, the processor 2101 communicates with main memory 2122 via a system bus 2150 (described in more detail below). FIG. 13C depicts an embodiment of a computing device 2100 in which the processor communicates directly with main memory 2122 via a memory port 2103. For example, in FIG. 13D the main memory 2122 may be DRDRAM.

FIG. 13D depicts an embodiment in which the main processor 2101 communicates directly with cache memory 2140 via a secondary bus, sometimes referred to as a backside bus.

In other embodiments, the main processor 2101 communicates with cache memory 2140 using the system bus 2150. Cache memory 2140 typically has a faster response time than main memory 2122 and is typically provided by SRAM, BSRAM, or EDRAM. In the embodiment shown in FIG. 13C, the processor 2101 communicates with various I/O devices 2130 via a local system bus 2150. Various busses may be used to connect the central processing unit 2101 to any of the I/O devices 2130, including a VESA VL bus, an ISA bus, an EISA bus, a MicroChannel Architecture (MCA) bus, a PCI bus, a PCI-X bus, a PCI-Express bus, or a NuBus. For embodiments in which the I/O device is a video display 2124, the processor 2101 may use an Advanced Graphics Port (AGP) to communicate with the display 2124. FIG. 13D depicts an embodiment of a computer 2100 in which the main processor 2101 communicates directly with I/O device 2130 via HyperTransport, Rapid I/O, or InfiniBand. FIG. 13D also depicts an embodiment in which local busses and direct communication are mixed: the processor 2101 communicates with I/O device 2130 using a local interconnect bus while communicating with I/O device 2130 directly.

The computing device 2100 may support any suitable installation device 2116, such as a floppy disk drive for receiving floppy disks such as 3.5-inch, 5.25-inch disks or ZIP disks, a CD-ROM drive, a CD-R/RW drive, a DVD-ROM drive, tape drives of various formats, USB device, hard-drive or any other device suitable for installing software and programs such as any client agent 2120, or portion thereof. The computing device 2100 may further comprise a storage device 2128, such as one or more hard disk drives or redundant arrays of independent disks, for storing an operating system and other related software, and for storing application software programs such as any program related to the client agent 2120. Optionally, any of the installation devices 2116 could also be used as the storage device 2128. Additionally, the operating system and the software can be run from a bootable medium, for example, a bootable CD, such as KNOPPIX®, a bootable CD for GNU/Linux that is available as a GNU/Linux distribution from knoppix.net.

Furthermore, the computing device 2100 may include a network interface 2118 to interface to a Local Area Network (LAN), Wide Area Network (WAN) or the Internet through a variety of connections including, but not limited to, standard telephone lines, LAN or WAN links (e.g., 802.11, T1, T3, 56 kb, X.25), broadband connections (e.g., ISDN, Frame Relay, ATM), wireless connections, or some combination of any or all of the above. The network interface 2118 may comprise a built-in network adapter, network interface card, PCMCIA network card, card bus network adapter, wireless network adapter, USB network adapter, modem or any other device suitable for interfacing the computing device 2100 to any type of network capable of communication and performing the operations described herein.

A wide variety of I/O devices 2130a-2130n may be present in the computing device 2100. Input devices include keyboards, mice, trackpads, trackballs, microphones, and drawing tablets. Output devices include video displays, speakers, inkjet printers, laser printers, and dye-sublimation printers. The I/O devices 2130 may be controlled by an I/O controller 2123 as shown in FIG. 13C. The I/O controller may control one or more I/O devices such as a keyboard 2126 and a pointing device 2127, e.g., a mouse or optical pen. Furthermore, an I/O device may also provide storage 2128 and/or an installation medium 2116 for the computing device 2100. In still other embodiments, the computing device 2100 may provide USB connections to receive handheld USB storage devices such as the USB Flash Drive line of devices manufactured by Twintech Industry, Inc. of Los Alamitos, Calif.

In some embodiments, the computing device 2100 may comprise or be connected to multiple display devices 2124a-2124n, which each may be of the same or different type and/or form. As such, any of the I/O devices 2130a-2130n and/or the I/O controller 2123 may comprise any type and/or form of suitable hardware, software, or combination of hardware and software to support, enable or provide for the connection and use of multiple display devices 2124a-2124n by the computing device 2100. For example, the computing device 2100 may include any type and/or form of video adapter, video card, driver, and/or library to interface, communicate, connect or otherwise use the display devices 2124a-2124n. In one embodiment, a video adapter may comprise multiple connectors to interface to multiple display devices 2124a-2124n. In other embodiments, the computing device 2100 may include multiple video adapters, with each video adapter connected to one or more of the display devices 2124a-2124n. In some embodiments, any portion of the operating system of the computing device 2100 may be configured for using multiple displays 2124a-2124n. In other embodiments, one or more of the display devices 2124a-2124n may be provided by one or more other computing devices, such as computing devices 2100a and 2100b connected to the computing device 2100, for example, via a network. These embodiments may include any type of software designed and constructed to use another computer's display device as a second display device 2124a for the computing device 2100. One ordinarily skilled in the art will recognize and appreciate the various ways and embodiments that a computing device 2100 may be configured to have multiple display devices 2124a-2124n.

In further embodiments, an I/O device 2130 may be a bridge 2170 between the system bus 2150 and an external communication bus, such as a USB bus, an Apple Desktop Bus, an RS-232 serial connection, a SCSI bus, a FireWire bus, a FireWire 800 bus, an Ethernet bus, an AppleTalk bus, a Gigabit Ethernet bus, an Asynchronous Transfer Mode bus, a HIPPI bus, a Super HIPPI bus, a SerialPlus bus, a SCI/LAMP bus, a FibreChannel bus, or a Serial Attached small computer system interface bus.

A computing device 2100 of the sort depicted in FIGS. 13C and 13D typically operate under the control of operating systems, which control scheduling of tasks and access to system resources. The computing device 2100 can be running any operating system such as any of the versions of the Microsoft® Windows operating systems, the different releases of the Unix and Linux operating systems, any version of the Mac OS® for Macintosh computers, any embedded operating system, any real-time operating system, any open source operating system, any proprietary operating system, any operating systems for mobile computing devices, or any other operating system capable of running on the computing device and performing the operations described herein. Typical operating systems include: WINDOWS 3.x, WINDOWS 95, WINDOWS 98, WINDOWS 2000, WINDOWS NT 3.51, WINDOWS NT 4.0, WINDOWS CE, and WINDOWS XP, all of which are manufactured by Microsoft Corporation of Redmond, Wash.; MacOS, manufactured by Apple Computer of Cupertino, Calif.; OS/2, manufactured by International Business Machines of Armonk, N.Y.; and Linux, a freely-available operating system distributed by Caldera Corp. of Salt Lake City, Utah, or any type and/or form of a Unix operating system, among others.

In other embodiments, the computing device 2100 may have different processors, operating systems, and input devices consistent with the device. For example, in one embodiment the computer 2100 is a Treo 180, 270, 1060, 600 or 650 smart phone manufactured by Palm, Inc. In this embodiment, the Treo smart phone is operated under the control of the PalmOS operating system and includes a stylus input device as well as a five-way navigator device. Moreover, the computing device 2100 can be any workstation, desktop computer, laptop or notebook computer, server, handheld computer, mobile telephone, any other computer, or other form of computing or telecommunications device that is capable of communication and that has sufficient processor power and memory capacity to perform the operations described herein.

Figure 14A:
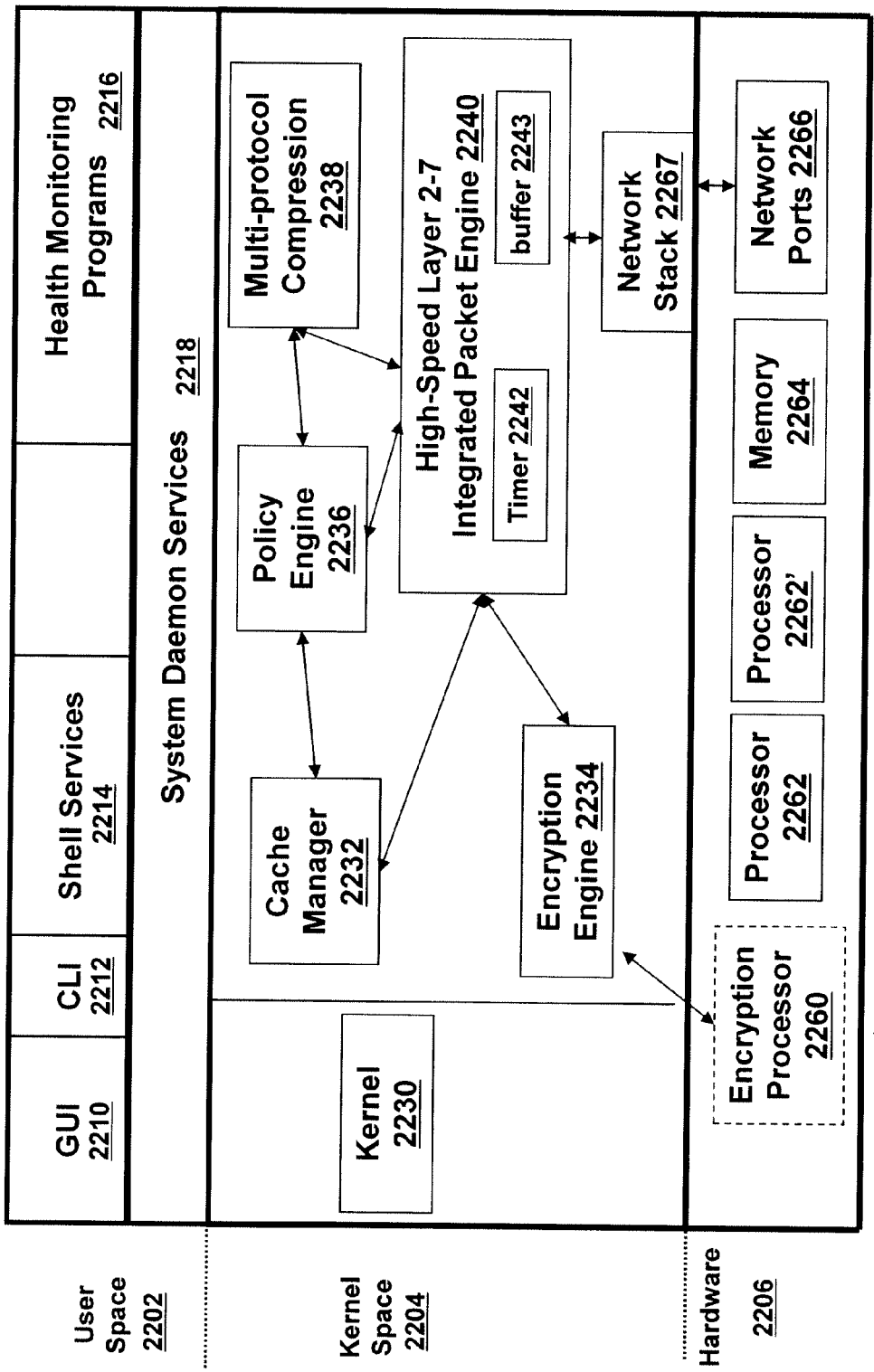
FIG. 14A is a block diagram of an embodiment of an appliance for processing communications between a client and a server.

FIG. 14A illustrates an example embodiment of the appliance 2200. The architecture of the appliance 2200 in FIG. 14A is provided by way of illustration only and is not intended to be limiting. As shown in FIG. 14A, appliance 2200 comprises a hardware layer 2206 and a software layer divided into a user space 2202 and a kernel space 2204.

Figure 2:
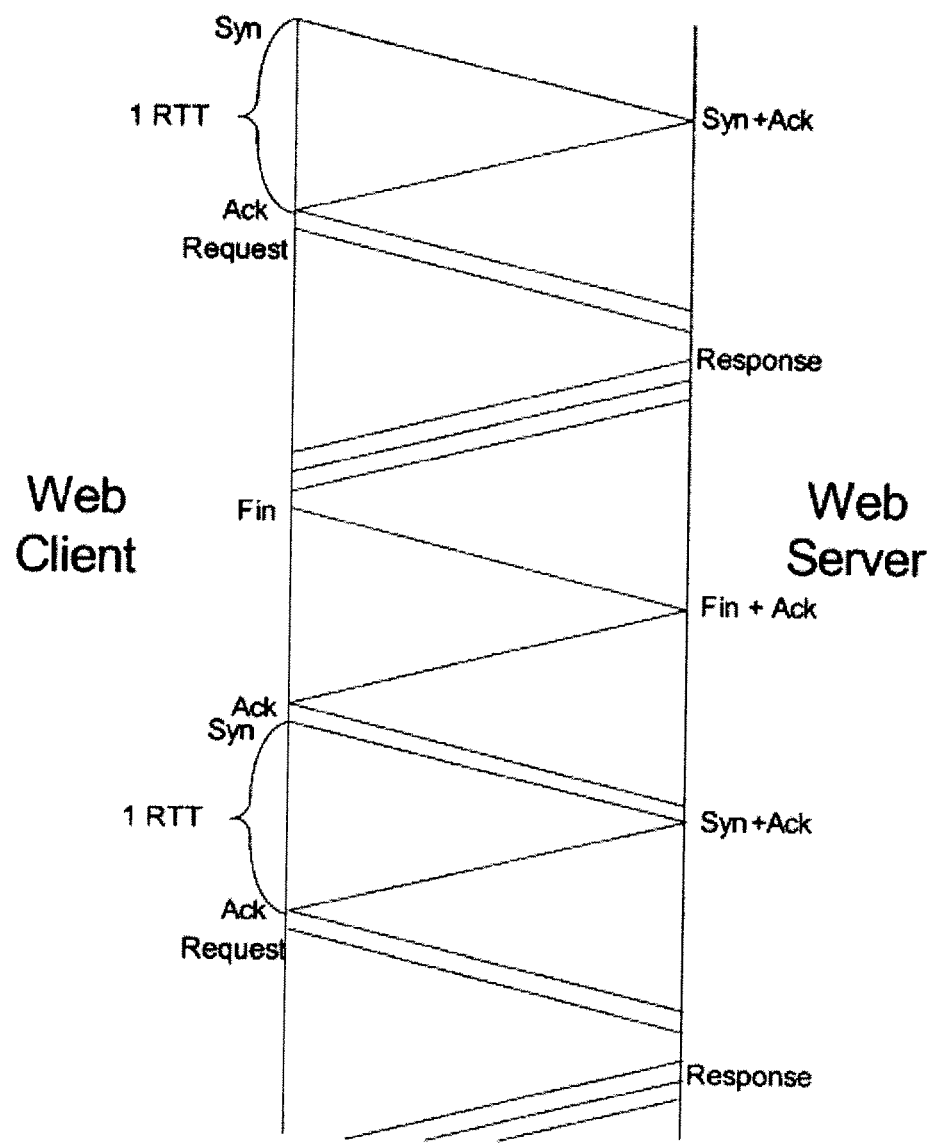
FIG. 2 illustrates the retrieval sequence for objects on a latency constrained network using HTTP over TCP/IP.

Hardware layer 2206 provides the hardware elements upon which programs and services within kernel space 2204 and user space 2202 are executed. Hardware layer 2206 also provides the structures and elements which allow programs and services within kernel space 2204 and user space 2202 to communicate data both internally and externally with respect to appliance 2200. As shown in FIG. 2, the hardware layer 2206 includes a processing unit 2262 for executing software programs and services, a memory 2264 for storing software and data, network ports 2266 for transmitting and receiving data over a network, and an encryption processor 2260 for performing functions related to Secure Sockets Layer processing of data transmitted and received over the network. In some embodiments, the central processing unit 2262 may perform the functions of the encryption processor 2260 in a single processor. Additionally, the hardware layer 2206 may comprise multiple processors for each of the processing unit 2262 and the encryption processor 2260. The processor 2262 may include any of the processors 2101 described above in connection with FIGS. 13C and 13D. In some embodiments, the central processing unit 2262 may perform the functions of the encryption processor 2260 in a single processor. Additionally, the hardware layer 2206 may comprise multiple processors for each of the processing unit 2262 and the encryption processor 2260. For example, in one embodiment, the appliance 2200 comprises a first processor 2262 and a second processor 2262'. In other embodiments, the processor 2262 or 2262' comprises a multi-core processor.

Although the hardware layer 2206 of appliance 2200 is generally illustrated with an encryption processor 2260, processor 2260 may be a processor for performing functions related to any encryption protocol, such as the Secure Socket Layer (SSL) or Transport Layer Security (TLS) protocol. In some embodiments, the processor 2260 may be a general purpose processor (GPP), and in further embodiments, may be have executable instructions for performing processing of any security related protocol.

Although the hardware layer 2206 of appliance 2200 is illustrated with certain elements in FIG. 2, the hardware portions or components of appliance 2200 may comprise any type and form of elements, hardware or software, of a computing device, such as the computing device 2100 illustrated and discussed herein in conjunction with FIGS. 13C and 13D. In some embodiments, the appliance 2200 may comprise a server, gateway, router, switch, bridge or other type of computing or network device, and have any hardware and/or software elements associated therewith.

The operating system of appliance 2200 allocates, manages, or otherwise segregates the available system memory into kernel space 2204 and user space 2204. In example software architecture 2200, the operating system may be any type and/or form of Unix operating system although the invention is not so limited. As such, the appliance 2200 can be running any operating system such as any of the versions of the Microsoft® Windows operating systems, the different releases of the Unix and Linux operating systems, any version of the Mac OS® for Macintosh computers, any embedded operating system, any network operating system, any real-time operating system, any open source operating system, any proprietary operating system, any operating systems for mobile computing devices or network devices, or any other operating system capable of running on the appliance 2200 and performing the operations described herein.

The kernel space 2204 is reserved for running the kernel 2230, including any device drivers, kernel extensions or other kernel related software. As known to those skilled in the art, the kernel 2230 is the core of the operating system, and provides access, control, and management of resources and hardware-related elements of the application 2104. In accordance with an embodiment of the appliance 2200, the kernel space 2204 also includes a number of network services or processes working in conjunction with a cache manager 2232. sometimes also referred to as the integrated cache, the benefits of which are described in detail further herein. Additionally, the embodiment of the kernel 2230 will depend on the embodiment of the operating system installed, configured, or otherwise used by the device 2200.

In one embodiment, the device 2200 comprises one network stack 2267, such as a TCP/IP based stack, for communicating with the client 2102 and/or the server 2106. In one embodiment, the network stack 2267 is used to communicate with a first network, such as network 2108, and a second network 2110. In some embodiments, the device 2200 terminates a first transport layer connection, such as a TCP connection of a client 2102, and establishes a second transport layer connection to a server 2106 for use by the client 2102, e.g., the second transport layer connection is terminated at the appliance 2200 and the server 2106. The first and second transport layer connections may be established via a single network stack 2267. In other embodiments, the device 2200 may comprise multiple network stacks, for example 2267 and 2267', and the first transport layer connection may be established or terminated at one network stack 2267, and the second transport layer connection on the second network stack 2267'. For example, one network stack may be for receiving and transmitting network packet on a first network, and another network stack for receiving and transmitting network packets on a second network. In one embodiment, the network stack 2267 comprises a buffer 2243 for queuing one or more network packets for transmission by the appliance 2200.

As shown in FIG. 2, the kernel space 2204 includes the cache manager 2232, a high-speed layer 2-7 integrated packet engine 2240, an encryption engine 2234, a policy engine 2236 and multi-protocol compression logic 2238. Running these components or processes 2232, 2240, 2234, 2236 and 2238 in kernel space 2204 or kernel mode instead of the user space 2202 improves the performance of each of these components, alone and in combination. Kernel operation means that these components or processes 2232, 2240, 2234, 2236 and 2238 run in the core address space of the operating system of the device 2200. For example, running the encryption engine 2234 in kernel mode improves encryption performance by moving encryption and decryption operations to the kernel, thereby reducing the number of transitions between the memory space or a kernel thread in kernel mode and the memory space or a thread in user mode. For example, data obtained in kernel mode may not need to be passed or copied to a process or thread running in user mode, such as from a kernel level data structure to a user level data structure. In another aspect, the number of context switches between kernel mode and user mode are also reduced. Additionally, synchronization of and communications between any of the components or processes 2232, 2240, 2235, 2236 and 2238 can be performed more efficiently in the kernel space 2204.

In some embodiments, any portion of the components 2232, 2240, 2234, 2236 and 2238 may run or operate in the kernel space 2204, while other portions of these components 2232, 2240, 2234, 2236 and 2238 may run or operate in user space 2202. In one embodiment, the appliance 2200 uses a kernel-level data structure providing access to any portion of one or more network packets, for example, a network packet comprising a request from a client 2102 or a response from a server 2106. In some embodiments, the kernel-level data structure may be obtained by the packet engine 2240 via a transport layer driver interface or filter to the network stack 2267. The kernel-level data structure may comprise any interface and/or data accessible via the kernel space 2204 related to the network stack 2267, network traffic or packets received or transmitted by the network stack 2267. In other embodiments, the kernel-level data structure may be used by any of the components or processes 2232, 2240, 2234, 2236 and 2238 to perform the desired operation of the component or process. In one embodiment, a component 2232, 2240, 2234, 2236 and 2238 is running in kernel mode 2204 when using the kernel-level data structure, while in another embodiment, the component 2232, 2240, 2234, 2236 and 2238 is running in user mode when using the kernel-level data structure. In some embodiments, the kernel-level data structure may be copied or passed to a second kernel-level data structure, or any desired user-level data structure.

The cache manager 2232 may comprise software, hardware or any combination of software and hardware to provide cache access, control and management of any type and form of content, such as objects or dynamically generated objects served by the originating servers 2106. The data, objects or content processed and stored by the cache manager 2232 may comprise data in any format, such as a markup language, or communicated via any protocol. In some embodiments, the cache manager 2232 duplicates original data stored elsewhere or data previously computed, generated or transmitted, in which the original data may require longer access time to fetch, compute or otherwise obtain relative to reading a cache memory element. Once the data is stored in the cache memory element, future use can be made by accessing the cached copy rather than refetching or recomputing the original data, thereby reducing the access time. In some embodiments, the cache memory element may comprise a data object in memory 2264 of device 2200. In other embodiments, the cache memory element may comprise memory having a faster access time than memory 2264. In another embodiment, the cache memory element may comprise any type and form of storage element of the device 2200, such as a portion of a hard disk. In some embodiments, the processing unit 2262 may provide cache memory for use by the cache manager 2232. In yet further embodiments, the cache manager 2232 may use any portion and combination of memory, storage, or the processing unit for caching data, objects, and other content.

Furthermore, the cache manager 2232 includes any logic, functions, rules, or operations to perform any embodiments of the techniques of the appliance 2200 described herein. For example, the cache manager 2232 includes logic or functionality to invalidate objects based on the expiration of an invalidation time period or upon receipt of an invalidation command from a client 2102 or server 2106. In some embodiments, the cache manager 2232 may operate as a program, service, process or task executing in the kernel space 2204, and in other embodiments, in the user space 2202. In one embodiment, a first portion of the cache manager 2232 executes in the user space 2202 while a second portion executes in the kernel space 2204. In some embodiments, the cache manager 2232 can comprise any type of general purpose processor (GPP), or any other type of integrated circuit, such as a Field Programmable Gate Array (FPGA), Programmable Logic Device (PLD), or Application Specific Integrated Circuit (ASIC).

The policy engine 2236 may include, for example, an intelligent statistical engine or other programmable application(s). In one embodiment, the policy engine 2236 provides a configuration mechanism to allow a user to identifying, specify, define or configure a caching policy. Policy engine 2236, in some embodiments, also has access to memory to support data structures such as lookup tables or hash tables to enable user-selected caching policy decisions. In other embodiments, the policy engine 2236 may comprise any logic, rules, functions or operations to determine and provide access, control and management of objects, data or content being cached by the appliance 2200 in addition to access, control and management of security, network traffic, network access, compression or any other function or operation performed by the appliance 2200. Further examples of specific caching policies are further described herein.

The encryption engine 2234 comprises any logic, business rules, functions or operations for handling the processing of any security related protocol, such as SSL or TLS, or any function related thereto. For example, the encryption engine 2234 encrypts and decrypts network packets, or any portion thereof, communicated via the appliance 2200. The encryption engine 2234 may also setup or establish SSL or TLS connections on behalf of the client 2102a-2102n, server 2106a-2106n, or appliance 2200. As such, the encryption engine 2234 provides offloading and acceleration of SSL processing. In one embodiment, the encryption engine 2234 uses a tunneling protocol to provide a virtual private network between a client 2102a-2102n and a server 2106a-2106n. In some embodiments, the encryption engine 2234 is in communication with the Encryption processor 2260. In other embodiments, the encryption engine 2234 comprises executable instructions running on the Encryption processor 2260.

The multi-protocol compression engine 2238 comprises any logic, business rules, function or operations for compressing one or more protocols of a network packet, such as any of the protocols used by the network stack 2267 of the device 2200. In one embodiment, multi-protocol compression engine 2238 compresses bi-directionally between clients 2102a-2102n and servers 2106a-2106n any TCP/IP based protocol, including Messaging Application Programming Interface (MAPI) (email), File Transfer Protocol (FTP), HyperText Transfer Protocol (HTTP), Common Internet File System (CIFS) protocol (file transfer), Independent Computing Architecture (ICA) protocol, Remote Desktop Protocol (RDP), Wireless Application Protocol (WAP), Mobile IP protocol, and Voice Over IP (VoIP) protocol. In other embodiments, multi-protocol compression engine 2238 provides compression of Hypertext Markup Language (HTML) based protocols and in some embodiments, provides compression of any markup languages, such as the Extensible Markup Language (XML). In one embodiment, the multi-protocol compression engine 2238 provides compression of any high-performance protocol, such as any protocol designed for appliance 2200 to appliance 2200 communications. In another embodiment, the multi-protocol compression engine 2238 compresses any payload of or any communication using a modified transport control protocol, such as Transaction TCP (T/TCP), TCP with selection acknowledgements (TCP-SACK), TCP with large windows (TCP-LW), a congestion prediction protocol such as the TCP-Vegas protocol, and a TCP spoofing protocol.

As such, the multi-protocol compression engine 2238 accelerates performance for users accessing applications via desktop clients, e.g., Microsoft Outlook and non-Web thin clients, such as any client launched by popular enterprise applications like Oracle, SAP and Siebel, and even mobile clients, such as the Pocket PC. In some embodiments, the multi-protocol compression engine 2238 by executing in the kernel mode 2204 and integrating with packet processing engine 2240 accessing the network stack 2267 is able to compress any of the protocols carried by the TCP/IP protocol, such as any application layer protocol.

High speed layer 2-7 integrated packet engine 2240, also generally referred to as a packet processing engine or packet engine, is responsible for managing the kernel-level processing of packets received and transmitted by appliance 2200 via network ports 2266. The high speed layer 2-7 integrated packet engine 2240 may comprise a buffer for queuing one or more network packets during processing, such as for receipt of a network packet or transmission of a network packer. Additionally, the high speed layer 2-7 integrated packet engine 2240 is in communication with one or more network stacks 2267 to send and receive network packets via network ports 2266. The high speed layer 2-7 integrated packet engine 2240 works in conjunction with encryption engine 2234, cache manager 2232, policy engine 2236 and multi-protocol compression logic 2238. In particular, encryption engine 2234 is configured to perform SSL processing of packets, policy engine 2236 is configured to perform functions related to traffic management such as request-level content switching and request-level cache redirection, and multi-protocol compression logic 2238 is configured to perform functions related to compression and decompression of data.

The high speed layer 2-7 integrated packet engine 2240 includes a packet processing timer 2242. In one embodiment, the packet processing timer 2242 provides one or more time intervals to trigger the processing of incoming, i.e., received, or outgoing, i.e., transmitted, network packets. In some embodiments, the high speed layer 2-7 integrated packet engine 2240 processes network packets responsive to the timer 2242. The packet processing timer 2242 provides any type and form of signal to the packet engine 2240 to notify, trigger, or communicate a time related event, interval or occurrence. In many embodiments, the packet processing timer 2242 operates in the order of milliseconds, such as for example 100 ms, 50 ms or 25 ms. For example, in some embodiments, the packet processing timer 2242 provides time intervals or otherwise causes a network packet to be processed by the high speed layer 2-7 integrated packet engine 2240 at a 10 ms time interval, while in other embodiments, at a 5 ms time interval, and still yet in further embodiments, as short as a 3, 2, or 1 ms time interval. The high speed layer 2-7 integrated packet engine 2240 may be interfaced, integrated or in communication with the encryption engine 2234, cache manager 2232, policy engine 2236 and multi-protocol compression engine 2238 during operation. As such, any of the logic, functions, or operations of the encryption engine 2234, cache manager 2232, policy engine 2236 and multi-protocol compression logic 2238 may be performed responsive to the packet processing timer 2242 and/or the packet engine 2240. Therefore, any of the logic, functions, or operations of the encryption engine 2234, cache manager 2232, policy engine 2236 and multi-protocol compression logic 2238 may be performed at the granularity of time intervals provided via the packet processing timer 2242, for example, at a time interval of less than or equal to 10 ms. For example, in one embodiment, the cache manager 2232 may perform invalidation of any cached objects responsive to the high speed layer 2-7 integrated packet engine 2240 and/or the packet processing timer 2242. In another embodiment, the expiry or invalidation time of a cached object can be set to the same order of granularity as the time interval of the packet processing timer 2242, such as at every 10 ms In contrast to kernel space 2204, user space 2202 is the memory area or portion of the operating system used by user mode applications or programs otherwise running in user mode. A user mode application may not access kernel space 2204 directly and uses service calls in order to access kernel services. As shown in FIG. 2, user space 2202 of appliance 2200 includes a graphical user interface (GUI) 2210, a command line interface (CLI) 2212, shell services 2214, health monitoring program 2216, and daemon services 2218. GUI 2210 and CLI 2212 provide a means by which a system administrator or other user can interact with and control the operation of appliance 2200, such as via the operating system of the appliance 2200 and either is user space 2202 or kernel space 2204. The GUI 2210 may be any type and form of graphical user interface and may be presented via text, graphical or otherwise, by any type of program or application, such as a browser. The CLI 2212 may be any type and form of command line or text-based interface, such as a command line provided by the operating system. For example, the CLI 2212 may comprise a shell, which is a tool to enable users to interact with the operating system. In some embodiments, the CLI 2212 may be provided via a bash, csh, tcsh, or ksh type shell. The shell services 2214 comprises the programs, services, tasks, processes or executable instructions to support interaction with the appliance 2200 or operating system by a user via the GUI 2210 and/or CLI 2212.

Health monitoring program 2216 is used to monitor, check, report and ensure that network systems are functioning properly and that users are receiving requested content over a network. Health monitoring program 2216 comprises one or more programs, services, tasks, processes or executable instructions to provide logic, rules, functions or operations for monitoring any activity of the appliance 2200. In some embodiments, the health monitoring program 2216 intercepts and inspects any network traffic passed via the appliance 2200. In other embodiments, the health monitoring program 2216 interfaces by any suitable means and/or mechanisms with one or more of the following: the encryption engine 2234, cache manager 2232, policy engine 2236, multi-protocol compression logic 2238, packet engine 2240, daemon services 2218, and shell services 2214. As such, the health monitoring program 2216 may call any application programming interface (API) to determine a state, status, or health of any portion of the appliance 2200. For example, the health monitoring program 2216 may ping or send a status inquiry on a periodic basis to check if a program, process, service or task is active and currently running. In another example, the health monitoring program 2216 may check any status, error or history logs provided by any program, process, service or task to determine any condition, status or error with any portion of the appliance 2200.

Daemon services 2218 are programs that run continuously or in the background and handle periodic service requests received by appliance 2200. In some embodiments, a daemon service may forward the requests to other programs or processes, such as another daemon service 2218 as appropriate. As known to those skilled in the art, a daemon service 2218 may run unattended to perform continuous or periodic system wide functions, such as network control, or to perform any desired task. In some embodiments, one or more daemon services 2218 run in the user space 2202, while in other embodiments, one or more daemon services 2218 run in the kernel space.

Figure 14B:
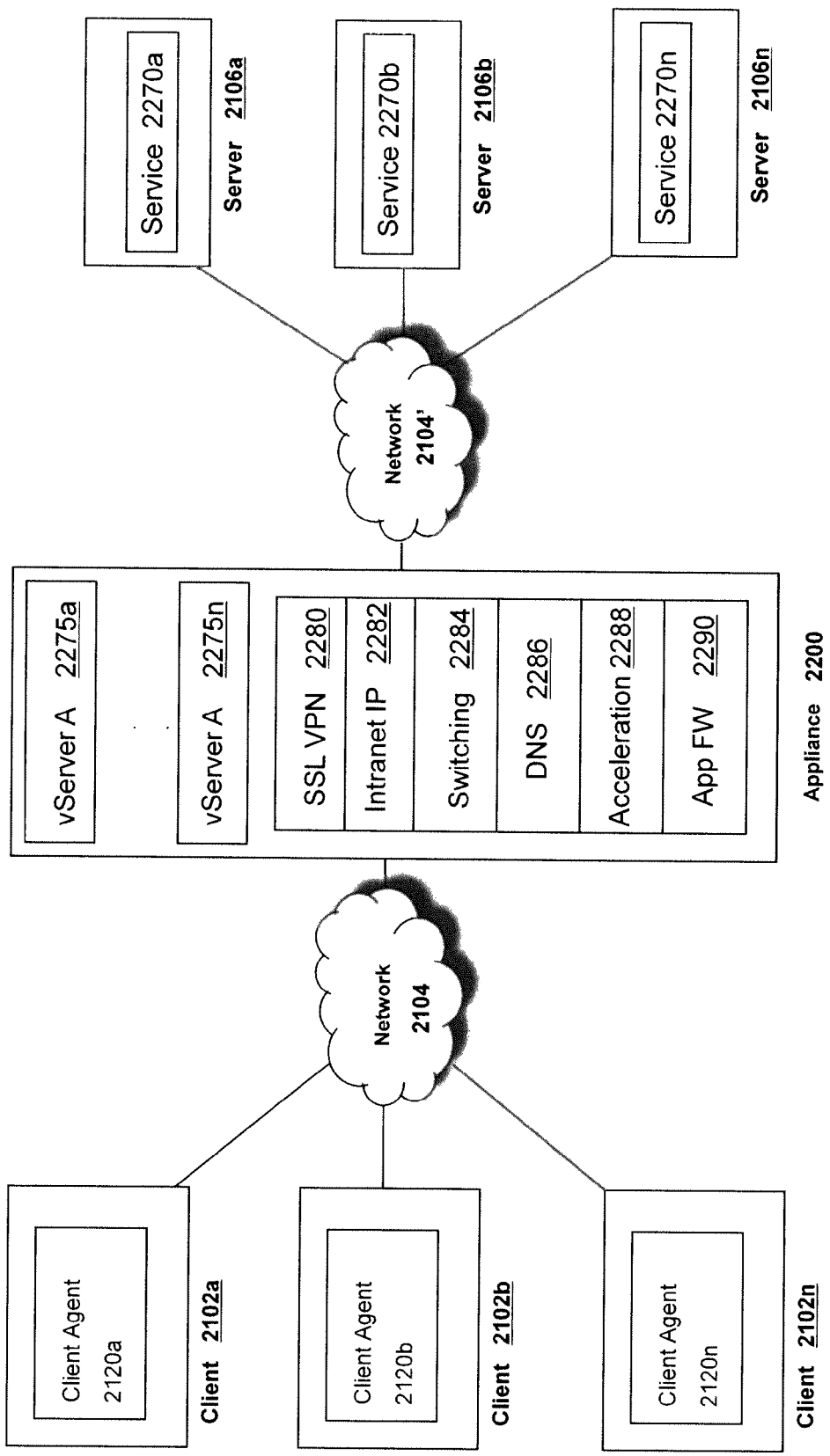
FIG. 14B is a block diagram of another embodiment of an appliance for optimizing, accelerating, load-balancing and routing communications between a client and a server.

Referring now to FIG. 14B, another embodiment of the appliance 2200 is depicted. In brief overview, the appliance 2200 provides one or more of the following services, functionality or operations: SSL VPN connectivity 2280, switching/load balancing 2284, Domain Name Service resolution 2286, acceleration 2288 and an application firewall 2290 for communications between one or more clients 2102 and one or more servers 2106. In one embodiment, the appliance 2200 comprises any of the network devices manufactured by Citrix Systems, Inc. of Ft. Lauderdale Fla., referred to as Citrix NetScaler devices. Each of the servers 2106 may provide one or more network related services 2270a-2270n (referred to as services 2270). For example, a server 2106 may provide an http service 2270. The appliance 2200 comprises one or more virtual servers or virtual internet protocol servers, referred to as a vServer, VIP server, or just VIP 2275a-2275n (also referred herein as vServer 2275). The vServer 2275 receives, intercepts or otherwise processes communications between a client 2102 and a server 2106 in accordance with the configuration and operations of the appliance 2200.

The vServer 2275 may comprise software, hardware or any combination of software and hardware. The vServer 2275 may comprise any type and form of program, service, task, process or executable instructions operating in user mode 2202, kernel mode 2204 or any combination thereof in the appliance 2200. The vServer 2275 includes any logic, functions, rules, or operations to perform any embodiments of the techniques described herein, such as SSL VPN 2280, switching/load balancing 2284, Domain Name Service resolution 2286, acceleration 2288 and an application firewall 2290. In some embodiments, the vServer 2275 establishes a connection to a service 2270 of a server 2106. The service 2275 may comprise any program, application, process, task or set of executable instructions capable of connecting to and communicating to the appliance 2200, client 2102 or vServer 2275. For example, the service 2275 may comprise a web server, http server, ftp, email or database server. In some embodiments, the service 2270 is a daemon process or network driver for listening, receiving and/or sending communications for an application, such as email, database or an enterprise application. In some embodiments, the service 2270 may communicate on a specific IP address, or IP address and port.

In some embodiments, the vServer 2275 applies one or more policies of the policy engine 2236 to network communications between the client 2102 and server 2106. In one embodiment, the policies are associated with a VServer 2275. In another embodiment, the policies are based on a user, or a group of users. In yet another embodiment, a policy is global and applies to one or more vServers 2275a-2275n, and any user or group of users communicating via the appliance 2200. In some embodiments, the policies of the policy engine have conditions upon which the policy is applied based on any content of the communication, such as internet protocol address, port, protocol type, header or fields in a packet, or the context of the communication, such as user, group of the user, vServer 2275, transport layer connection, and/or identification or attributes of the client 2102 or server 2106.

In other embodiments, the appliance 2200 communicates or interfaces with the policy engine 2236 to determine authentication and/or authorization of a remote user or a remote client 2102 to access the computing environment 2015, application, and/or data file from a server 2106. In another embodiment, the appliance 2200 communicates or interfaces with the policy engine 2236 to determine authentication and/or authorization of a remote user or a remote client 2102 to have the application delivery system 2190 deliver one or more of the computing environment 2015, application, and/or data file. In yet another embodiment, the appliance 2200 establishes a VPN or SSL VPN connection based on the policy engine's 2236 authentication and/or authorization of a remote user or a remote client 2103. In one embodiment, the appliance 2102 controls the flow of network traffic and communication sessions based on policies of the policy engine 2236. For example, the appliance 2200 may control the access to a computing environment 2015, application or data file based on the policy engine 2236.

In some embodiments, the vServer 2275 establishes a transport layer connection, such as a TCP or UDP connection with a client 2102 via the client agent 2120. In one embodiment, the vServer 2275 listens for and receives communications from the client 2102. In other embodiments, the vServer 2275 establishes a transport layer connection, such as a TCP or UDP connection with a client server 2106. In one embodiment, the vServer 2275 establishes the transport layer connection to an internet protocol address and port of a server 2270 running on the server 2106. In another embodiment, the vServer 2275 associates a first transport layer connection to a client 2102 with a second transport layer connection to the server 2106. In some embodiments, a vServer 2275 establishes a pool of transport layer connections to a server 2106 and multiplexes client requests via the pooled transport layer connections.

In some embodiments, the appliance 2200 provides a SSL VPN connection 2280 between a client 2102 and a server 2106. For example, a client 2102 on a first network 2102 requests to establish a connection to a server 2106 on a second network 2104'. In some embodiments, the second network 2104' is not routable from the first network 2104. In other embodiments, the client 2102 is on a public network 2104 and the server 2106 is on a private network 2104', such as a corporate network. In one embodiment, the client agent 2120 intercepts communications of the client 2102 on the first network 2104, encrypts the communications, and transmits the communications via a first transport layer connection to the appliance 2200. The appliance 2200 associates the first transport layer connection on the first network 2104 to a second transport layer connection to the server 2106 on the second network 2104. The appliance 2200 receives the intercepted communication from the client agent 2102, decrypts the communications, and transmits the communication to the server 2106 on the second network 2104 via the second transport layer connection. The second transport layer connection may be a pooled transport layer connection. As such, the appliance 2200 provides an end-to-end secure transport layer connection for the client 2102 between the two networks 2104, 2104'.

In one embodiment, the appliance 2200 hosts an intranet internet protocol or intranetIP 2282 address of the client 2102 on the virtual private network 2104. The client 2102 has a local network identifier, such as an internet protocol (IP) address and/or host name on the first network 2104. When connected to the second network 2104' via the appliance 2200, the appliance 2200 establishes, assigns or otherwise provides an IntranetIP, which is network identifier, such as IP address and/or host name, for the client 2102 on the second network 2104'. The appliance 2200 listens for and receives on the second or private network 2104' for any communications directed towards the client 2102 using the client's established IntranetIP 2282. In one embodiment, the appliance 2200 acts as or on behalf of the client 2102 on the second private network 2104. For example, in another embodiment, a vServer 2275 listens for and responds to communications to the IntranetIP 2282 of the client 2102. In some embodiments, if a computing device 2100 on the second network 2104' transmits a request, the appliance 2200 processes the request as if it were the client 2102. For example, the appliance 2200 may respond to a ping to the client's IntranetIP 2282. In another example, the appliance may establish a connection, such as a TCP or UDP connection, with computing device 2100 on the second network 2104 requesting a connection with the client's IntranetIP 2282.

In some embodiments, the appliance 2200 provides one or more of the following acceleration techniques 2288 to communications between the client 2102 and server 2106: 1) compression; 2) decompression; 3) Transmission Control Protocol pooling; 4) Transmission Control Protocol multiplexing; 5) Transmission Control Protocol buffering; and 6) caching.

In one embodiment, the appliance 2200 relieves servers 2106 of much of the processing load caused by repeatedly opening and closing transport layers connections to clients 2102 by opening one or more transport layer connections with each server 2106 and maintaining these connections to allow repeated data accesses by clients via the Internet. This technique is referred to herein as "connection pooling".

In some embodiments, in order to seamlessly splice communications from a client 2102 to a server 2106 via a pooled transport layer connection, the appliance 2200 translates or multiplexes communications by modifying sequence number and acknowledgment numbers at the transport layer protocol level. This is referred to as "connection multiplexing". In some embodiments, no application layer protocol interaction is required. For example, in the case of an in-bound packet (that is, a packet received from a client 2102), the source network address of the packet is changed to that of an output port of appliance 2200, and the destination network address is changed to that of the intended server. In the case of an outbound packet (that is, one received from a server 2106), the source network address is changed from that of the server 2106 to that of an output port of appliance 2200 and the destination address is changed from that of appliance 2200 to that of the requesting client 2102. The sequence numbers and acknowledgment numbers of the packet are also translated to sequence numbers and acknowledgement expected by the client 2102 on the appliance's 2200 transport layer connection to the client 2102. In some embodiments, the packet checksum of the transport layer protocol is recalculated to account for these translations.

In another embodiment, the appliance 2200 provides switching or load-balancing functionality 2284 for communications between the client 2102 and server 2106. In some embodiments, the appliance 2200 distributes traffic and directs client requests to a server 2106 based on layer 4 or application-layer request data. In one embodiment, although the network layer or layer 2 of the network packet identifies a destination server 2106, the appliance 2200 determines the server 2106 to distribute the network packet by application information and data carried as payload of the transport layer packet. In one embodiment, the health monitoring programs 2216 of the appliance 2200 monitor the health of servers to determine the server 2106 for which to distribute a client's request. In some embodiments, if the appliance 2200 detects a server 2106 is not available or has a load over a predetermined threshold, the appliance 2200 can direct or distribute client requests to another server 2106.

In some embodiments, the appliance 2200 acts as a Domain Name Service (DNS) resolver or otherwise provides resolution of a DNS request from clients 2102. In some embodiments, the appliance intercepts' a DNS request transmitted by the client 2102. In one embodiment, the appliance 2200 responds to a client's DNS request with an IP address of or hosted by the appliance 2200. In this embodiment, the client 2102 transmits network communication for the domain name to the appliance 2200. In another embodiment, the appliance 2200 responds to a client's DNS request with an IP address of or hosted by a second appliance 2200'. In some embodiments, the appliance 2200 responds to a client's DNS request with an IP address of a server 2106 determined by the appliance 2200.

In yet another embodiment, the appliance 2200 provides application firewall functionality 2290 for communications between the client 2102 and server 2106. In one embodiment, the policy engine 2236 provides rules for detecting and blocking illegitimate requests. In some embodiments, the application firewall 2290 protects against denial of service (DoS) attacks. In other embodiments, the appliance inspects the content of intercepted requests to identify and block application-based attacks. In some embodiments, the rules/policy engine 2236 comprises one or more application firewall or security control policies for providing protections against various classes and types of web or Internet based vulnerabilities, such as one or more of the following: 1) buffer overflow, 2) CGI-BIN parameter manipulation, 3) form/hidden field manipulation, 4) forceful browsing, 5) cookie or session poisoning, 6) broken access control list (ACLs) or weak passwords, 7) cross-site scripting (XSS), 8) command injection, 9) SQL injection, 10) error triggering sensitive information leak, 11) insecure use of cryptography, 12) server misconfiguration, 13) back doors and debug options, 14) website defacement, 15) platform or operating systems vulnerabilities, and 16) zero-day exploits. In an embodiment, the application firewall 2290 provides HTML form field protection in the form of inspecting or analyzing the network communication for one or more of the following: 1) required fields are returned, 2) no added field allowed, 3) read-only and hidden field enforcement, 4) drop-down list and radio button field conformance, and 5) form-field max-length enforcement. In some embodiments, the application firewall 2290 ensures cookies are not modified. In other embodiments, the application firewall 2290 protects against forceful browsing by enforcing legal URLs.

In still yet other embodiments, the application firewall 2290 protects any confidential information contained in the network communication. The application firewall 2290 may inspect or analyze any network communication in accordance with the rules or polices of the engine 2236 to identify any confidential information in any field of the network packet. In some embodiments, the application firewall 2290 identifies in the network communication one or more occurrences of a credit card number, password, social security number, name, patient code, contact information, and age. The encoded portion of the network communication may comprise these occurrences or the confidential information. Based on these occurrences, in one embodiment, the application firewall 2290 may take a policy action on the network communication, such as prevent transmission of the network communication. In another embodiment, the application firewall 2290 may rewrite, remove or otherwise mask such identified occurrence or confidential information.

Figure 15:
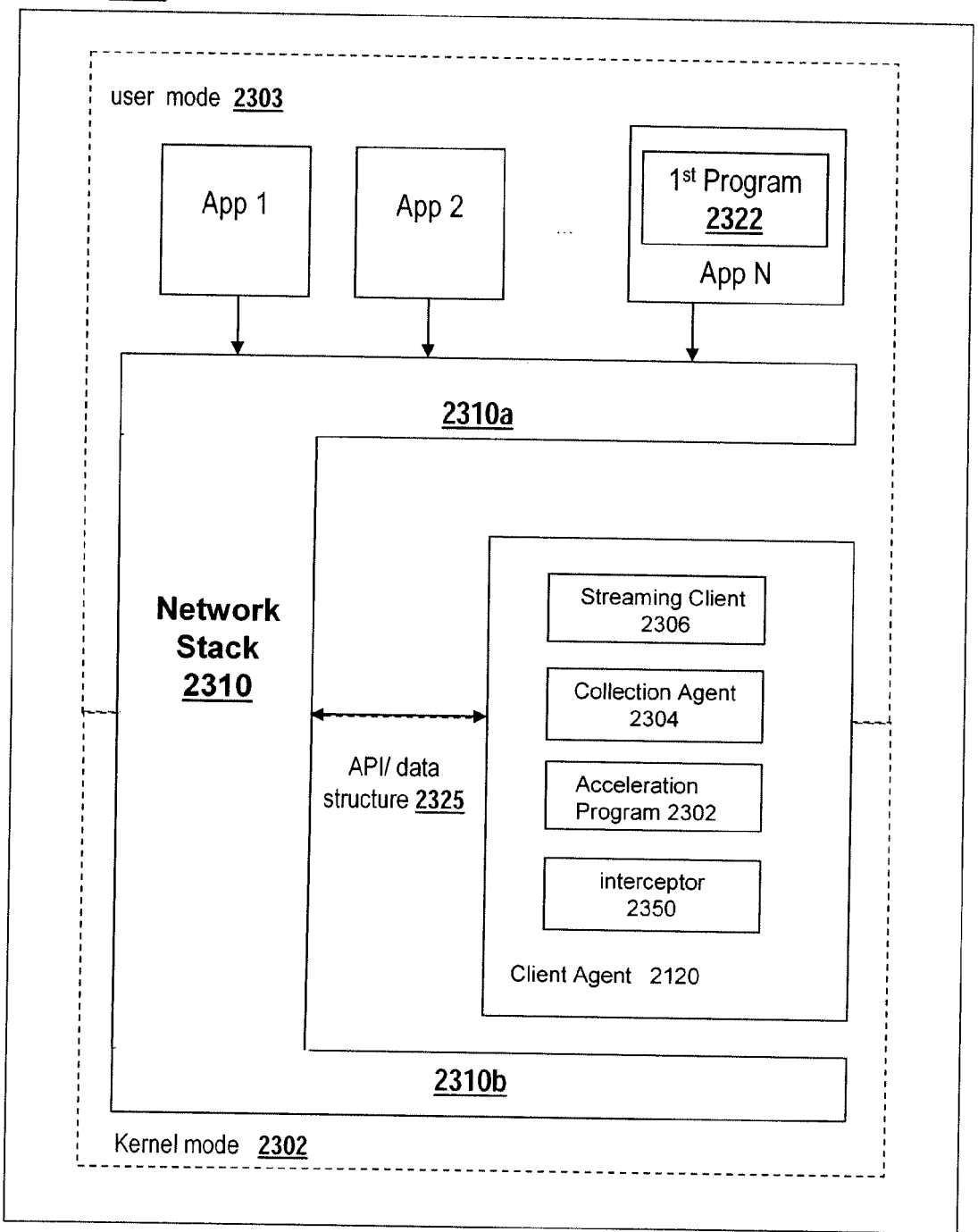
FIG. 15 is a block diagram of an embodiment of a client for communicating with a server via the appliance.

Referring now to FIG. 15, an embodiment of the client agent 2120 is depicted. The client 2102 includes a client agent 2120 for establishing and exchanging communications with the appliance 2200 and/or server 2106 via a network 2104. In brief overview, the client 2102 operates on computing device 2100 having an operating system with a kernel mode 2302 and a user mode 2303, and a network stack 2310 with one or more layers 2310a-2310b. The client 2102 may have installed and/or execute one or more applications. In some embodiments, one or more applications may communicate via the network stack 2310 to a network 2104. One of the applications, such as a web browser, may also include a first program 2322. For example, the first program 2322 may be used in some embodiments to install and/or execute the client agent 2120, or any portion thereof. The client agent 2120 includes an interception mechanism, or interceptor 2350, for intercepting network communications from the network stack 2310 from the one or more applications.

The network stack 2310 of the client 2102 may comprise any type and form of software, or hardware, or any combinations thereof, for providing connectivity to and communications with a network. In one embodiment, the network stack 2310 comprises a software implementation for a network protocol suite. The network stack 2310 may comprise one or more network layers, such as any networks layers of the Open Systems Interconnection (OSI) communications model as those skilled in the art recognize and appreciate. As such, the network stack 2310 may comprise any type and form of protocols for any of the following layers of the OSI model: 1) physical link layer, 2) data link layer, 3) network layer, 4) transport layer, 5) session layer, 6) presentation layer, and 7) application layer. In one embodiment, the network stack 2310 may comprise a transport control protocol (TCP) over the network layer protocol of the internet protocol (IP), generally referred to as TCP/IP. In some embodiments, the TCP/IP protocol may be carried over the Ethernet protocol, which may comprise any of the family of IEEE wide-area-network (WAN) or local-area-network (LAN) protocols, such as those protocols covered by the IEEE 802.3. In some embodiments, the network stack 2310 comprises any type and form of a wireless protocol, such as IEEE 802.11 and/or mobile internet protocol.

In view of a TCP/IP based network, any TCP/IP based protocol may be used, including Messaging Application Programming Interface (MAPI) (email), File Transfer Protocol (FTP), HyperText Transfer Protocol (HTTP), Common Internet File System (CIFS) protocol (file transfer), Independent Computing Architecture (ICA) protocol, Remote Desktop Protocol (RDP), Wireless Application Protocol (WAP), Mobile IP protocol, and Voice Over IP (VoIP) protocol. In another embodiment, the network stack 2310 comprises any type and form of transport control protocol, such as a modified transport control protocol, for example a Transaction TCP (T/TCP), TCP with selection acknowledgements (TCP-SACK), TCP with large windows (TCP-LW), a congestion prediction protocol such as the TCP-Vegas protocol, and a TCP spoofing protocol. In other embodiments, any type and form of user datagram protocol (UDP), such as UDP over IP, may be used by the network stack 2310, such as for voice communications or real-time data communications.

Furthermore, the network stack 2310 may include one or more network drivers supporting the one or more layers, such as a TCP driver or a network layer driver. The network drivers may be included as part of the operating system of the computing device 2100 or as part of any network interface cards or other network access components of the computing device 2100. In some embodiments, any of the network drivers of the network stack 2310 may be customized, modified or adapted to provide a custom or modified portion of the network stack 2310 in support of any of the techniques described herein. In other embodiments, the acceleration program 2120 is designed and constructed to operate with or work in conjunction with the network stack 2310 installed or otherwise provided by the operating system of the client 2102.

The network stack 2310 comprises any type and form of interfaces for receiving, obtaining, providing or otherwise accessing any information and data related to network communications of the client 2102. In one embodiment, an interface to the network stack 2310 comprises an application programming interface (API). The interface may also comprise any function call, hooking or filtering mechanism, event or call back mechanism, or any type of interfacing technique. The network stack 2310 via the interface may receive or provide any type and form of data structure, such as an object, related to functionality or operation of the network stack 2310. For example, the data structure may comprise information and data related to a network packet or one or more network packets. In some embodiments, the data structure comprises a portion of the network packet processed at a protocol layer of the network stack 2310, such as a network packet of the transport layer. In some embodiments, the data structure 2325 comprises a kernel-level data structure, while in other embodiments, the data structure 2325 comprises a user-mode data structure. A kernel-level data structure may comprise a data structure obtained or related to a portion of the network stack 2310 operating in kernel-mode 2302, or a network driver or other software running in kernel-mode 2302, or any data structure obtained or received by a service, process, task, thread or other executable instructions running or operating in kernel-mode of the operating system.

Additionally, some portions of the network stack 2310 may execute or operate in kernel-mode 2302, for example, the data link or network layer, while other portions execute or operate in user-mode 2303, such as an application layer of the network stack 2310. For example, a first portion 2310a of the network stack may provide user-mode access to the network stack 2310 to an application while a second portion 2310a of the network stack 2310 provides access to a network. In some embodiments, a first portion 2310a of the network stack may comprise one or more upper layers of the network stack 2310, such as any of layers 5-7. In other embodiments, a second portion 2310b of the network stack 2310 comprises one or more lower layers, such as any of layers 1-4. Each of the first portion 2310a and second portion 2310b of the network stack 2310 may comprise any portion of the network stack 2310, at any one or more network layers, in user-mode 2203, kernel-mode, 2202, or combinations thereof, or at any portion of a network layer or interface point to a network layer or any portion of or interface point to the user-mode 2203 and kernel-mode 2203.

The interceptor 2350 may comprise software, hardware, or any combination of software and hardware. In one embodiment, the interceptor 2350 intercept a network communication at any point in the network stack 2310, and redirects or transmits the network communication to a destination desired, managed or controlled by the interceptor 2350 or client agent 2120. For example, the interceptor 2350 may intercept a network communication of a network stack 2310 of a first network and transmit the network communication to the appliance 2200 for transmission on a second network 2104. In some embodiments, the interceptor 2350 comprises any type interceptor 2350 comprises a driver, such as a network driver constructed and designed to interface and work with the network stack 2310. In some embodiments, the client agent 2120 and/or interceptor 2350 operates at one or more layers of the network stack 2310, such as at the transport layer. In one embodiment, the interceptor 2350 comprises a filter driver, hooking mechanism, or any form and type of suitable network driver interface that interfaces to the transport layer of the network stack, such as via the transport driver interface (TDI). In some embodiments, the interceptor 2350 interfaces to a first protocol layer, such as the transport layer and another protocol layer, such as any layer above the transport protocol layer, for example, an application protocol layer. In one embodiment, the interceptor 2350 may comprise a driver complying with the Network Driver Interface Specification (NDIS), or a NDIS driver. In another embodiment, the interceptor 2350 may comprise a min-filter or a mini-port driver. In one embodiment, the interceptor 2350, or portion thereof, operates in kernel-mode 2202. In another embodiment, the interceptor 2350, or portion thereof, operates in user-mode 2203. In some embodiments, a portion of the interceptor 2350 operates in kernel-mode 2202 while another portion of the interceptor 2350 operates in user-mode 2203. In other embodiments, the client agent 2120 operates in user-mode 2203 but interfaces via the interceptor 2350 to a kernel-mode driver, process, service, task or portion of the operating system, such as to obtain a kernel-level data structure 2225. In further embodiments, the interceptor 2350 is a user-mode application or program, such as application.

In one embodiment, the interceptor 2350 intercepts any transport layer connection requests. In these embodiments, the interceptor 2350 execute transport layer application programming interface (API) calls to set the destination information, such as destination IP address and/or port to a desired location for the location. In this manner, the interceptor 2350 intercepts and redirects the transport layer connection to a IP address and port controlled or managed by the interceptor 2350 or client agent 2120. In one embodiment, the interceptor 2350 sets the destination information for the connection to a local IP address and port of the client 2102 on which the client agent 2120 is listening. For example, the client agent 2120 may comprise a proxy service listening on a local IP address and port for redirected transport layer communications. In some embodiments, the client agent 2120 then communicates the redirected transport layer communication to the appliance 2200.

In some embodiments, the interceptor 2350 intercepts a Domain Name Service (DNS) request. In one embodiment, the client agent 2120 and/or interceptor 2350 resolves the DNS request. In another embodiment, the interceptor transmits the intercepted DNS request to the appliance 2200 for DNS resolution. In one embodiment, the appliance 2200 resolves the DNS request and communicates the DNS response to the client agent 2120. In some embodiments, the appliance 2200 resolves the DNS request via another appliance 2200' or a DNS server 2106.

In yet another embodiment, the client agent 2120 may comprise two agents 2120 and 2120'. In one embodiment, a first agent 2120 may comprise an interceptor 2350 operating at the network layer of the network stack 2310. In some embodiments, the first agent 2120 intercepts network layer requests such as Internet Control Message Protocol (ICMP) requests (e.g., ping and traceroute). In other embodiments, the second agent 2120' may operate at the transport layer and intercept transport layer communications. In some embodiments, the first agent 2120 intercepts communications at one layer of the network stack 2210 and interfaces with or communicates the intercepted communication to the second agent 2120'.

The client agent 2120 and/or interceptor 2350 may operate at or interface with a protocol layer in a manner transparent to any other protocol layer of the network stack 2310. For example, in one embodiment, the interceptor 2350 operates or interfaces with the transport layer of the network stack 2310 transparently to any protocol layer below the transport layer, such as the network layer, and any protocol layer above the transport layer, such as the session, presentation or application layer protocols. This allows the other protocol layers of the network stack 2310 to operate as desired and without modification for using the interceptor 2350. As such, the client agent 2120 and/or interceptor 2350 can interface with the transport layer to secure, optimize, accelerate, route or load-balance any communications provided via any protocol carried by the transport layer, such as any application layer protocol over TCP/IP.

Furthermore, the client agent 2120 and/or interceptor may operate at or interface with the network stack 2310 in a manner transparent to any application, a user of the client 2102, and any other computing device, such as a server, in communications with the client 2102. The client agent 2120 and/or interceptor 2350 may be installed and/or executed on the client 2102 in a manner without modification of an application. In some embodiments, the user of the client 2102 or a computing device in communications with the client 2102 are not aware of the existence, execution or operation of the client agent 2120 and/or interceptor 2350. As such, in some embodiments, the client agent 2120 and/or interceptor 2350 is installed, executed, and/or operated transparently to an application, user of the client 2102, another computing device, such as a server, or any of the protocol layers above and/or below the protocol layer interfaced to by the interceptor 2350.

The client agent 2120 includes an acceleration program 2302, a streaming client 2306, and/or a collection agent 2304. In one embodiment, the client agent 2120 comprises an Independent Computing Architecture (ICA) client, or any portion thereof, developed by Citrix Systems, Inc. of Fort Lauderdale, Fla., and is also referred to as an ICA client. In some embodiments, the client 2120 comprises an application streaming client 2306 for streaming an application from a server 2106 to a client 2102. In some embodiments, the client agent 2120 comprises an acceleration program 2302 for accelerating communications between client 2102 and server 2106. In another embodiment, the client agent 2120 includes a collection agent 2304 for performing end-point detection/scanning and collecting end-point information for the appliance 2200 and/or server 2106.

In some embodiments, the acceleration program 2302 comprises a client-side acceleration program for performing one or more acceleration techniques to accelerate, enhance or otherwise improve a client's communications with and/or access to a server 2106, such as accessing an application provided by a server 2106. The logic, functions, and/or operations of the executable instructions of the acceleration program 2302 may perform one or more of the following acceleration techniques: 1) multi-protocol compression, 2) transport control protocol pooling, 3) transport control protocol multiplexing, 4) transport control protocol buffering, and 5) caching via a cache manager Additionally, the acceleration program 2302 may perform encryption and/or decryption of any communications received and/or transmitted by the client 2102. In some embodiments, the acceleration program 2302 performs one or more of the acceleration techniques in an integrated manner or fashion. Additionally, the acceleration program 2302 can perform compression on any of the protocols, or multiple-protocols, carried as payload of network packet of the transport layer protocol The streaming client 2306 comprises an application, program, process, service, task or executable instructions for receiving and executing a streamed application from a server 2106. A server 2106 may stream one or more application data files to the streaming client 2306 for playing, executing or otherwise causing to be executed the application on the client 2102. In some embodiments, the server 2106 transmits a set of compressed or packaged application data files to the streaming client 2306. In some embodiments, the plurality of application files are compressed and stored on a file server within an archive file such as a CAB, ZIP, SIT, TAR, JAR or other archive. In one embodiment, the server 2106 decompresses, unpackages or unarchives the application files and transmits the files to the client 2102. In another embodiment, the client 2102 decompresses, unpackages or unarchives the application files. The streaming client 2306 dynamically installs the application, or portion thereof, and executes the application. In one embodiment, the streaming client 2306 may be an executable program. In some embodiments, the streaming client 2306 may be able to launch another executable program.

The collection agent 2304 comprises an application, program, process, service, task or executable instructions for identifying, obtaining and/or collecting information about the client 2102. In some embodiments, the appliance 2200 transmits the collection agent 2304 to the client 2102 or client agent 2120. The collection agent 2304 may be configured according to one or more policies of the policy engine 2236 of the appliance. In other embodiments, the collection agent 2304 transmits collected information on the client 2102 to the appliance 2200. In one embodiment, the policy engine 2236 of the appliance 2200 uses the collected information to determine and provide access, authentication and authorization control of the client's connection to a network 2104.

In one embodiment, the collection agent 2304 comprises an end-point detection and scanning mechanism, which identifies and determines one or more attributes or characteristics of the client. For example, the collection agent 2304 may identify and determine any one or more of the following client-side attributes: 1) the operating system and/or a version of an operating system, 2) a service pack of the operating system, 3) a running service, 4) a running process, and 5) a file. The collection agent 2304 may also identify and determine the presence or versions of any one or more of the following on the client: 1) antivirus software, 2) personal firewall software, 3) anti-spam software, and 4) internet security software. The policy engine 2236 may have one or more policies based on any one or more of the attributes or characteristics of the client or client-side attributes.

In some embodiments and still referring to FIG. 15, a first program 2322 may be used to install and/or execute the client agent 2120, or portion thereof, such as the interceptor 2350, automatically, silently, transparently, or otherwise. In one embodiment, the first program 2322 comprises a plugin component, such an ActiveX control or Java control or script that is loaded into and executed by an application. For example, the first program comprises an ActiveX control loaded and run by a web browser application, such as in the memory space or context of the application. In another embodiment, the first program 2322 comprises a set of executable instructions loaded into and run by the application, such as a browser. In one embodiment, the first program 2322 comprises a designed and constructed program to install the client agent 2120. In some embodiments, the first program 2322 obtains, downloads, or receives the client agent 2120 via the network from another computing device. In another embodiment, the first program 2322 is an installer program or a plug and play manager for installing programs, such as network drivers, on the operating system of the client 2102.

Figure 16:
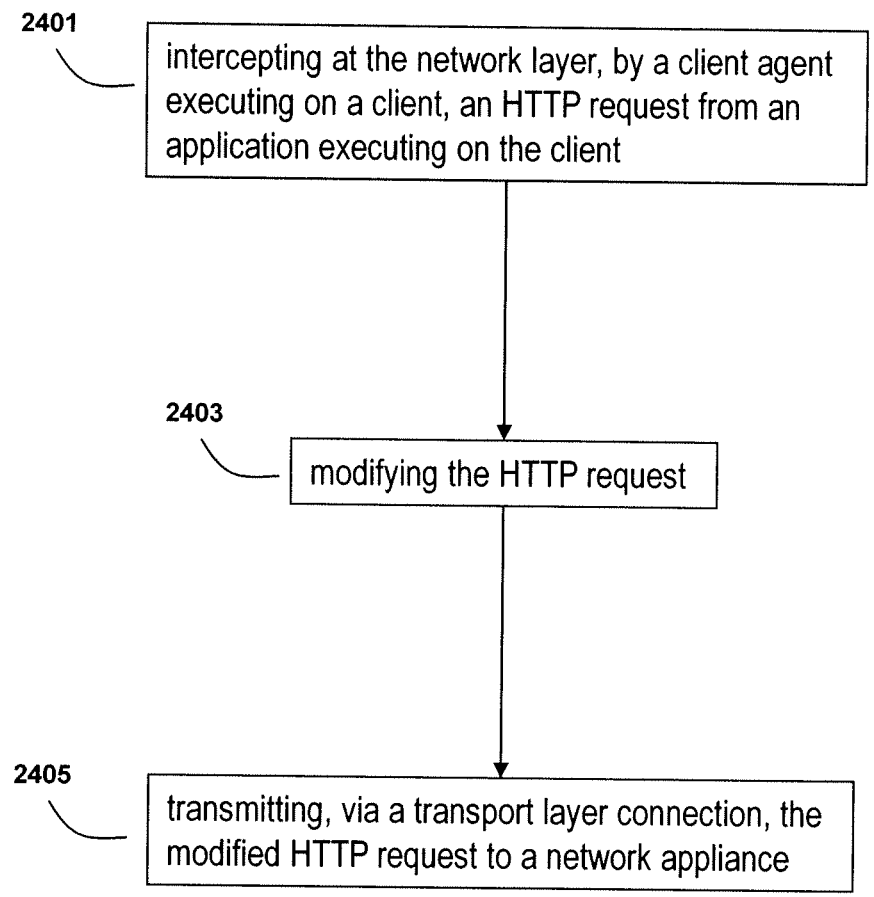
FIG. 16 is a block diagram of one embodiment of a method for using a client agent operating in a virtual private network environment to intercept HTTP communications.

Referring now to FIG. 16, one embodiment of a method for using a client agent 2120 operating in a virtual private network environment to intercept HTTP communications is shown. In brief overview, the method comprises intercepting at the network layer, by a client agent 2120 executing on a client, an HTTP request from an application executing on the client (step 2401); modifying the HTTP request (step 2403); and transmitting, via a transport layer connection, the modified HTTP request to a network appliance 2200 (step 2405).

Still referring to FIG. 16, now in greater detail, a client agent 2120 executing on a client intercepts at the network layer an HTTP request from an application executing on the client (step 2401). This interception may be performed by any means, including without limitation the use of a TDI driver as discussed herein. Although in the embodiment shown, the interception occurs at the network layer, in other embodiments, the interception may occur at the session layer or the transport layer. The application may comprise any application using the HTTP protocol, including without limitation web browsers and web applications.

In some embodiments the interception may be performed transparently to the user, the application, or both. In some embodiments the interception may be performed transparently to one or more layers of the network stack above or below the layer at which the interception occurs.

After intercepting at the network layer, by the client agent, an HTTP request from an application executing on the client (step 2401); the client agent may modify the HTTP request (step 2403).

In some embodiments, the client agent may modify the HTTP request by adding, removing, or modifying a cookie contained within the HTTP request. The client agent may add, remove, or modify a cookie in order to perform any of the functions associated with a client agent described herein.

In one embodiment, a client agent may add an HTTP cookie comprising authentication credentials to be transmitted to a VPN appliance 2200 as described herein.

In another embodiment, a client agent may add an HTTP cookie comprising caching information. For example, a client agent may add an HTTP cookie comprising information that the client agent has stored a previous version of a requested resource. A network appliance receiving the inserted cookie may then transmit only the portions of the requested resource that have changed since the previously stored version. One specific method of caching which may employ this technique will be discussed beginning at FIG. 19.

In some embodiments, the client agent 2120 may modify the HTTP request by adding, removing, or modifying a name-value pair contained in the HTTP request. These name-value pairs may be modified in conjunction with any of the functions performed by the client agent, including acceleration, pooling, caching, and security. In one embodiment, the client agent may name-value pairs in an HTTP header.

For example, a client agent may modify, add, or remove a value following the "connection" HTTP message header, to indicate that the client agent wishes to keep the HTTP connection open rather than closed. This may be done by inserting a "keep-alive" value, or removing a "close" value.

Or, for example, a client agent may modify, add or remove a value following a "referrer" HTTP message header for security purposes. Removing the "referrer" variable may be desired to minimize the knowledge website operators can gain about the client's browsing history.

Or, for example, a client agent may modify, add, or remove a value following a "authorization" HTTP message header. The client agent may insert or remove security credentials on behalf of the client in order to provide secure access to resources.

Or, for example, a client agent may modify, add, or remove a value following a "cache-control." This may be used to support or enhance any of the caching features described herein.

In some embodiments, the client agent may add, remove, or modify a name-value pair in a URL specified by the HTTP request, in accordance with any of the functions described herein. In still other embodiments, the client agent may rewrite the requested URL itself.

In some embodiments, the client agent may further determine a routing decision based on a URL specified in the HTTP header. For example, if a client is requesting a URL that corresponds to a file associated with a given application server, the client agent may route the client request directly to the application server.

After modifying the HTTP request (step 2403) the client agent may transmit, via a transport layer connection, the modified HTTP request to a network appliance 2200 (step 2405). This transmission may occur via any transport layer protocols. In one embodiment, the HTTP request may be transmitted via an SSL connection to the network appliance 2200. The client agent may perform any of the functions described herein on the transmission of the HTTP request, including acceleration and compression.

A client agent may also use HTTP information contained in intercepted packets to provide or enhance any of the client agent functions described herein.

For example, a client agent may use HTTP information to efficiently route client requests. A client agent may establish connections to a plurality of appliances 2200 which provide caching functions. The client agent may then intercept a packet comprising a request for a given URL and determine that the URL has previously been requested by the client via a given appliance. The client agent may then route the packet comprising the HTTP request to the given appliance so that any objects cached by the appliance can be utilized in a response.

Or, for example, a client agent may use HTTP information to determine whether a request should be sent over an established SSL/VPN tunnel. In one embodiment, a client agent may intercept one or more packets comprising an HTTP request, and examine a URL contained in the request. The client agent may then determine, based on a domain name specified in the URL, whether to transmit the packet via an established SSL/VPN tunnel or to transmit the packet via other connections. For example, a company may configure a client agent policy so that client agents executing on employee computers transmits any requests for URLs specifying the company domain name via an established SSL/VPN connection with an appliance operated by the company.

Figure 17:
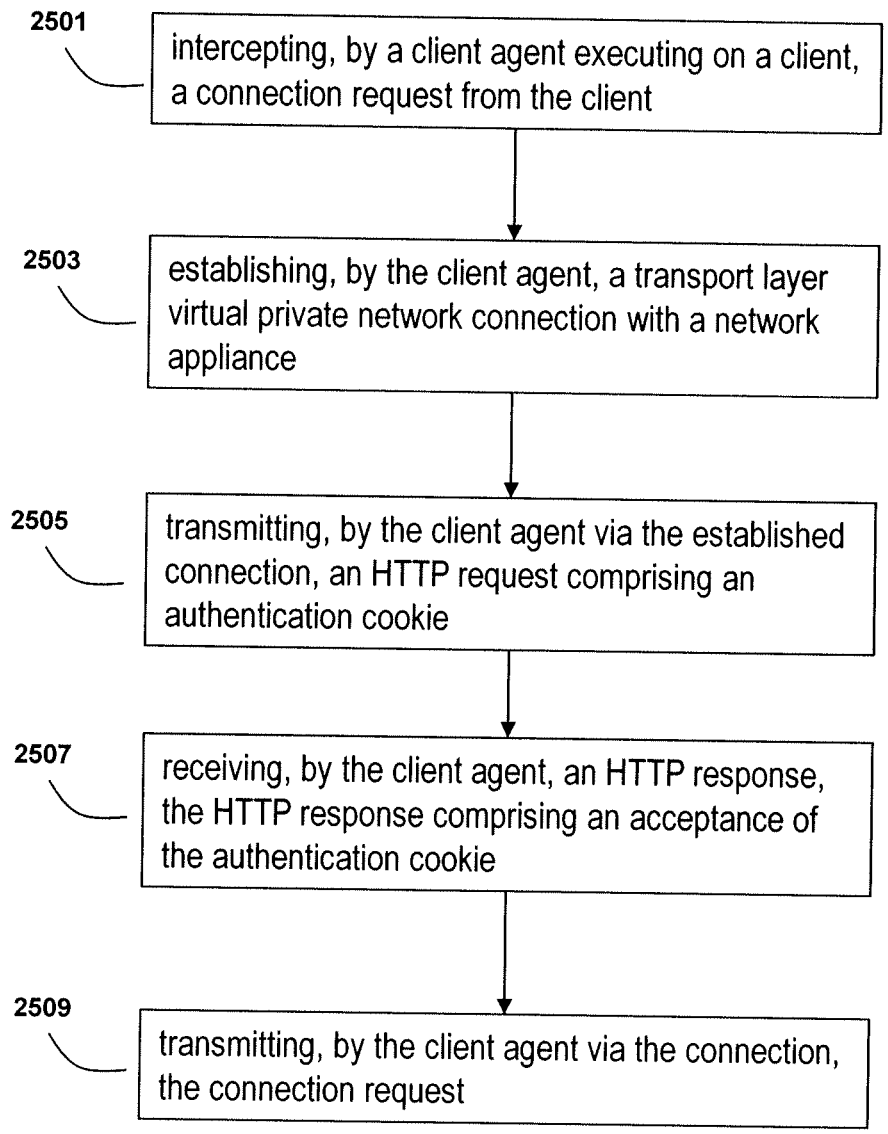
FIG. 17 is a block diagram of one embodiment of a method for using a client agent to enable HTTP cookie authentication.

Referring now to FIG. 17, one embodiment of a method for using a client agent to enable HTTP cookie authentication in non-HTTP communications from a client is shown. In brief overview, the method comprises: intercepting, by a client agent executing on a client, a connection request from the client (step 2501); establishing, by the client agent, a transport layer virtual private network connection with a network appliance (step 2503); transmitting, by the client agent via the established connection, an HTTP request comprising an authentication cookie (step 2505); receiving, by the client agent, an HTTP response, the HTTP response comprising an acceptance of the authentication cookie; (step 2507) and transmitting, by the client agent via the connection, the connection request (step 2509).

Still referring to FIG. 17, now in greater detail, a client agent 2120 executing on a client 2102 intercepts a connection request from the client (step 2501). This interception may occur via any of the methods discussed herein, including via a TDI driver. The connection request may comprise a request from the client to open any type of network connection, including non-HTTP connections. In one embodiment, the connection request may comprise a TCP SYN packet.

After intercepting a connection request from the client (step 2501) the client agent may establish a transport layer virtual private network connection with a network appliance (step 2503). This connection may comprise any transport layer protocol described herein. In one embodiment, the transport layer VPN connection may comprise an SSL connection. In some embodiments, the client agent may utilize a previously existing SSL VPN connection. In still other embodiments, the client agent may establish a new connection within a previously existing VPN connection. In these embodiments, the new connection may be pooled or multiplexed with other connections within the existing VPN connection.

After establishing the transport layer VPN connection (step 2503), the client agent may transmit, via the established connection, an HTTP request comprising an authentication cookie (step 2505). In some embodiments, the HTTP request may comprise an authentication cookie previously transmitted to the client by the network appliance. For example, a client agent may establish an SSL VPN connection with a network appliance 2200, and may receive from the network appliance an authentication cookie. If the client agent desires to open a second connection with the network appliance, the client agent may then retransmit the received cookie, providing authentication without requiring a second logon procedure.

An authentication cookie may comprise any authentication information transmitted via an HTTP request. In one embodiment, the authentication cookie may comprise an authentication string, which allows the network appliance to verify the identity of a user of the client. In another embodiment, the authentication cookie may comprise an authentication string which allows the network appliance to verify a request corresponds to a particular user session. In still another embodiment, the authentication cookie may comprise an authentication string which allows the network appliance to verify a request corresponds to a particular application session.

In one embodiment, the client agent may ensure that the HTTP request comprising the authentication cookie is the first data sent via the new connection. For example, after the connection is established, the client agent may transmit an HTTP request "GET URL HTTP/1.1\r\n . . . " followed by an authentication cookie. In one embodiment, the client agent may queue any data the client attempts to send following the connection request until the HTTP request is transmitted. In another embodiment, the client agent may queue any data the client attempts to send following the connection request until an HTTP response is received from the network appliance.

After transmitting, via the established connection, an HTTP request comprising an authentication cookie (step 2505); the client agent may receive an HTTP response, the HTTP response comprising an acceptance of the authentication cookie (step 2507).

After receiving the HTTP response comprising an acceptance of the authentication cookie; (step 2507) the client agent may transmit via the established connection, the connection request (step 2509). The client agent may then perform any additional steps to service the connection request and establish the requested connection. The client agent may then transmit any data that had been queued for the requested connection.

Figure 18:
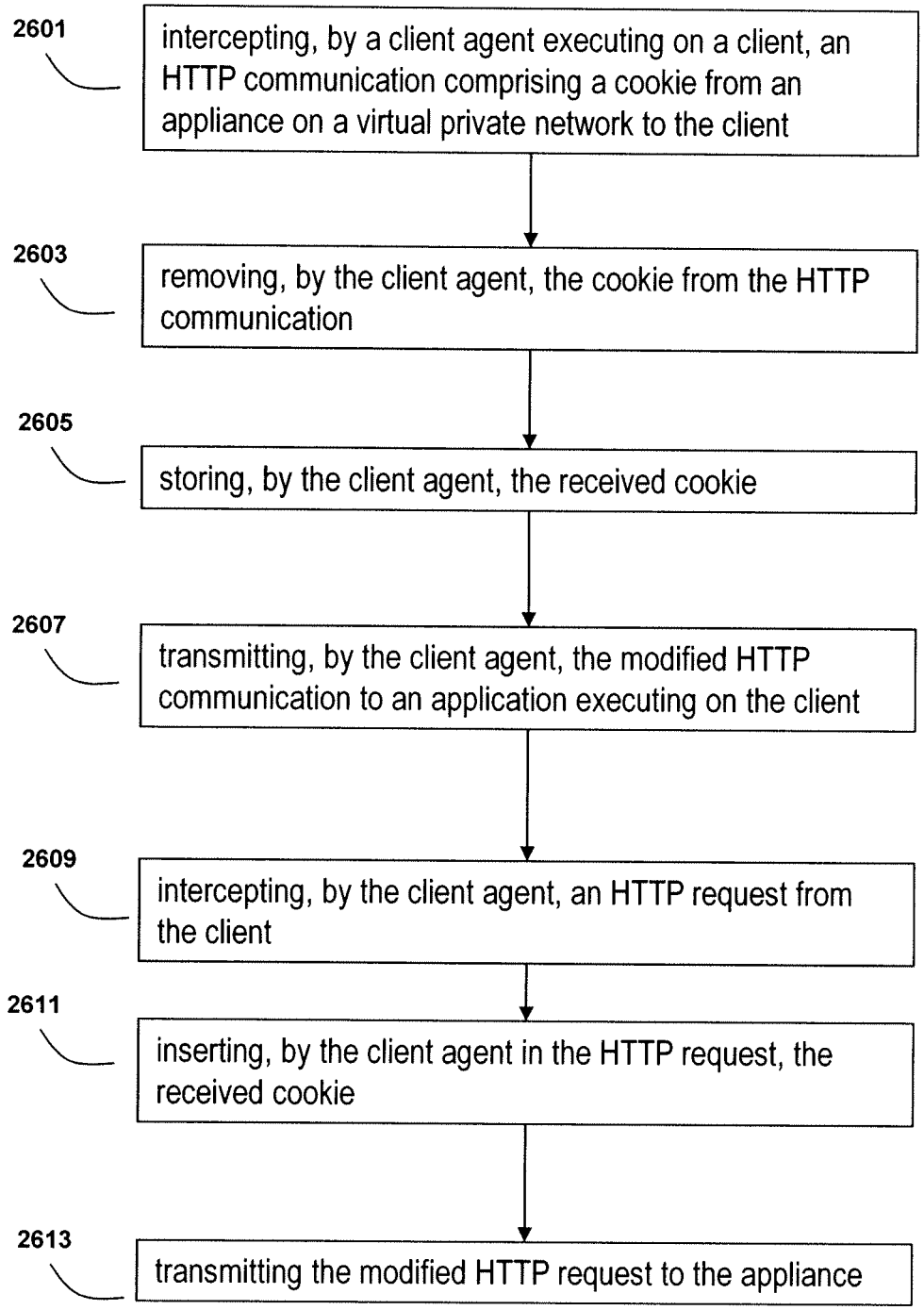
FIG. 18 is a block diagram of a method for using a client agent to enable secure authentication in a virtual private network environment using an HTTP cookie.

Referring now to FIG. 18, a method for using a client agent to enable secure authentication in a virtual private network environment using an HTTP cookie is shown. In brief overview, the method comprises: intercepting, by a client agent executing on a client, an HTTP communication comprising a cookie from an appliance on a virtual private network to the client (step 2601); removing, by the client agent, the cookie from the HTTP communication (step 2603); storing, by the client agent, the received cookie (step 2605); transmitting, by the client agent, the modified HTTP communication to an application executing on the client (step 2607); intercepting, by the client agent, an HTTP request from the client (step 2609); inserting, by the client agent in the HTTP request, the received cookie (step 2611); and transmitting the modified HTTP request to the appliance (step 2613).

Still referring to FIG. 18, now in greater detail, a client agent 2120 executing on a client 2102 intercepts an HTTP communication comprising a cookie from an appliance on a virtual private network to the client (step 2601). This cookie may comprise any authentication credentials, including without limitation user-specific, session-specific, and application-specific authentication credentials. In some embodiments, the cookie may be transmitted from the appliance to the client in response to a logon request and associated information from the client. The client agent may intercept the communication using any means described herein, including a TDI driver.

After intercepting the HTTP communication comprising a cookie from an appliance on a virtual private network to the client (step 2601); the client agent may remove the cookie from the HTTP communication (step 2603). The client agent may delete the cookie from the HTTP response by removing the name-value pair or pairs in the HTTP header that comprise the cookie.

In some embodiments, the client agent may also add, remove, or modify other name-value pairs in the received HTTP header in accordance with any of the embodiments discussed herein. In one embodiment, the client agent may add, remove, or modify the HTTP header such that any information in the received HTTP header resulting from previous client agent alterations to an HTTP request is masked from the client. For example, a client agent may insert a name-value pair in an HTTP request identifying a plurality of versions of the requested resource which are currently cached on the client. The client agent may then receive an HTTP response comprising a file consisting of changes from one of the identified versions, as well as a name-value pair in the HTTP header identifying which version was used as the base. The client agent may remove this name-value pair in addition to assembling the updated version such that the caching techniques are transparent to the client application.

After removing, by the client agent, the cookie from the HTTP communication (step 2603); the client agent may store the received cookie (step 2605). The client agent may store the received cookie using any storage method or device. In one embodiment, the client agent may store the cookie as a file on disk. In another embodiment, the client agent may store the cookie in RAM. The client agent may use any methods of sorting or indexing the stored cookie, including without limitation indexing by user, session, application, appliance, connection, or VPN.

After storing the received cookie (step 2605) the client agent may then transmit the modified HTTP communication to an application executing on the client (step 2607). The modified HTTP communication may be transmitted to the client using any means described herein, including a TDI driver.

After transmitting the modified HTTP communication to an application executing on the client, the client agent may intercept an HTTP request from the client (step 2609). The interception may occur via any of the means discussed herein, including a TDI driver. The HTTP request may be from the application the HTTP response was transmitted to, or the HTTP request may be from a second application. In some embodiments, the client agent may intercept HTTP requests from a plurality of applications.

After intercepting an HTTP request from the client (step 2609) the client agent may then insert, in the HTTP request, the received cookie (step 2611). The client agent may insert the HTTP cookie by searching a file, directory, or database for the received cookie, and then inserting the cookie into the request. In some embodiments, the client agent may contain an HTTP parser such that the client agent can identify the payload boundary of the HTTP request.

After inserting, in the HTTP request, the received cookie (step 2611); the client agent may transmit the modified HTTP request to the appliance (step 2613). This transmission may via any method described herein. In some embodiments, the client agent may then receive an HTTP response from the appliance indicating the cookie is accepted.

In some embodiments, the client agent may provide further cookie management functionality. For example, the client agent may detect when a VPN session has ended, and delete any stored cookies corresponding to the VPN session.

Referring now to FIGS. 19 through 23, a detailed example of a caching and update method is shown which may utilize any of the client cookie management and HTTP aware functionality previously discussed.

Figure 19:
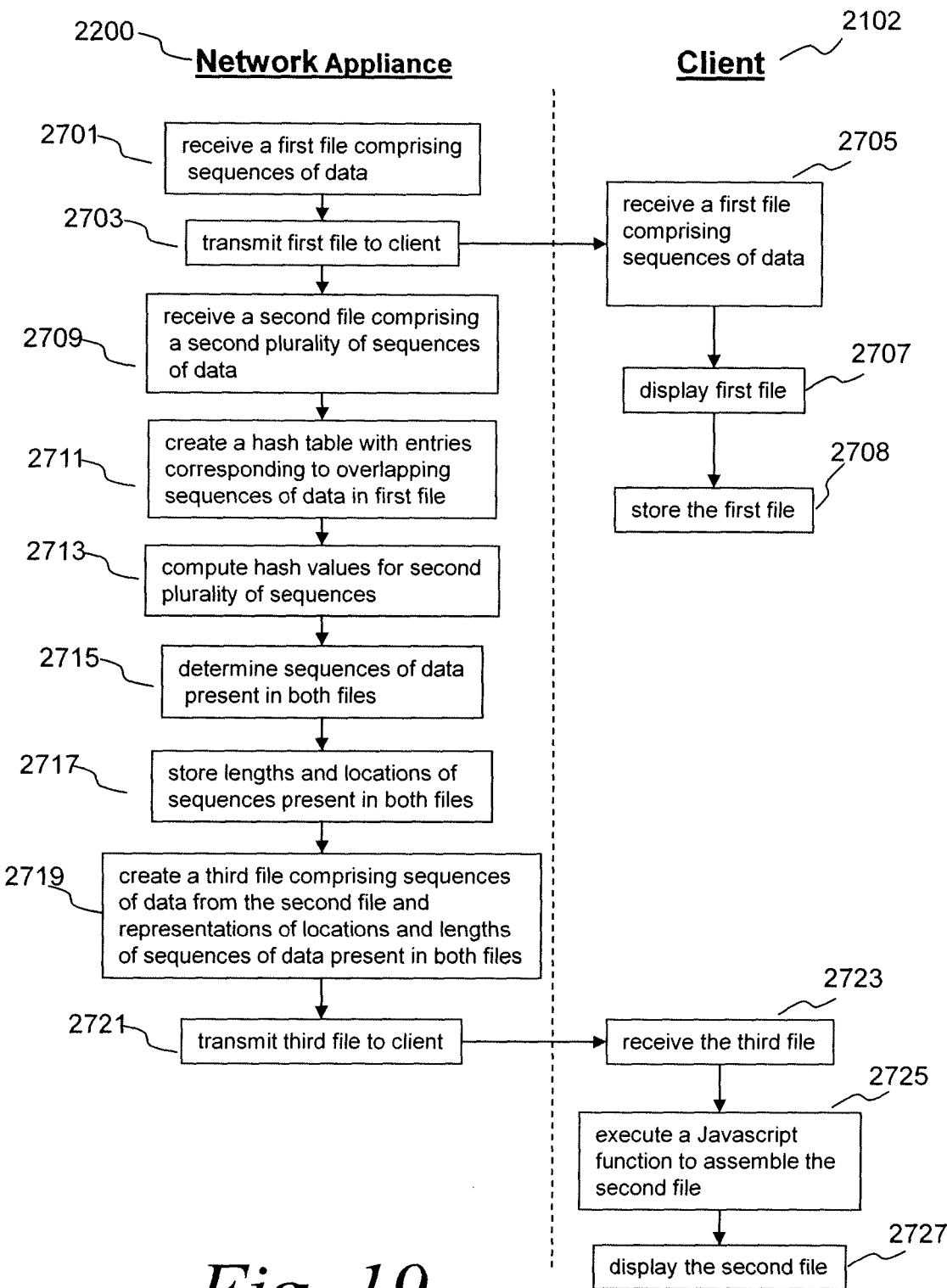
FIG. 19 is a flow diagram depicting one embodiment of a method for creating an efficient update to a previously stored file.

Referring now to FIG. 19 one embodiment of a method for creating an efficient update to a previously stored file is shown. Although FIG. 19 depicts the method in the context of being performed by a network appliance 2200 and a client 2102, the method may be performed by any of the computing devices discussed herein either alone or in any combination. In brief overview, the method comprises: receiving a first file comprising a first plurality of sequences of data (step 2701); transmitting the first file to a client or client agent (step 2703); receiving a second file comprising a second plurality of sequences of data (step 2709); creating a hash table having a plurality of entries, each of the plurality of entries corresponding to a respective one of the first plurality of sequences, and wherein at least two of said entries correspond to overlapping sequences of data (step 2711); computing hash values for said second plurality of sequences of data (step 2713); comparing each of the second plurality of sequences of data with sequences from the first plurality of sequences having the same hash value to determine sequences of data present in both files (step 2715); storing representations of lengths and locations of said sequences of data present in both the first and second files (step 2717); creating a third file comprising sequences of data from the second file and representations of locations and lengths of said sequences of data present in both the first and second files (step 2719); and transmitting the third file to a client or client agent (step 2721).

Still referring to FIG. 19, and now in greater detail, the network appliance 2200 receives a first file comprising a first plurality of sequences of data (step 2701). In some embodiments the first file may be received from a network 2211', from a server 2205, from a database, or from any combination thereof. In some embodiments the first file may be read from a disk or other storage medium, retrieved from a cache, or accessed from RAM. In other embodiments the first file may be received from an application or process executing on the network appliance 2200. In some embodiments, the first file may comprise a file requested by a client or client agent.

The first file may comprise sequences of data corresponding to sequences of bits or bytes comprising the file. The first file may comprise any file protocol, including without limitation, HTML, XML, WML, SVG, other document protocols, image file protocols, sound file protocols, video file protocols, and binary file protocols. In some embodiments the file comprises a web page or a portion of a web page. In some embodiments the file comprises any web page that is updated with some frequency, including without limitation a news page, a web application page, a chat room, a bulletin board, a sports page, an e-mail page, a directory listing, a tracking page, and a webcam page. After receiving the first file, the network appliance 2200 may store or cache the first file to permit later retrieval. In some embodiments the network appliance 2200 may modify said first file in accordance with any of the network appliance functions described herein.

In some embodiments, after receiving the first file (step 2701), the network appliance 2200 transmits the first file to a client (step 2703). The network appliance 2200 may transmit the first file via any of the networks, or protocols described herein, and to any of the clients or client agents described herein. The network appliance 2200 may modify the first file in accordance with any of the functions performed by the network appliance, including compression, acceleration and encryption. Although FIG. 19 depicts the network appliance 2200 transmitting the first file immediately after step 2701, in other embodiments said transmittal could occur after any of the steps (steps 2705-2721) occurring after the network appliance 2200 receives the first file (step 2701).

In some embodiments, the network appliance 2200 may store a record of said transmission. Said record may be stored in any memory element, including a data base or cache. In one embodiment, the network appliance 2200 may access said cache to determine whether a given file has been previously transmitted to a client. In one embodiment, said records may be set to expire after a set amount of time. For example, if a network appliance 2200 has information indicating that a given client 2102 deletes all files from its cache at the end of each day, the network appliance may set all records of files transmitted to the client 2102 to expire at the end of each day.

In the embodiment shown, after the network appliance 2200 transmits the first file to the client 2102 (step 2703), the client may then receive the first file (step 2705), display the first file (step 2707), and store the first file (step 2708). The client may perform these steps in accordance with any of the embodiments described herein.

In the embodiment shown, after the network appliance 2200 transmits the first file to the client 2102 or client agent 2120 (step 2703), the network appliance receives a second file comprising a second plurality of sequences of data (step 2709). In other embodiments, the network appliance 2200 may receive the second file (step 2709) before or during the transmission of the first file to the client (step 2703). The second file may comprise any of the file types, protocols, web pages and portions of web pages discussed herein. After receiving the second file, the network appliance 2200 may store or cache the second file to permit later retrieval. In some embodiments the network appliance 2200 may modify said second file in accordance with any of the network appliance functions described herein.

In some embodiments, the second file may comprise a file requested by a client agent. In one embodiment, the client agent may transmit a request to the network appliance for the second file, the request comprising information identifying that the client agent has a stored copy of the first file. In some embodiments, this request may be an HTTP request. For example, a client agent may transmit an HTTP request for a news web page. The client agent may insert in the HTTP request the following name-value pair "previously-stored-version=826482764" where 826482764 may comprise a serial number or timestamp corresponding to a prior version of the news web page stored earlier (and thus corresponding to the first file discussed with respect to this figure). The appliance 2200 may then use this serial number or timestamp to retrieve the first file from its own storage.

After receiving the second file comprising a second plurality of sequences of data (step 2709), the network appliance may create a hash table having a plurality of entries, each of the plurality of entries corresponding to a respective one of the first plurality of sequences, and wherein at least two of said entries correspond to overlapping sequences of data (step 2711). Said hash table may be created according to any known hash table algorithm which provides functionality to store sequences of data or references to sequences of data as entries and then efficiently search said table for entries matching a given sequence. In other embodiments, the network appliance may create the hash table (step 2711) before or during receiving the second file (step 2709).

In some embodiments, the entries in the hash table may correspond to sequences of data from the first file comprising sequences of bytes. The sequences of bytes may be of any length. In one embodiment the sequences are four-byte sequences.

In the embodiment shown, at least two of the hash table entries correspond to overlapping sequences of data. Overlapping sequences may have any number of bytes in common. For example if the file comprised the sequence "abcdefghijklmnop", examples of overlapping four-byte sequences include "cdef" and "defg" in addition to "cdef" and fghi." In one embodiment, the hash table entries correspond to successive overlapping byte sequences. For example, if the file comprised the sequence "abcdefg", a hash table comprising at least two successive overlapping four-byte sequences may include entries corresponding to the sequences "abcd" "bcde" "cdef" and "defg".

In some embodiments, the hash table entries at a given time may only correspond to sequences of data from a given portion or "window" of the first file. This allows the size of the hash table to be smaller than the hash table might be if the entire file was hashed at once. In some embodiments, only the first X bytes of the first file are hashed, and then, upon occurrence of some conditions, Y entries are removed from the table followed by Y more entries being added to the table. In one embodiment a window size of 64 kilobytes is used, and upon occurrence of certain conditions, the window is moved by 32 kilobytes. In this embodiment, the sequences from the first 64 kilobytes of the first file are hashed, and then upon occurrence of certain conditions, the entries corresponding sequences from the first 32 kilobytes of the file are removed, and entries corresponding to sequences from the next 32 kilobytes of the file are added.

The conditions upon which the hash window are moved may be any conditions which improve the execution time, performance, or compression of the hashing algorithm. In one embodiment, the window is moved when matches have been found for more than 85% of the sequences in a given half of the window. In another embodiment, the window is moved when a given percentage of the second file has been compared with the existing hash entries. In one embodiment, the window is moved when hash values have been computed and compared for a proportionate portion of the second file compared to the first file. For example, if the first file is 100 kilobytes, and the second file is 80 kilobytes, the hash window may be moved when 80/100*64 kilobytes of the second file has been compared to sequences in the hash table.

After the network appliance 2200 creates a hash table (step 2711), the network appliance 2200 may then compute hash values for said second plurality of sequences of data (step 2713). Said hash values may be computed according to the same method used to compute hash values for the first plurality of sequences. The network appliance 2200 may choose sequences of data from the second file in the same manner in which the network appliance chose sequences of data from the first file. For example, if the network appliance 2200 created hash table entries corresponding to successive overlapping four-byte sequences from the first file, the network appliance may choose to compute hash values for successive overlapping four-byte sequences from the second file.

After computing hash values for some or all of the second plurality of sequences of data (step 2713) the network appliance 2200 may compare each of the second plurality of sequences of data with sequences from the first plurality of sequences having the same hash value to determine sequences of data present in both files (step 2715). The network appliance may perform this step in accordance with any hashing algorithm presently available. Said comparisons may comprise a comparison of subsequent bytes of matched sequences to determine longer matches. For example, the first file may comprise the sequence "abcdefghijklmno" and the second file may comprise the sequence "zyxwvutcdefghituv." If the hashing is done on successive four-byte sequences, the network appliance 2200 may determine that the sequence "cdef" is present in both files. The network appliance 2200 may then compare subsequent bytes of the matched sequences to determine that the sequence "cdefghi" is present in both files. Thus in some embodiments the lengths of the sequences determined to be present in both files may vary from the lengths of the sequences for which hash values are computed. In some embodiments a minimum and maximum length on matching sequences may be set.

After determining sequences of data present in both files (step 2715) the network appliance 2200 may store representations of lengths and locations of said sequences of data present in both the first and second files (step 2717). The network appliance 2200 may store said representations in any storage medium, including a cache, RAM, a disk, or tape. In some embodiments, the network appliance 2200 may store said representations on the network appliance 2200 itself. In other embodiments, the network appliance 2200 may store said representations on another computing device 2100. In some embodiments, lengths and locations of a sequences of data may be stored while the network appliance 2200 is comparing each of the second plurality of sequences of data with sequences from the first plurality of sequences having the same hash value (step 2713). In other embodiments a minimum length may be required for the length and location of a given sequence to be stored. In one embodiment, the minimum length may be specified to be four bytes.

The representations of lengths and locations of said sequences present in both files may comprise any representation which identifies a length and location of a sequence. In some embodiments the locations of said sequences are stored as absolute locations within a file. In other embodiments, the locations of said sequences are stored as locations relative to a given reference pointer within said first file. In one embodiment, said reference pointer may be fixed, in another embodiment said reference pointer may move according to a rule set.

In one embodiment the reference pointer may be initially set to point to the beginning of the first file. The pointer may then be incremented every time a matching sequence of longer than 5 bytes is found. The pointer may then be incremented to point to the last byte plus one of the matching sequence in the first file. In this embodiment, locations of said sequences present in both files are stored as a given number bytes, positive or negative, from the position of the reference pointer.

In some embodiments, the lengths and locations of the matched sequences are stored as fixed length integers. In one embodiment, the length of a matched sequence is stored as a 1 byte integer, wherein the integer represents a length of between 4 to 1027 bytes. In this embodiment, byte-lengths of matched sequences are restricted to multiples of 4. In other embodiments, any other bit or byte length integers may be used to store said sequence lengths. In still other embodiments, any other restrictions may be imposed on byte-lengths of matched sequences, including minimum and maximum lengths, and limiting byte lengths to given multiples. In still other embodiments, lengths of matched sequences may be stored as variable length integers. In some embodiments locations of matched sequences may be stored as variable length integers. In other embodiments, locations of matched sequences are stored as fixed length integers of a given byte or bit length.

After the network appliance 2200 stores representations of lengths and locations of said sequences of data present in both the first and second files (step 2717), the network appliance 2200 may create a third file comprising sequences of data from the second file and representations of locations and lengths of said sequences of data present in both the first and second files. Said creation (step 2717) may occur after all the lengths and locations of matched sequences are stored, or said creation (2717) may occur contemporaneously as matched sequences are found. The third file may contain representations of lengths and locations in any format discussed herein. In some embodiments lengths and locations of shared sequences may be preceded by special byte or bit sequences.

For example, if a first file comprised the string "abcdefghijklmnop," and the second file comprised the string "xxxxxxxdefghijkxxxxxxcdefxxx", the third file may comprise the sequence "xxxxxxx3,8xxxxxx2,4xxx". In this example 3,8 is used to indicate a representation indicating the sequence from the first file starting at byte 3 and 8 bytes long (in some embodiments this representation could be two fixed-length binary integers). Likewise 2,4 indicates that a representation indicating the sequence from the first file starting at byte 2 and 4 bytes long.

As another example, if the first file comprised the string "abcdefghijklmnop," and the second file comprised the string "xxxxxxxdefghijkxxxxxxcdefxxx", the third file may comprise the sequence "xxxxxxx3,8xxxxxx-9,4xxx". In this example, locations of shared sequences are stored as relative distances from a reference pointer, incremented according to the method described above. In this example, the network appliance 2200 indicates the first matched sequence in the same manner as the previous example, since the reference pointer initially points to the beginning of the first file. The reference pointer would then be incremented to point to location of the last byte plus one of the matching sequence in the first file. Thus, the second matched sequence is indicated with -9,4 which indicates that the second matched sequence occurs nine bytes prior to the byte following the previous matched sequence in the first file.

In one embodiment, the third file may be encoded in a byte protocol, such as ASCII. In one embodiment, each group of 7 bytes of binary data may be encoded as 8 bytes of ASCII characters. This conversion may be done by any known conversion method. The ASCII characters may correspond to any existing character set definition, including ISO-8859-1. In some embodiments, the third file may comprise an HTML file. In one embodiment, the third file may comprise a Javascript variable comprising said sequences of data from the second file and representations of locations and lengths of said sequences of data present in both the first and second files. In one embodiment, the third file may also comprise a Javascript function comprising functionality for assembling said second file by processing said Javascript variable. In another embodiment the third file may contain a reference to a Javascript function comprising said functionality.

The following HTML code illustrates one example of a third file that may be transmitted to a client.

```
<HTML>
   <HEAD>
      <SCRIPT>
         var updateFile = "~~~~ "
      <SCRIPT>
   </HEAD>
   <BODY onload=createPage( updateFile )>
   </BODY>
</HTML>
```

In the above example, an HTML file comprises a Javascript variable named "updateFile." Said variable may comprise sequences of data from the second file and representations of locations and lengths of said sequences of data present in both the first and second files. The example above also comprises a call to a Javascript function named "createPage." Said function, which may either be included with the HTML file or stored on the client, may comprise functionality for assembling said second file using the data from the Javascript variable "updateFile." In the example above, a standard HTML browser would execute the "createPage" function upon loading the HTML page. The "createPage" function may also comprise functionality for altering the HTML page to display said second file once the second file is assembled.

After creating a third file comprising sequences of data from the second file and representations of locations and lengths of said sequences of data present in both the first and second files (step 2719); and the network appliance 2200 may transmit the third file to a client (step 2721). Said transmission may occur via any of the networks and methods discussed herein. The network appliance 2200 may modify the third file in accordance with any function performed by the network appliance 2200 including compression, acceleration and encryption.

In some embodiments, the network appliance 2200 may transmit information in the HTTP header of the transmission corresponding to the second file. To continue a previous example, the network appliance might insert the name-value pair "previously-stored-version=826482764" to indicate which version of the file was used as the first file for purposes of the file comparison and compression.

After transmitting the third file to a client (step 2721), the client 2102 may receive the third file (step 2723); execute a Javascript function to recreate the second file comprising sequences of data from the second file and sequences in the first file indicated by the third file (step 2725); and display the second file (step 2727). The client 2102 may perform these steps in accordance with any of the embodiments described herein.

Figure 20:
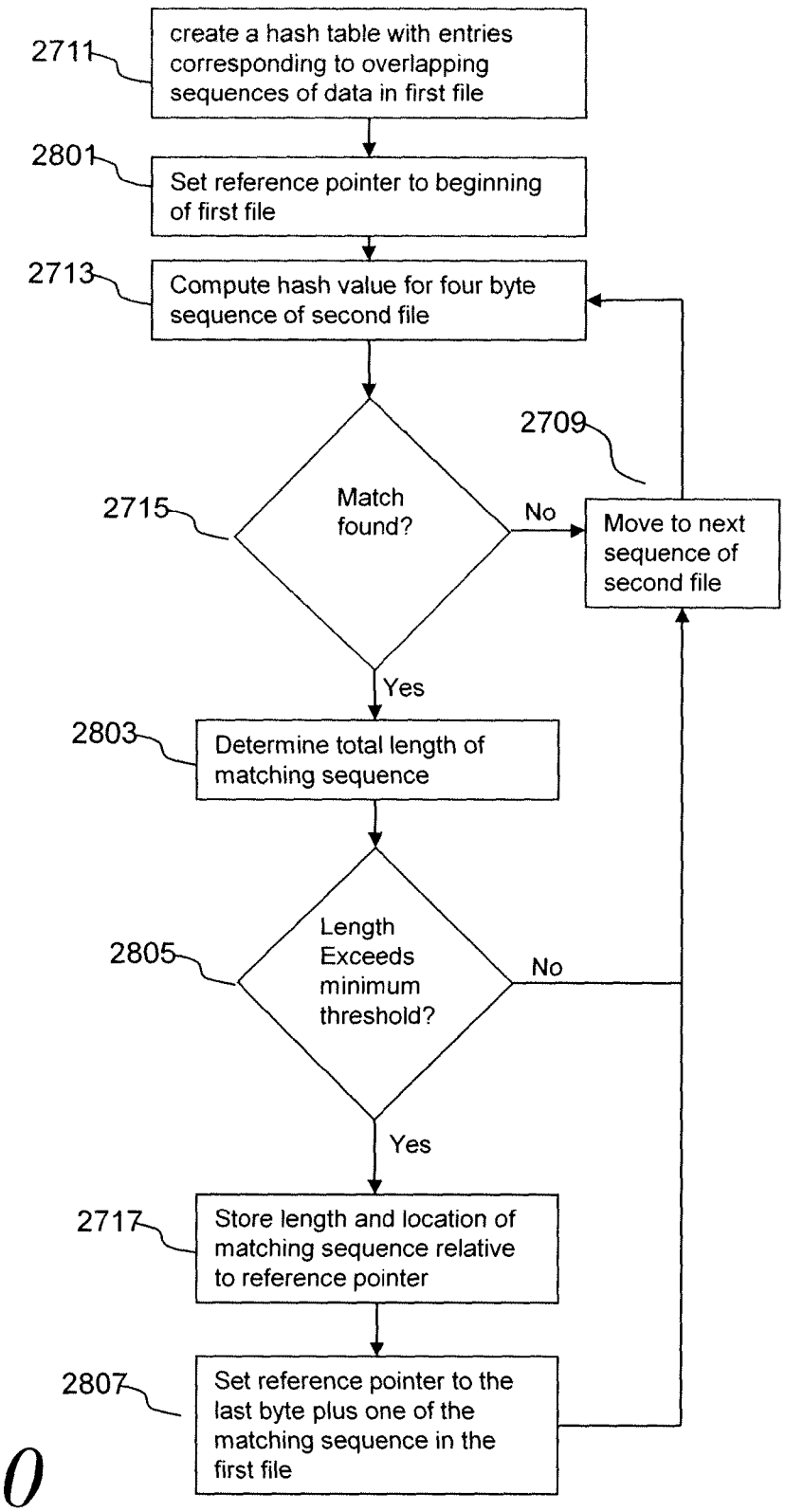
FIG. 20 is a flow diagram depicting another embodiment of a method for creating efficient updates to a previously stored file.

Referring now to FIG. 20, a flow diagram depicting another embodiment of a method for creating efficient updates to a previously stored file is shown. In brief overview, the method comprises creating a hash table with entries corresponding to overlapping sequences of data in a first file (step 2711); setting a reference pointer to the beginning of said first file (step 2801); computing a hash value for a sequence of data in a second file (step 2713); and determining whether said sequence is present in both files (step 2715). The method may then comprise either moving to the next sequence in the second file (step 2809) or determining a total length for the matching sequence (step 2803) and determining whether said length exceeds a minimum threshold (step 2805). The method may then comprise either moving to the next sequence in the second file (step 2809) or storing the length and location of the matching sequence relative to reference pointer (step 2717). The method may then comprise setting the reference pointer to the last byte plus one of the matching sequence in the first file (step 2807) and then moving to the next sequence in the second file (step 2809). In the embodiment shown, the method may be performed by a network appliance 2200.

Still referring to FIG. 20, now in greater detail, a network appliance 2200 creates a hash table with entries corresponding to overlapping sequences of data in a first file (step 2711). This step may be performed in accordance with any of the methods for creating a hash table described herein.

After creating a hash table with entries corresponding to overlapping sequences of data in a first file (step 2711) the network appliance 2200 may set a reference pointer to the beginning of said first file (step 2801). The reference pointer may comprise any type of pointer.

After setting a reference pointer to the beginning of said first file (step 2801), the network appliance 2200 may compute a hash value for a sequence of data in a second file (step 2713). This step may be performed in accordance with any of the methods for computing a hash value described herein.

After computing a hash value for a sequence of data in a second file (step 2713), the network appliance 2200 may determine whether said sequence is present in both files (step 2715). This step may be performed in accordance with any of the methods described herein.

If a sequence is not present in both files, the network appliance 2200 may move to the next sequence of the second file (2809). Said next sequence may comprise any sequence occurring after the given sequence in the second file. In one embodiment, the next sequence may be the sequence starting one byte after the previous sequence. In another embodiment, the next sequence may be the sequence starting any other number of bytes after the previous sequence. In some embodiments moving to the next sequence of the second file (step 2809) may be accompanied by moving a hash window as described previously herein. If no next sequence exists, the method may terminate.

If a sequence is present in both files, the network appliance 2200 may determine a total length of a matching sequence by comparing subsequent bytes of the matched sequences (step 2803). The total length may be determined in accordance with any of the methods described herein.

The network appliance 2200 may then determine if the total length of the matching sequence exceeds a given threshold (step 2805). This determination may be made in accordance with any of the methods described herein. If the length of the matching sequence does not exceed the minimum threshold, the network appliance 2200 may move to the next sequence of the second file.

If the length does exceed the minimum threshold, the network appliance 2200 may then store the length and location of the matching sequence relative to the given reference pointer in accordance with any of the methods discussed herein. The network appliance 2200 may then increment the reference pointer according to any of the methods described herein (step 2807). The network appliance 2200 may then move to the next sequence of the second file (step 2809).

Figure 21:
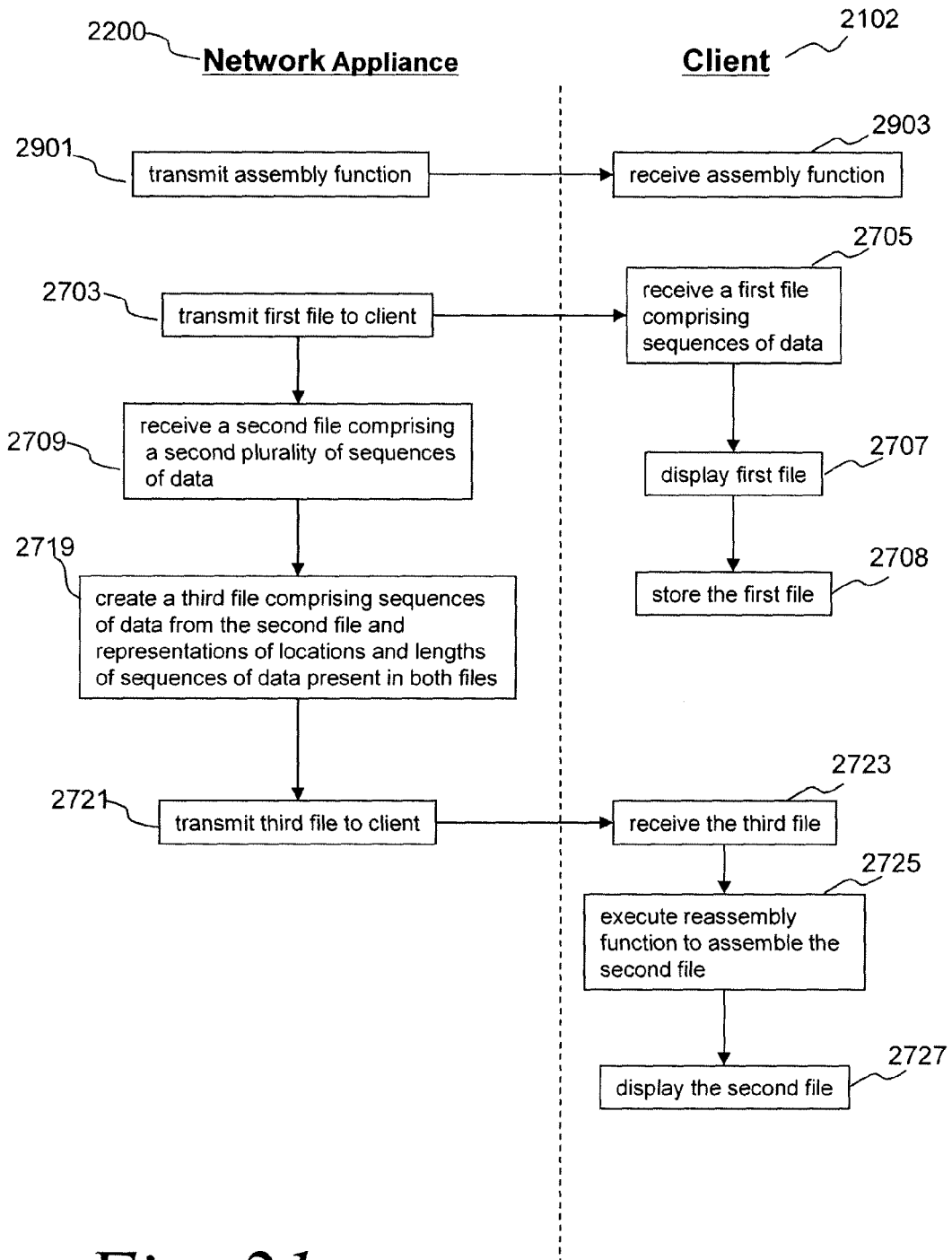
FIG. 21 is a flow diagram depicting another embodiment of methods for creating and receiving efficient updates to a previously stored file.

Now referring to FIG. 21, one embodiment of a method for efficiently receiving updates to previously stored files is depicted. In brief overview, said method comprises: receiving an assembly function (step 2903), receiving a first file comprising sequences of data (step 2705); displaying said first file; storing said first file (step 2708); receiving a third file comprising sequences of data and representations of locations and lengths of sequences in the first file (step 2723); executing a Javascript function to create a second file comprising sequences of data from the second file and sequences in the first file indicated by the third file (step 2725); and displaying said second file (step 2727).

Still referring to FIG. 21, now in greater detail, a network appliance 2200 may transmit an assembly function. Said assembly function may comprise any computer readable program means for assembling a second file using a file comprising sequences of data from a second file and representations of locations and lengths of said sequences of data present in both a first and second files. Said assembly function may comprise any programming or scripting language, including Javascript, or Java. In some embodiments, the assembly function may be transmitted in accordance with any of the other network appliance functions described herein. In one embodiment, the assembly function may be included in a program providing other client-side acceleration functionality.

In the embodiment shown, after the network appliance 2200 transmits an assembly function (step 2901), a client 2102 or client agent 2120 receives the assembly function (step 2903). The client may receive said assembly function via any of the networks, protocols, or computing devices described herein. In some embodiments, the client 2102 receives the assembly function from a network appliance 2200. In one embodiment, the assembly function may be included as part of a client-side acceleration program. In other embodiments, the assembly function may be installed on the client 2102 via any means of transferring software, including via a disk or other portable storage device. In some embodiments, a client agent 2120 may receive and later execute the reassembly function such that the operation of the reassembly function is transparent to one or more applications or network layers.

In the embodiment shown, after receiving an assembly function (step 2903), the client 2102 or client agent receives a first file comprising sequences of data. In the embodiment shown, the client 2102 receives the first file from a network appliance 2200. In other embodiments, the client 2102 may receive the first file from any computing device. Said file may comprise any file type or protocol discussed herein.

After a client 2102 receives a first file comprising sequences of data (step 2705), the client 2102 may display said first file (step 2707). The file may be displayed in any manner appropriate for the given file. In some embodiments, the file may be displayed in a web browser. In other embodiments, the file may be displayed in a business application, such as a word processor or a spreadsheet. In still other embodiments the file may comprise a standalone application and be displayed as such. In some embodiments, the file may correspond to an application running in a virtual computing environment. In one embodiment, the file may correspond to a remotely executing application. In another embodiment, the file may correspond to a streaming application.

After a client 2102 displays said first file (step 2707), the client 2102 or client agent 2120 may store said first file (step 2708). The client 2102 may store the first file in any storage element, including storing in a cache, disk, flash memory, or RAM. In some embodiments, the client 2102 may compress the file for storage. In other embodiments the client 2102 may store only portions of the file. In some embodiments the client 2102 may store said first file (step 2708) before or during the display of said first file (step 2707).

After a client 2102 stores said first file (step 2708), the client 2102 or client agent 2120 may receive a third file (step 2723). In the embodiment shown, the client 2102 receives the third file from a network appliance 2200. In other embodiments, the client 2102 may receive the third file from any computing device. Said file may comprise any file type or protocol discussed herein. In some embodiments, the file may comprise ASCII characters. In other embodiments, the file may comprise binary data.

After a client 2102 receives said third file (step 2723), the client or client agent 2120 may execute a Javascript or other function to assemble a second file (step 2725). In some embodiments, the Javascript function may be included in said third file. In other embodiments, the Javascript function may be already stored on the client 2102. In some embodiments, the Javascript function may be provided in a client-side acceleration program. In some embodiments, the third file may comprise a link to a location where the client 2102 may download the Javascript function.

The Javascript function may perform any technique, or the reverse of any technique described herein to assemble said second file. In some embodiments, the Javascript function may comprise the assembly function received in step 2903. In other embodiments, the Javascript function may comprise a reference to said assembly function. In still other embodiments, said Javascript function may comprise means for downloading said assembly function.

After executing a Javascript function to assemble said second file (step 2725), the client may display said second file (step 2727). The file may be displayed in accordance with any of the methods described herein for displaying a file.

Figure 22:
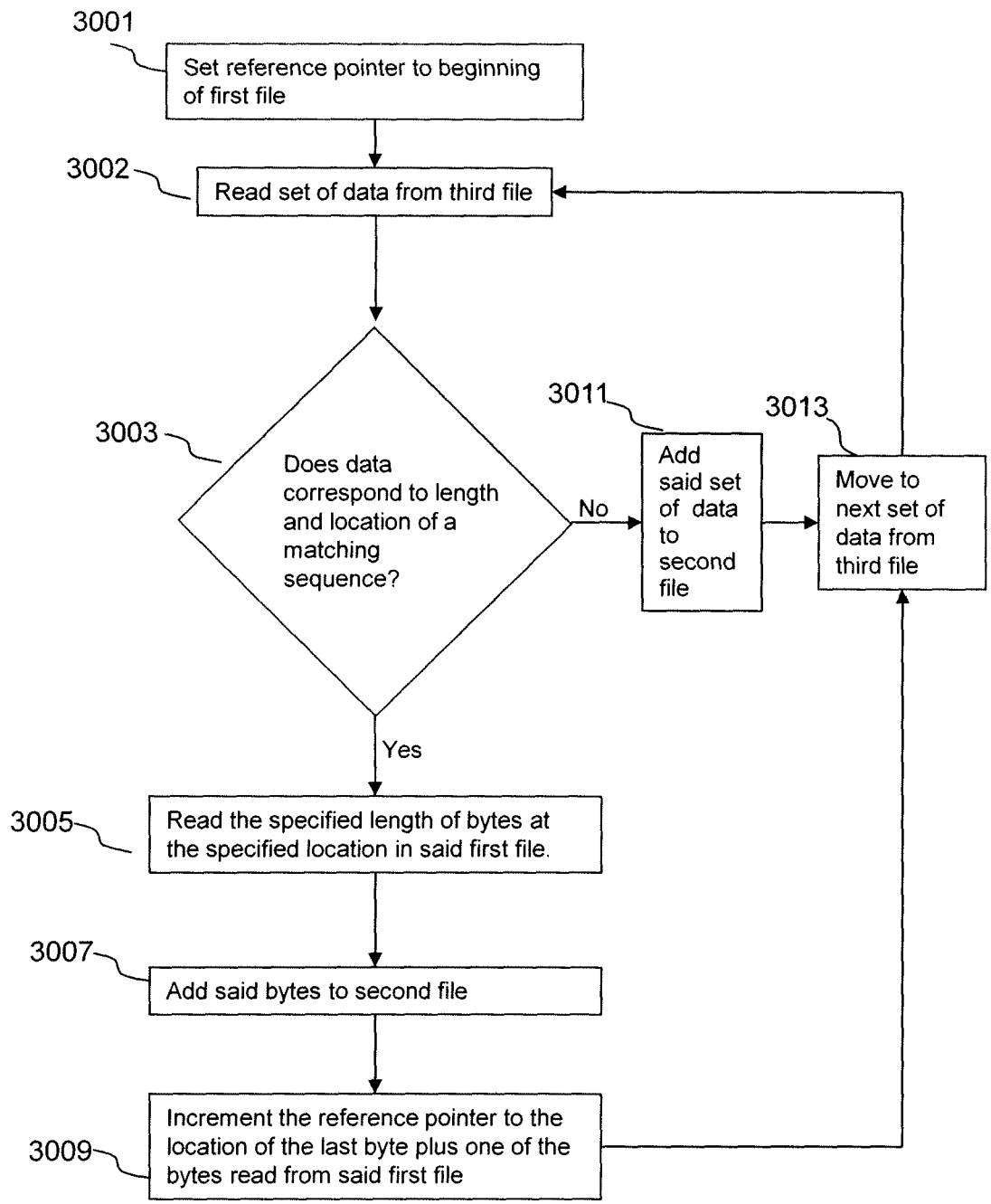
FIG. 22 is a flow diagram depicting one embodiment of a method for assembling a second file from a previously stored first file and a third file comprising sequences of data from the second file and representations of locations and lengths of sequences of data present in both the first and second files.

Referring now to FIG. 22, one embodiment of a method for assembling a second file from a previously stored first file and a third file comprising sequences of data from the second file and representations of locations and lengths of sequences of data present in both a first and second files is shown. In brief overview, the method comprises reading a set of data from a third file (step 3002) and determining whether said set of data corresponds to a locations and length of said sequences of data present in both the first and second files (step 3003). The method then may comprise reading the specified length of bytes at the specified location in said first file (step 3005); adding said bytes to the second file (step 3007); incrementing the reference pointer to the location of the last byte plus one of the bytes read from the first file (step 3009); and moving to the next set of data from said third file (step 3013). In one embodiment, said method may be performed by a client 2102 or client agent 2120. In another embodiment, said method may be performed by an assembly function as described in FIG. 21.

Still referring to FIG. 22, now in greater detail, a client 2102 may set a reference pointer to the beginning of the first file. This may be performed in accordance with any of the methods described herein.

After setting the reference pointer (step 3001) a client 2102 may read a set of data from a third file (step 3002). Said set of data may comprise any number of bits or bytes of said third file. In one embodiment, said set of data is then stored in a memory element or cache.

After reading said set of data (step 3002), a client 2102 may determine whether said set of data corresponds to a length and location of a sequence in the first file. In one embodiment, a client may determine whether said set of data comprises a special character or bit sequence.

If said set of data does not correspond to a length and location of a sequence in the first file, the client 2102 may add said set of data to the second file (step 3011). Said addition may comprise appending said set of data to the end of the second file. The client 2102 may then move to the next set of data from the third file (step 3013).

If said data does correspond to a length and location of a sequence in the first file, the client 2102 may then read the specified length of bytes at the specified location in the first file (step 3005). The client may determine the length and location specified by recognizing any of the representations of lengths and locations described herein. In one embodiment, the client may then store said specified bytes in a memory element or cache.

After reading the specified length of bytes at the specified location in the first file (step 3005), the client 2102 may then add said bytes to the second file (step 3007). Said addition may comprise appending said bytes to the end of the second file.

The client 2102 may then increment the reference pointer to the location of the last byte plus one of the bytes read from said first file (step 3009). This may be performed in accordance with any of the methods described herein. The client 2102 may then move to the next set of data from said third file. (step 3013).

Figure 23:
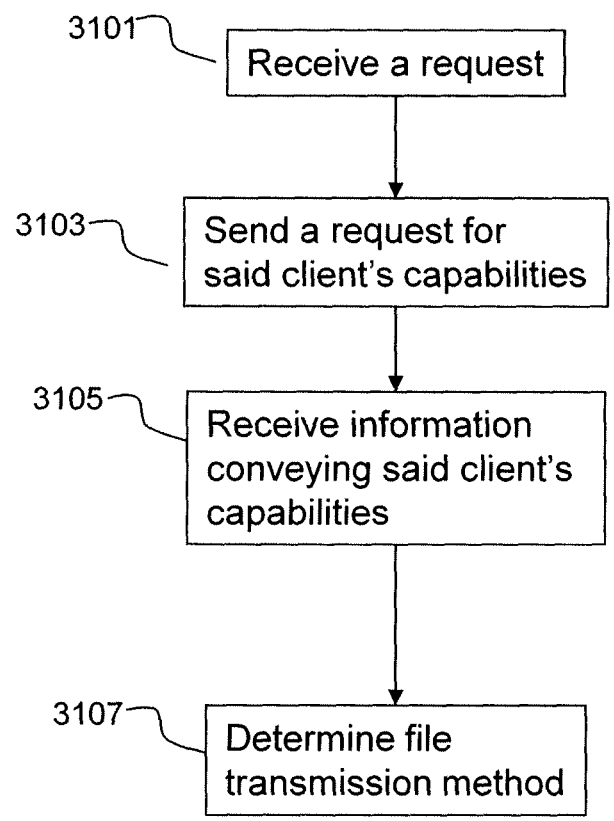
FIG. 23 is a flow diagram depicting one embodiment of a method for determining a file transmission method.

Referring now to FIG. 23, one embodiment of a method for determining a file transmission method is shown. Said method may be performed by any of the machines or combinations of machines described above, although the embodiment below describes the method being performed by a network appliance 2200. In brief overview, the method comprises receiving a request from a client 2102 or client agent 2120 for a resource (step 3101); sending a request for said client's capabilities (step 3103); receiving information conveying said client's capabilities (step 3105); and determining a file transmission method (step 3107).

Still referring to FIG. 23, now in greater detail, the network appliance 2200 receives a request from a client or client agent 2120 (step 3101). In one embodiment receiving a request from a client (step 3101) comprises receiving a request directly from a client. In other embodiments, the request from a client 2102 may be received from any of the networks, connections, and appliances previously discussed. Said request may comprise any of the protocols previously discussed. In some embodiments the request may comprise the request exactly as transmitted from the client 2102. In other embodiments the request may comprise a modification of an original request from a client 2102. Said modifications may comprise modifications in the course of providing any of the network appliance services discussed above, and any other modifications to the content, format, protocol, addressing, headers, or other portions of the request. request from a client 2102, or a new request. A request may comprise a resource directly requested by a client 2102, and it may comprise a resource requested in the course of performing any service for the client 2102.

After receiving a request from a client (step 3101), the network appliance 2200 sends a request for said client's capabilities (step 3103). In one embodiment, said request may be sent to the client 2102. In another embodiment, request may be sent to a collection agent as described in U.S. patent application Ser. No. 10/956,832 "A METHOD AND APPARATUS FOR ASSIGNING ACCESS CONTROL LEVELS IN PROVIDING ACCESS TO NETWORKED CONTENT FILES" whose contents are expressly incorporated herein by reference. Said collection agent may reside on the same physical machine as the network appliance sending the request, or they may reside on different physical machines. Said request may also be sent to a file, a cache, a database, a server, an executing application, or any other source of information concerning the client 2102.

After sending a request for the client's capabilities (step 3103) the network appliance 2200 receives information conveying said clients capabilities (step 3105). Said information may be received from a client 2102, or client agent 2120, a collection agent, a file, a cache, a database, a server, an executing application, or any other source of information concerning the client 2102. Said information may comprise, without limitation machine ID of a client node 2102, operating system type, existence of a patch to an operating system, MAC addresses of installed network cards, a digital watermark on the client device, membership in an Active Directory, existence of a virus scanner, existence of a personal firewall, an HTTP header, browser type, device type, network connection information, authorization credentials, and any of the other capabilities or preferences discussed above. In some embodiments, the network appliance may store or cache said information for later retrieval.

After receiving information conveying said clients capabilities (step 3105); the network appliance may determine a file transmission method corresponding to said client 2102 or client agent 2120 (step 3107). Said determination may be made on the basis of any of the information received.

In some embodiments, the network appliance 2200 may determine, in response to information received in step 3105, to transmit files in accordance with the method for creating efficient updates to a previously stored file described in FIG. 19. In one embodiment, said determination may be made in response to information corresponding to the client's 2102 memory size, connection speed, connection bandwidth, processor speed, or the prior existence of a stored file.

In some embodiments, the network appliance 2200 may determine, in response to information received in step 3105, to transmit an assembly function to the client 2102. For example, the network appliance may transmit an assembly function to a client 2102 if the network appliance 2200 receives information that the client 2102 does not possess the assembly function, and the information indicates the client has the capability to execute an assembly function. In some embodiments, said assembly function may be transmitted along with any other files, including requested content files, or other files transmitted in accordance with the functions of the network appliance 2200. In some embodiments, a network appliance may possess a plurality of assembly functions. For example, a network appliance 2200 may possess a number of assembly functions optimized for different computing environments, operating systems, and hardware configurations. The network appliance may then determine, in response to the information received in step 3105, which assembly function to transmit to a client 2102.

As one skilled in the art appreciates and understands in view of the embodiments of the client, network appliance, gateway and servers described herein, any of these embodiments of the client, network appliance, gateway and servers may be configured and implemented to perform any combination of the methods described herein. Any of the embodiments of the methods described in connection with FIGS. 8, 9A-9B, 10, 11 and 12 may work in conjunction with, integrated with or be performed concurrently with any of the embodiments of the methods described in connection with FIGS. 16-21.

The methods disclosed herein may be implemented as a computer program product, i.e., a computer program tangibly embodied in an information carrier, e.g., in a machine readable storage device or in a propagated signal, for execution by, or to control the operation of, data processing apparatus, e.g., a programmable processor, a computer, or multiple computers. A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

In the preceding specification, the invention has been described with reference to specific exemplary embodiments. It will however, be evident that various modifications and changes may be made without departing from the broader spirit and scope of the invention as set forth in the claims that follow. The specification and drawings are accordingly to be regarded as illustrative rather than restrictive sense. Other embodiments of the invention may be apparent to those skilled in the art from consideration of the specification and practice of the invention disclosed herein.

What is claimed:

1. A method comprising:
   (a) intercepting, by a client agent executing on a processor of a client device, one or more transport layer packets below an application layer of a network stack of the client device, the one or more transport layer packets comprising application layer content data of a web page from a server for a request from a user agent executing on the client device;
   (b) identifying, by the client agent while operating below the application layer of the network stack of the client device, request object data from uniform resource locators (URLs) embedded in application layer content data contained in a payload of the intercepted one or more transport layer packets; and
   (c) placing, by the client device, the request object data on a request object list;
   (d) querying, by the client device, a data cache of the client device to determine whether the request object data of the request object list in stored in the data cache;
   (e) marking, by the client device responsive to determining that request object data is not stored in the cache, in the request object list the request object data as to be downloaded to the client device; and
   (f) transmitting, by the client device, the request object list including the request object data marked as to be downloaded to the client device to a second device.

2. The method of claim 1, wherein (a) further comprises intercepting, by the client agent, the one or more transport layer packets, at a network layer of the network stack.

3. The method of claim 1, wherein (a) further comprises intercepting, by the client agent, the one or more transport layer packets, at a transport layer of the network stack.

4. The method of claim 1, wherein (b) further comprises inserting, in the application layer content data, information identifying a version of the request object data identified by the URL stored in the data cache.

5. The method of claim 1, wherein (b) further comprises modifying a URL identified in the application layer content data.

6. The method of claim 1, wherein (d) further comprises determining that a second requested object data of the request object list is stored in the data cache and is fresh and wherein (e) further comprises marking the second requested object data in the request object list as being fresh.

7. The method of claim 1, wherein (d) further comprises determining that a second requested object data of the request object list is stored in the data cache and is stale; and wherein (e) further comprises marking the second requested object data in the request object list as being stale.

8. The method of claim 1, wherein (e) further comprises determining that the requested object data marked as being stale or to be downloaded matches stored predicted request data in a predicted response cache.

9. The method of claim 8, further comprising marking the requested object data in the request object list as not to be downloaded.

10. The method of claim 1, wherein the second device is intermediary to the client device and a content server, the second device configured to obtain one or more requested object data in the request object list from one or more content servers.

11. A system comprising:
   a client agent configured to execute on a processer of a client device and to intercept one or more transport layer packets below an application layer of a network stack of the client device, the one or more transport layer packets comprising application layer content data of a web page from a server for a request from a user agent executing on the client device;
   wherein the client agent is configured to operate below the application layer of the network stack of the client device and to identify, while operating below the application layer of the network stack of the client device, request object data from uniform resource locators (URLs) embedded in application layer content data contained in a payload of the intercepted one or more transport layer packets; and
   wherein the client device is configured to place the request object data on a request object list and query a data cache of the client device to determine whether the request object data of the request object list in stored in the data cache; and
   responsive to determining that request object data is not stored in the cache, the client device is configured to mark in the request object list the request object data as to be downloaded to the client device; and
   wherein the client device is configured to transmit the request object list including the request object data marked as to be downloaded to the client device to a second device.

12. The system of claim 11, wherein the client agent is further configured to intercept the one or more transport layer packets, at a network layer of the network stack.

13. The system of claim 11, wherein the client agent is further configured to intercept the one or more transport layer packets, at a transport layer of the network stack.

14. The system of claim 11, wherein the client agent is further configured to insert in the application layer content data information identifying a version of the request object data identified by the URL stored in the data cache.

15. The system of claim 11, wherein the client agent is further configured to modify a URL identified in the application layer content data.

16. The system of claim 11, wherein the client device is further configured to determine that a second requested object data of the request object list is stored in the data cache and is fresh and mark the second requested object data in the request object list as being fresh.

17. The system of claim 11, wherein the client device is further configured to determine that a second requested object data of the request object list is stored in the data cache and is stale and mark the second requested object data in the request object list as being stale.

18. The system of claim 11, wherein the client device is further configured to determine that the requested object data marked as being stale or to be downloaded matches stored predicted request data in a predicted response cache.

19. The system of claim 18, wherein the client device is further configured to mark the requested object data in the request object list as not to be downloaded.

20. The system of claim 11, wherein the second device is intermediary to the client device and a content server, the second device is configured to obtain one or more requested object data in the request object list from one or more content servers.

* * * * *